(12) United States Patent
Lu et al.

(10) Patent No.: US 10,818,636 B2
(45) Date of Patent: Oct. 27, 2020

(54) SUBSTRATE PANEL STRUCTURE AND MANUFACTURING PROCESS

(71) Applicant: Advanced Semiconductor Engineering, Inc., Kaohsiung (TW)

(72) Inventors: Wen-Long Lu, Kaohsiung (TW); Jen-Kuang Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/118,235

(22) Filed: Aug. 30, 2018

(65) Prior Publication Data

US 2020/0075540 A1    Mar. 5, 2020

(51) Int. Cl.
*H01L 21/762*    (2006.01)
*H01L 23/00*    (2006.01)
*H01L 23/28*    (2006.01)
*H01L 23/498*    (2006.01)

(52) U.S. Cl.
CPC ............ *H01L 24/97* (2013.01); *H01L 21/762* (2013.01); *H01L 23/28* (2013.01); *H01L 23/49827* (2013.01); *H01L 24/17* (2013.01)

(58) Field of Classification Search
CPC ......... H01L 24/17; H01L 24/97; H01L 23/28; H01L 23/49827; H01L 21/762
See application file for complete search history.

(56) References Cited

U.S. PATENT DOCUMENTS 9,066,435 B2 * 6/2015 Terui ..................... H05K 1/115
2011/0053318 A1    3/2011 Hu

FOREIGN PATENT DOCUMENTS

TW    201110247 A    3/2011

* cited by examiner

*Primary Examiner* — Hoa B Trinh
(74) *Attorney, Agent, or Firm* — Foley & Lardner LLP

(57) ABSTRACT

A substrate panel structure includes a plurality of sub-panels and a dielectric portion. Each of the sub-panels includes a plurality of substrate units. The dielectric portion is disposed between the sub-panels.

18 Claims, 53 Drawing Sheets

SUBSTRATE PANEL STRUCTURE AND MANUFACTURING PROCESS

BACKGROUND

1. Field of the Disclosure

The present disclosure relates to a substrate panel structure and a manufacturing process, and more particularly to a substrate panel structure including a plurality of sub-panels, and a manufacturing process thereof.

2. Description of the Related Art

In an electronic device, functionality improvement and size reduction can be achieved by changing the materials thereof, or by changing the structural design thereof. When the materials of the electronic device are changed, the settings or parameters of production equipment and the manufacturing methods should be modified accordingly, which is rather complicated and expensive than simply adjusting the structural design thereof. Recently, one of the most efficient ways for improving functionality and reducing size of the electronic device is achieved by the structural design with reduced line width/line space (L/S).

SUMMARY

In some embodiments, according to an aspect, a substrate panel structure includes a plurality of sub-panels and a dielectric portion. Each of the sub-panels includes a plurality of substrate units. The dielectric portion is disposed between the sub-panels.

In some embodiments, according to another aspect, a manufacturing process includes: (a) providing a plurality of intermediate panels each including a circuit structure, wherein each of the intermediate panels includes a plurality of panel units, and the intermediate panels are separate and spaced from each other; (b) providing a dielectric material to form a plurality of first dielectric layer and a dielectric portion, wherein each of the first dielectric layers are disposed on respective one of the intermediate panels, and the dielectric portion is disposed between and connects the dielectric layers; and (c) forming a plurality of redistribution layers on the first dielectric layers, wherein each of the redistribution layer connects to respective one of the circuit structures of the intermediate panels.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
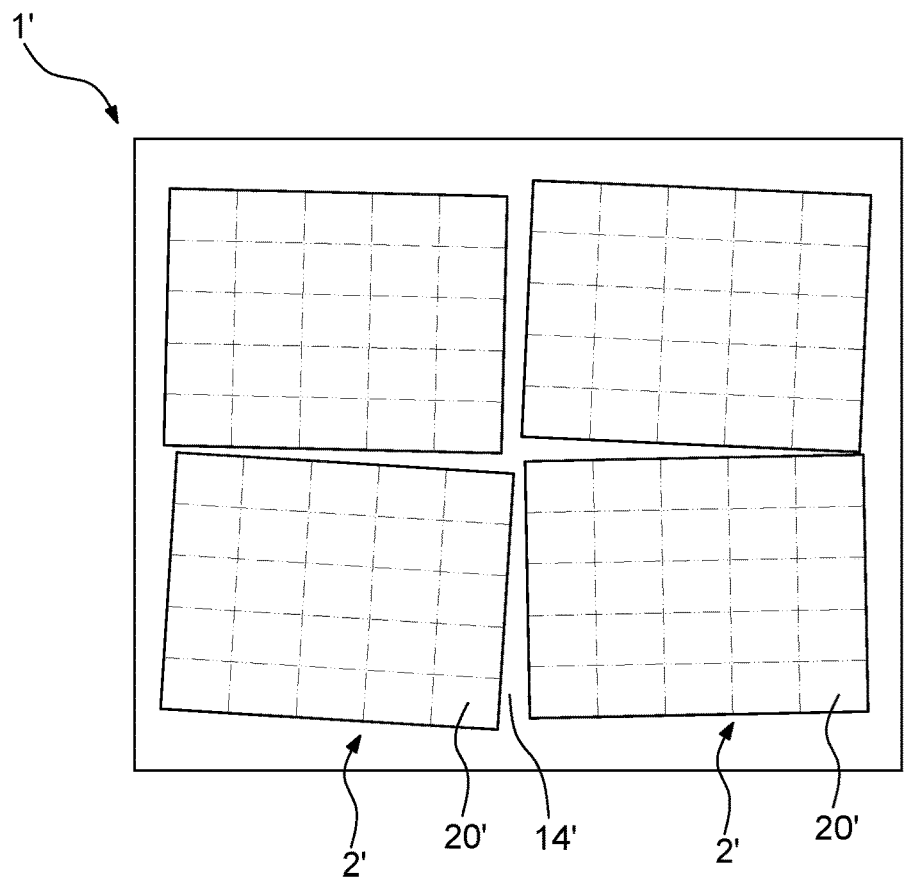
FIG. 1 illustrates a top view of an example of a substrate panel structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the semiconductor-associated industry, since the line width/line space (L/S) of the substrate panel gradually decreases, the accuracy of the substrate panel product is thus challenged. Manufacturing tolerances, including warpage due to the material differences and errors caused by the manufacturing machine, generally occur in every single layer of the substrate panel. For example, when the substrate panel includes three layers, the total tolerance would be the sum of the tolerances in the first layer, the second layer and the third layer. That is, the total tolerance of the substrate panel accumulates when the amount of layers (including protection layers) of the substrate panel increases.

It is noteworthy that in a same layer of the substrate panel, the tolerance, which may be expressed as the value of pattern shift, differs among different locations. The value of pattern shift may be defined as a distance between the actual position of the pattern and the predetermined position of the pattern. Generally, the value of pattern shift would be relatively small at a location near the center (e.g., center of mass) of the substrate panel, and would be relatively great at a location away from the center. The value of pattern shift at a particular location is proportional to the distance between the particular location and the center. Hence, the maximum value of pattern shift occurs at the edge of the substrate panel, and may increase with the size of the substrate panel. For example, in a comparative substrate panel with an area of 450 mm*450 mm and having a single circuit layer with an L/S of 2 μm/2 μm, the value of pattern shift measured at the edge of the substrate panel is at least 3 μm to 5 μm. In addition to the pattern shift amount, the warpage of the substrate panel also increases when the size of the substrate panel increases. Due to the pattern shift and warpage of the substrate panel, semiconductor dice cannot be mounted to the substrate panel accurately.

To address at least the above concerns, an embodiment of the present disclosure provides a substrate panel structure including a plurality of sub-panels. At least a portion of each of the sub-panels may be formed separately and then combined into the substrate panel structure. For example, one or more circuits of the sub-panels may be formed separately under a relative small scale, thus a maximum value of pattern shift of the substrate panel structure can be reduced.

FIG. 1 illustrates a top view of an example of a substrate panel structure 1' according to some embodiments of the present disclosure. The substrate panel structure 1' includes a plurality of sub-panels 2' and a dielectric portion 14' disposed between the sub-panels 2'. Each of the sub-panels 2' includes a plurality of substrate units 20'. The sub-panels 2' are arranged in an "m*n" manner, and "m" and "n" are integers equal to or greater than two. For example, as shown in FIG. 1, the substrate panel structure 1' includes 2*2 sub-panels 2'. However, an amount of the sub-panels 2' in the substrate panel 1' may be greater than 2*2, and the "m" and "n" may not equal to each other. Similarly, the substrate units 20' of the sub-panels 2' may be arranged in an "o*p" manner, with "o" and "p" being integers, and at least one of "o" and "p" being greater than one. For example, as shown in FIG. 1, each of the sub-panels 2' includes 5*5 substrate units 20'. In some embodiments, a dimension of each of the sub-panels 2' is less than 500 mm*500 mm. That is, a length of each side edge of the sub-panel 2' may be shorter than 500 mm, such as shorter than 400 mm, shorter than 300 mm or shorter than 200 mm. In some embodiments, all the sub-panels 2' are known good sub-panels.

Figure 2:
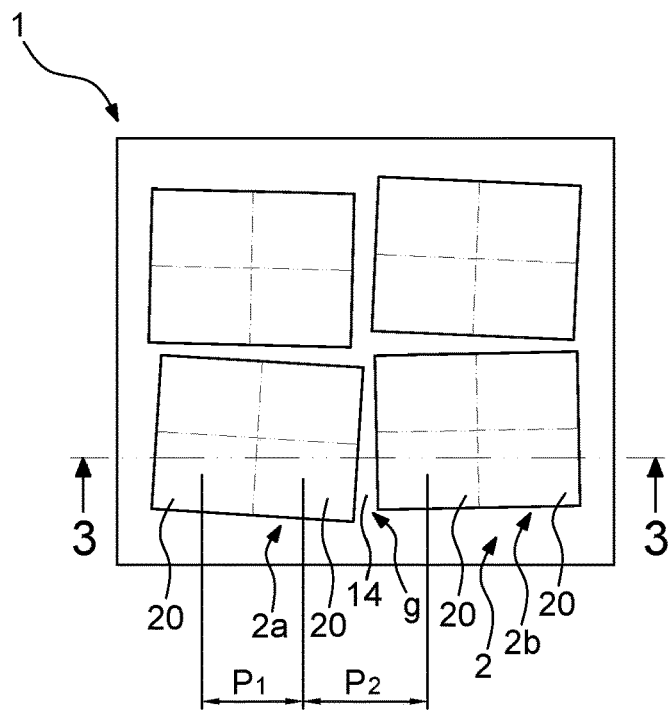
FIG. 2 illustrates a top view of an example of a substrate panel structure according to some embodiments of the present disclosure.
Figure 3:
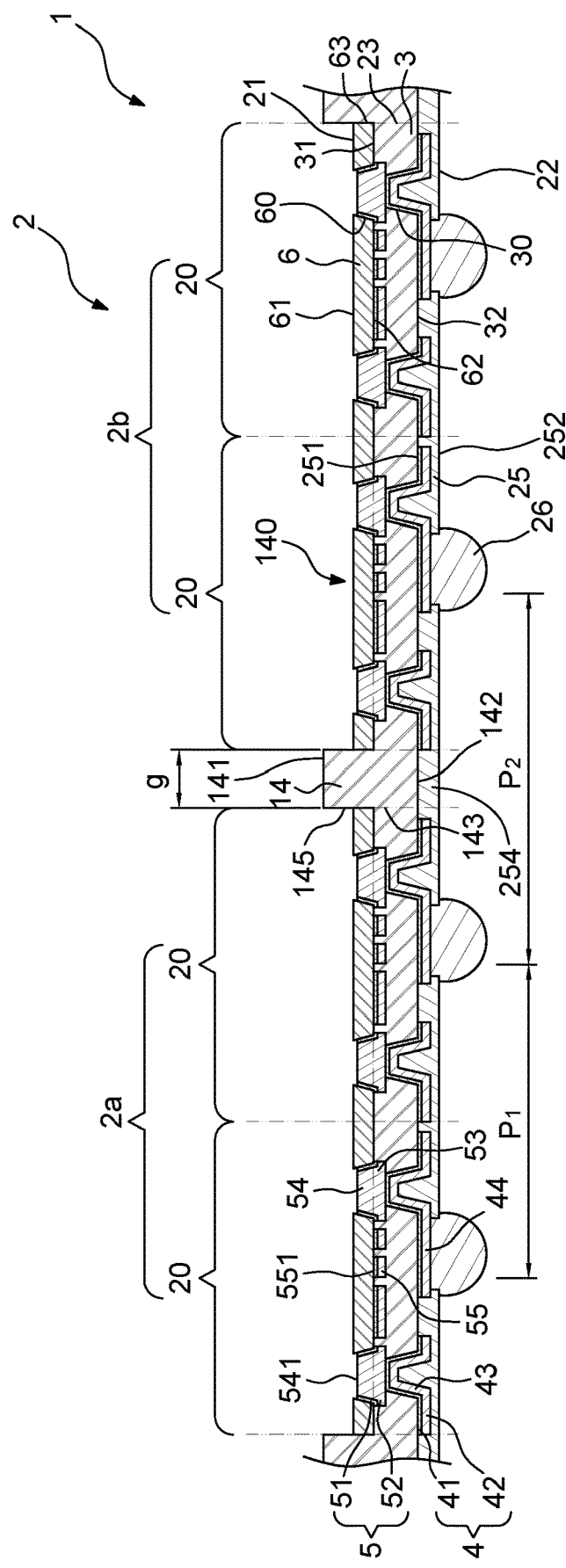
FIG. 3 illustrates a cross-sectional view taken along line 3-3 of the substrate panel structure 1 shown in FIG. 2.

FIG. 2 illustrates a top view of an example of a substrate panel structure 1 according to some embodiments of the present disclosure. FIG. 3 illustrates a cross-sectional view taken along line 3-3 of the substrate panel structure 1 shown in FIG. 2. Similar to the substrate panel structure 1' shown in FIG. 1, the substrate panel structure 1 also includes a plurality of sub-panels 2 and a dielectric portion 14. The dielectric portion 14 is disposed between the sub-panels 2 and may surround the sub-panels 2. Each of the sub-panels 2 includes a plurality of substrate units 20. Each of the substrate units 20 corresponds to a package unit, such as the package unit 7 shown in FIG. 12. However, each of the sub-panels 2 shown in FIGS. 2 and 3 includes 2*2 substrate units 20 instead of the 5*5 substrate units 20' shown in FIG. 1 for simple and clear explanation.

The sub-panels 2 may include a first sub-panel 2a and a second sub-panel 2b, and a gap "g" is formed between adjacent two of the sub-panels 2 (e.g., the first sub-panel 2a and the second sub-panel 2b). As can be seen in FIG. 2, the two adjacent sub-panels 2 (e.g., the first sub-panel 2a and the second sub-panel 2b) may not be aligned with each other, or may not be parallel to each other. Hence, the gap "g" therebetween may have a non-consistent width. However, in other embodiments, adjacent two of the sub-panels 2 may be substantially parallel to each other, and the gap "g" therebetween may have a consistent width.

The substrate units 20 in each of the sub-panels 2 are close to each other. For example, adjacent two of the substrate units 20 in the first sub-panel 2a may physically connect with each other, or may be spaced by a cutting line or a sawing street. That is, the substrate units 20 in the first sub-panel 2a may be defined by the cutting lines or the sawing streets. After a plurality of semiconductor dice are mounted to each of the sub-panels 2 and/or an encapsulant is formed on each of the sub-panels 2, these substrate units 20 may be separated by a singulating process along the cutting lines or the saw streets to form a plurality of package units (e.g., the package unit 7 shown in FIG. 12). As shown in FIGS. 2 and 3, since adjacent two of the sub-panels 2 (e.g., the first sub-panel 2a and the second sub-panel 2b) are spaced by the gap "g", a pitch $P_1$ between adjacent two of the substrate units 20 in the first sub-panel 2a is less than a pitch $P_2$ between the closest one of the substrate units 20 of the first sub-panel 2a and one of the substrate units 20 of the second sub-panel 2b. The "pitch" between two substrate units 20 may refer to a distance between a center of one of the substrate units 20 and a center of the other one of the substrate units 20.

Referring to FIG. 3, each of the sub-panels 2 has a first surface 21, a second surface 22 opposite to the first surface 21, and a lateral surface 23 extending between the first surface 21 and the second surface 22. In some embodiments, at least a portion of the lateral surface 23 is an imaginary surface or an imaginary plane. The lateral surface 23 may be a cutting line or a saw street for separating the sub-panels 2 from the substrate panel structure 1. As shown in FIG. 3, the first surface 21 is an upper surface, and the second surface 22 is a lower surface. Each of the sub-panels 2 includes a first dielectric layer 3, a redistribution layer 4, a protection layer 25, at least one solder connecter 26, a circuit structure 5 and a second dielectric layer 6. Similarly, each of the substrate units 20 may include at least a portion of the first dielectric layer 3, at least a portion of the redistribution layer 4, at least a portion of the protection layer 25, at least one solder connecter 26, at least a portion of the circuit structure 5 and at least a portion of the second dielectric layer 6. For illustration purposes, elements of the substrate units 20 are not shown in FIG. 2.

FIG. 3 shows the first sub-panel 2a and the second sub-panel 2b which are substantially the same with each other. However, the first sub-panel 2a and the second sub-panel 2b may be different from each other. For example, the components, arrangements, materials, size, and position relative to the dielectric portion 14 of the first sub-panel 2a may differ from those of the second sub-panel 2b.

The first dielectric layer 3 includes a first surface 31 and a second surface 32 opposite to the first surface 31. As shown in FIG. 3, the first surface 31 is an upper surface, and the second surface 32 is a lower surface. The first dielectric layer 3 may be made of an insulating material or a dielectric material, such as, for example, polypropylene (PP). It is noted that the first dielectric layer 3 may include, or be formed from, a cured photoimageable dielectric (PID) material such as epoxy or polyimide (PI) including photoinitiators. The first dielectric layer 3 defines at least one through hole 30 extending through the first dielectric layer 3 and between the first surface 31 and the second surface 32. In some embodiments, a thickness of the first dielectric layer 3 may be about 3 μm to about 20 μm, preferably about 3 μm to about 15 μm. The material of the first dielectric layer 3 in the first sub-panel 2a may be substantially the same as the material of the dielectric layer 3 in the second sub-panel 2b. However, a thickness of the first dielectric layer 3 in the first sub-panel 2a may be substantially the same as or slightly different from a thickness of the dielectric layer 3 in the second sub-panel 2b.

The redistribution layer 4 is disposed on the first dielectric layer 3. The redistribution layer 4 may be disposed on the second surface 32 of the first dielectric layer 3 and in the through hole 30. The redistribution layer 4 may include a seed layer 41 disposed on the first dielectric layer 3, and a conductive layer 42 disposed on the seed layer 41. A material of the seed layer 41 may be, for example, titanium or copper. In some embodiments, the seed layer 41 may include a titanium layer and a copper layer. A material of the conductive layer 42 may be, for example, a conductive metal, such as copper, or another metal or combination of metals. However, in some embodiments, the seed layer 41 may be omitted, and the conductive layer 42 may directly contact the first dielectric layer 3. The redistribution layer 4 may include at least one conductive via 43 disposed in the through hole 30 of the first dielectric layer 3, and at least one conductive pad 44 disposed on the second surface 32 of the first dielectric layer 3. In some embodiments, the redistribution layer 4 may further include at least one trace (not shown). In some embodiments, a line width/line space (L/S) of the redistribution layer 4 may be equal to or greater than 10 μm/10 μm. The materials and L/S of the redistribution layer 4 in the first sub-panel 2a may be substantially the same as the materials and L/S of the redistribution layer 4 in the second sub-panel 2b.

The protection layer 25 is disposed on the second surface 32 of the first dielectric layer 3 and on the redistribution layer 4. The protection layer 25 has a first surface 251 and a second surface 252 opposite to the first surface 251. The first surface 251 contacts the lower surface (e.g., the second surface 32) of the first dielectric layer 3. The second surface 252 may be a portion of the lower surface (e.g., the second surface 22) of each of the sub-panels 2. In some embodiments, the protection layer 25 further includes a portion 254 extending into the gap "g" between the sub-panels 2 and disposed on the dielectric portion 14. The protection layer 25 may include, or be formed from, a cured photoimageable dielectric (PID) material such as epoxy or polyimide (PI) including photoinitiators, or a solder resist layer. The protection layer 25 covers the redistribution layer 4, and at least a portion of the redistribution layer 4, such as the conductive pad 44, is exposed from the protection layer 25 for external connection. In some embodiments, a thickness of the protection layer 25 may be about 10 μm to about 30 μm. The material of the protection layer 25 in the first sub-panel 2a may be substantially the same as the material of the protection layer 25 in the second sub-panel 2b. However, a thickness of the protection layer 25 in the first sub-panel 2a may be substantially the same as or slightly different from a thickness of the protection layer 25 in the second sub-panel 2b.

The solder connector 26 is disposed on the exposed portion of the redistribution layer 4, such as the conductive pad 44 of the redistribution layer 4. A material of the solder connector 26 may be a conductive metal, such as tin, or another metal or combination of metals.

Figure 12:
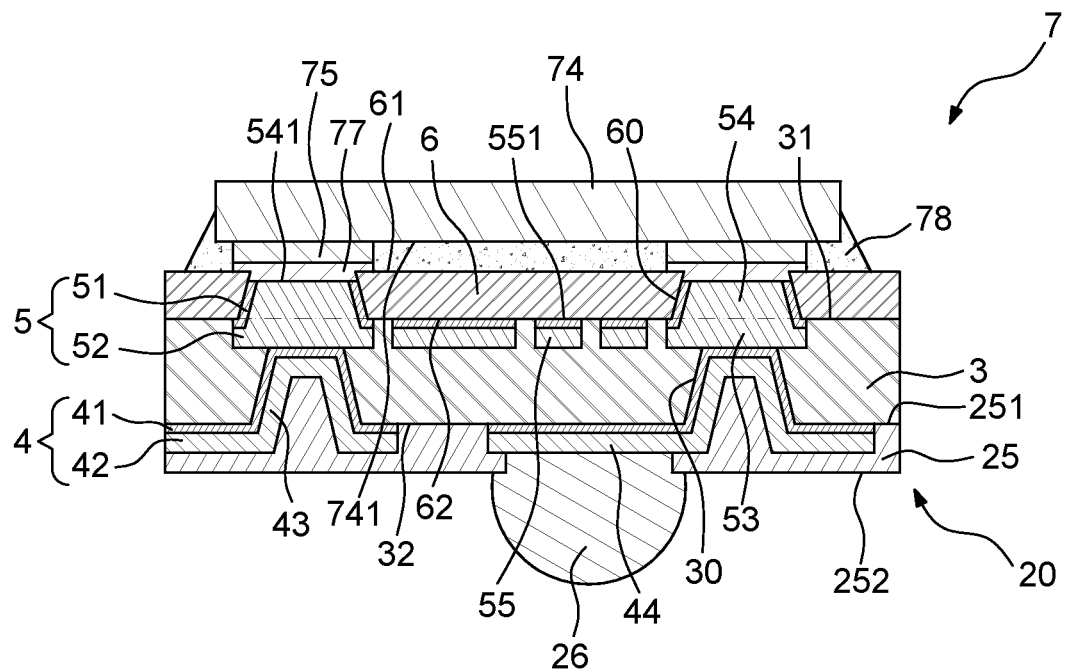
FIG. 12 illustrates a cross-sectional view of an example of a package unit according to some embodiments of the present disclosure.

The circuit structure 5 is disposed adjacent to the first surface 31 of the first dielectric layer 3. For example, as shown in FIG. 3, the circuit structure 5 is embedded in the first dielectric layer 3 and exposed from the first surface 31 of the first dielectric layer 3. The circuit structure 5 may include a seed layer 51 and a conductive layer 52. The seed layer 51 is exposed from the first surface 31 of the first dielectric layer 3. A material of the seed layer 51 may be, for example, titanium or copper. In some embodiments, the seed layer 51 may include a titanium layer and a copper layer. The conductive layer 52 covers the seed layer 51. A material of the conductive layer 52 may be, for example, a conductive metal, such as copper, or another metal or combination of metals. However, in some embodiments, the seed layer 51 may be omitted, and the conductive layer 52 may be exposed from the first surface 31 of the first dielectric layer 3. The circuit structure 5 includes at least one conductive pad 53, at least one conductive via 54 and at least one trace 55. The conductive pad 53, the conductive via 54 and the trace 55 may be formed integrally and concurrently. In some embodiments, the conductive via 54 is disposed on and formed integrally with the conductive pad 53. The conductive via 54 protrudes from the first dielectric layer 3. The conductive via 54 may be adapted for connection with a semiconductor die (e.g., as shown in FIG. 12). The conductive via 54 has an upper surface 541, which is at a level higher than the upper surface (e.g., the first surface 31) of the first dielectric layer 3. The trace 55 has an upper surface 551, which is substantially coplanar with the upper surface 31 of the first dielectric layer 3. In some embodiments, an L/S of the circuit structure 5 may be equal to or less than 2 μm/2 μm. The redistribution layer 4 is electrically connected to the circuit structure 5. For example, a portion of the redistribution layer 4 (e.g., the conductive via 43) is embedded in the first dielectric layer 3, and contacts and electrically connects the circuit structure 5. For example, the conductive via 43 extends through the first dielectric layer 3 to contact the circuit structure 5. The materials and L/S of the circuit structure 5 in the first sub-panel 2a may be the same as or different from the materials and L/S of the circuit structure 5 of in the second sub-panel 2b.

The second dielectric layer 6 is disposed on the first dielectric layer 3. The second dielectric layer 6 has a first surface 61, a second surface 62 opposite to the first surface 61, and a lateral surface 63 extending between the first surface 61 and the second surface 62. As shown in FIG. 3, the first surface 61 is an upper surface, and the second surface 62 is a lower surface. The first surface 61 of the dielectric layer 6 is a portion of the upper surface (e.g., the first surface 21) of the sub-panel 2. The lateral surface 63 is a portion of the lateral surface 23 of the sub-panel 2. The second dielectric layer 6 may be disposed on the first surface 31 of the first dielectric layer 3 and on the circuit structure 5. The lower surface (e.g., the second surface 62) of the second dielectric layer 6 may contact the upper surface (e.g., the first surface 31) of the first dielectric layer 3. As shown in FIG. 3, the seed layer 51 of the circuit structure 5 is located between the conductive layer 52 of the circuit structure 5 and the second dielectric layer 6. The upper surface 551 of the trace 55 of the circuit structure 5 contacts the lower surface (e.g., the second surface 62) of the second dielectric layer 6. The second dielectric layer 6 may be made of an insulating material or a dielectric material, such as, for example, polypropylene (PP). It is noted that the second dielectric layer 6 may include, or be formed from, a cured photoimageable dielectric (PID) material such as epoxy or polyimide (PI) including photoinitiators. The material of the second dielectric layer 6 may be the same as or different from the material of the first dielectric layer 3. A thickness of the second dielectric layer 6 may be 5 µm to 20 µm. The material and thickness of the second dielectric layer 6 in the first sub-panel 2a may be the same as or different from those of the second sub-panel 2b.

The conductive via 54 of the circuit structure 5 may be embedded in and exposed from the second dielectric layer 6. For example, the second dielectric layer 6 may define at least one through hole 60 extending through the second dielectric layer 6 and between the first surface 61 and the second surface 62. The conductive via 54 of the circuit structure 5 may be disposed in the through hole 60 of the second dielectric layer 6 and exposed from the first surface 61 of the second dielectric layer 6. The seed layer 51 of the conductive via 54 of the circuits structure 5 is disposed in the through hole 60 of the second dielectric layer 6 and between the conductive layer 52 and the second dielectric layer 6. In some embodiments, a portion of the seed layer 51 of the conductive via 54 of the circuit structure 5 adjacent to the first surface 61 of the second dielectric layer 6 is omitted, and the conductive layer 52 of the conductive via 54 of the circuit structure 5 is exposed from the first surface 61 of the second dielectric layer 6. Accordingly, the upper surface 541 of the conductive via 54 is recessed from the upper surface (e.g., the first surface 61) of the second dielectric layer 6. As shown in FIG. 3, the second dielectric layers 6 of the sub-panels 2 are not connected with each other, and the materials and structures of the second dielectric layers 6 may be different among the sub-panels 2.

The dielectric portion 14 is disposed between the sub-panels 2. For example, the dielectric portion 14 is filled in the gap "g" formed between adjacent two of the sub-panels 2 (e.g., the first sub-panel 2a and the second sub-panel 2b). The dielectric portion 14 has an upper surface 141, a lower surface 142 and at least one lateral surface 143 extending between the upper surface 141 and the lower surface 142. At least a portion of the lateral surface 143 is an imaginary surface or an imaginary plane. As shown in FIG. 3, the dielectric portion 14 has at least one lateral surface 143 corresponding to each of the sub-panels 2.

In some embodiments, the dielectric portion 14 covers and contacts at least a portion of a lateral surface 23 of each of the sub-panels 2. For example, the lateral surface 143 of the dielectric portion 14 contacts and is substantially coplanar with the lateral surface 63 of the second dielectric layer 6 of each of the sub-panels 2. In some embodiments, the first dielectric layer 3 of each of the sub-panels 2 and the dielectric portion 14 are formed integrally and concurrently. For example, the dielectric layers 3 of the sub-panels 2 and the dielectric portion 14 may be integrally and concurrently formed as a monolithic structure. That is, there is no boundary or interface between the dielectric portion 14 and the first dielectric layers 3 of the sub-panels 2.

In some embodiments, as shown in FIG. 3, the upper surface 141 of the dielectric portion 14 is at a level higher than the upper surface (e.g., the first surface 21) of each of the sub-panels 2 and/or the first surface 61 of the second dielectric layer 6. Hence, the dielectric portion 14 has an inner surface 145 to define a cavity 140 above the upper surface (e.g., the first surface 21) of each of the sub-panels 2. The cavity 140 completely exposes the second dielectric layer 6, such as the first surface 61 of the second dielectric layer 6, of each of the sub-panels 2. The upper surface 541 of the conductive via 54 is exposed in the cavity 140. The inner surface 145 may be a portion of the lateral surface 143 of the dielectric portion 14. The lateral surface 63 of the second dielectric layer 6 is substantially coplanar with the inner surface 145 of the cavity 140.

The dielectric portion 14 may be made of an insulating material or a dielectric material, such as, for example, polypropylene (PP). It is noted that the dielectric portion 14 may include, or be formed from, a cured photoimageable dielectric (PID) material such as epoxy or polyimide (PI) including photoinitiators. The material of the dielectric portion 14 may be the same as the material of the first dielectric layer 3 of each of the sub-panels 2. In some embodiments, a thickness of the dielectric portion 14 may be about 100 µm to about 300 As shown in FIG. 3, the thickness of the first dielectric layer 3 is less than the thickness of the dielectric portion 14. However, in other embodiments, the thickness of the first dielectric layer 3 may be substantially equal to or greater than the thickness of the dielectric portion 14.

In the substrate panel structure 1, layers with smaller L/S (e.g., the circuit structure 5 and the second dielectric layer 6) are separately formed in each of the sub-panels 2, while layers with larger L/S (e.g., the redistribution layer 4 and the first dielectric layer 3) are concurrently formed across the entire substrate panel structure 1. The layers with smaller L/S are much more sensitive to pattern shift than the layers with larger L/S. Since the layers with smaller L/S are formed separately under a smaller scale (e.g., each of the sub-panels 2 has a smaller size or area), a maximum value of pattern shift, such as of each of the circuit structures 5, is rather small. The effect of pattern shift on the layers with smaller L/S can thus be reduced. Besides, warpage of the second dielectric layer 6 is also reduced. On the other hand, the layers with larger L/S, which are more tolerant to pattern shift, can be formed concurrently under a larger scale to reduce time and cost of production. The larger pattern shift of the layers with larger L/S does not affect the layers with smaller L/S. Hence, the substrate panel structure 1, formed from the sub-panels 2, has the maximum value of pattern shift as same as the sub-panels 2.

For example, in the sub-panel 2 having an area of 300 mm*300 mm, the value of pattern shift measured at the edge thereof may be about 1 µm to 2 µm. The substrate panel structure 1, including at least 2*2 of such sub-panels 2, is thus provided with a maximum value of pattern shift of about 1 µm to 2 µm. That is, the values of pattern shift of the sub-panels 2 will not accumulate. Thus, even though the substrate panel structure 1 according to the present disclosure has an area greater than 600 mm*600 mm, the maximum value of pattern shift thereof (e.g., about 1 µm to 2 µm) is significantly less than that of a comparative substrate panel with an area of 450 mm*450 mm (e.g., at least 3 µm to 5 µm). Since the maximum value of pattern shift and warpage are both reduced, semiconductor dice can be mounted to predetermined positions on the sub-panels 2 (e.g., on the circuit structures 5) accurately.

Figure 4:
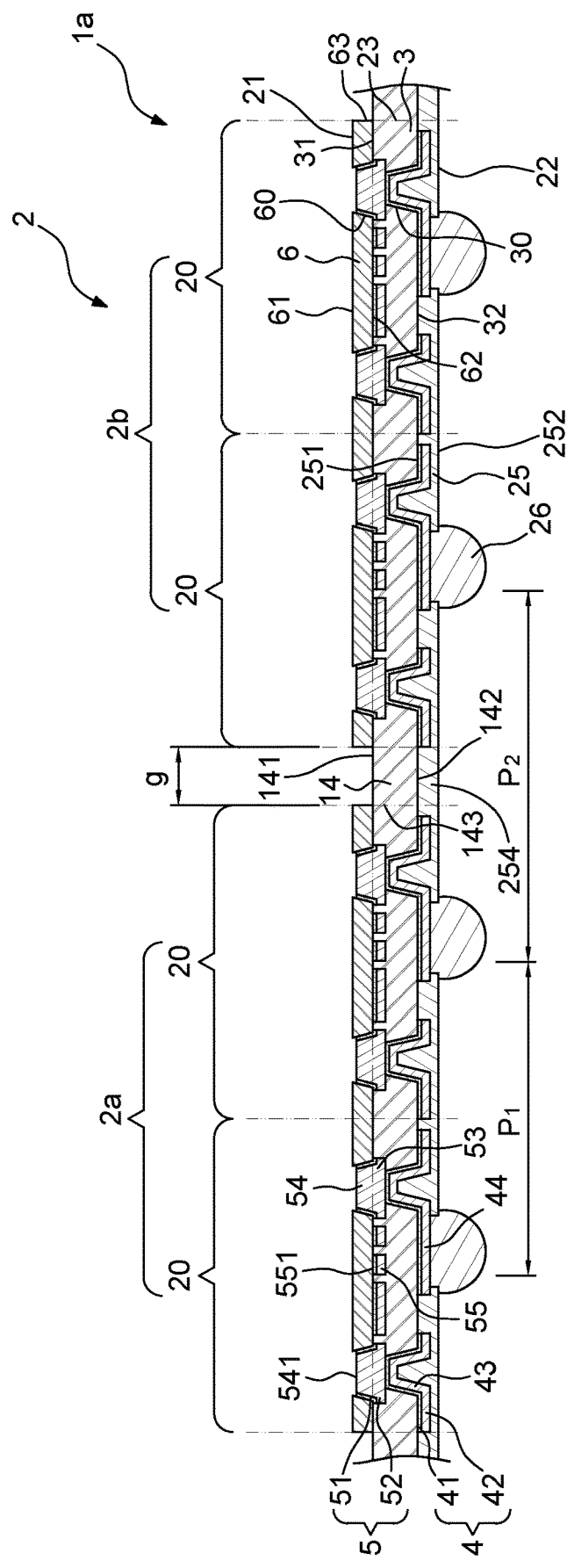
FIG. 4 illustrates a cross-sectional view of an example of a substrate panel structure according to some embodiments of the present disclosure.

FIG. 4 illustrates a cross-sectional view of an example of a substrate panel structure 1a according to some embodiments of the present disclosure. The substrate panel structure 1a also includes a plurality of sub-panels 2 (including a first sub-panel 2a and a second sub-panel 2b), and a dielectric portion 14 disposed between the sub-panels 2. Each of the sub-panels 2 includes a plurality of substrate units 20. Components and arrangements of the substrate panel structure 1a, including the sub-panels 2 and the substrate units 20, are similar to the substrate panel structure 1 shown in FIGS. 2 and 3, except for the dielectric portion 14, as describe below.

As shown in FIG. 4, the upper surface 141 of the dielectric portion 14 is at a level lower than the upper surface (e.g., the first surface 21) of each of the sub-panels 2. The cavity 140 of the substrate panel structure 1 shown in FIGS. 2 and 3 is omitted. The upper surface 141 of the dielectric portion 14 is substantially coplanar with the upper surface (e.g., the first surface 31) of the first dielectric layer 3 and/or the lower surface (e.g., the second surface 62) of the second dielectric layer 6 of each of the sub-panels 2. The lateral surface 63 of the second dielectric layer 6 is not covered by the dielectric portion 14, thus is exposed and is a free surface.

Figure 5:
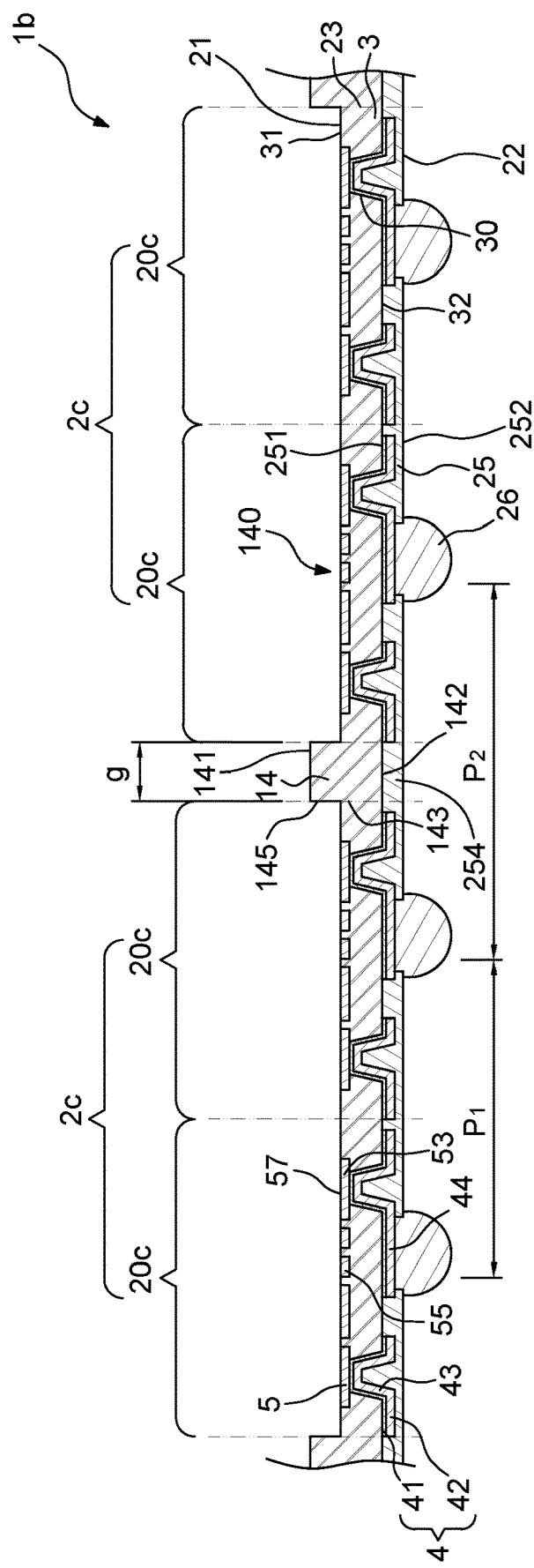
FIG. 5 illustrates a cross-sectional view of an example of a substrate panel structure according to some embodiments of the present disclosure.

FIG. 5 illustrates a cross-sectional view of an example of a substrate panel structure 1b according to some embodiments of the present disclosure. The substrate panel structure 1b includes a plurality of sub-panels 2c, and a dielectric portion 14 disposed between the sub-panels 2c. Each of the sub-panels 2c includes a plurality of substrate units 20c. The substrate panel structure 1b is similar to the substrate panel structure 1 shown in FIGS. 2 and 3, except for the follows.

As shown in FIG. 5, the second dielectric layer 6 shown in FIGS. 2 and 3 is omitted. Besides, the conductive via 54 of the circuit structure 5 is also omitted. Accordingly, a first surface 57 of the circuit structure 5, which is an upper surface as shown in FIG. 5, is completely exposed, such as exposed in the cavity 140 defined by the dielectric portion 14. The entire upper surface (e.g., first surface 57) of the circuit structure 5 may be substantially coplanar with the upper surface (e.g., the first surface 31) of the first dielectric layer 3. Accordingly, the conductive pad 53 and the trace 55 are exposed in the cavity 140. The conductive pad 53 may be adapted for connection with a semiconductor die. FIG. 5 shows the circuit structure 5 with one layer (e.g., a conductive layer) without seed layer. However, the circuit structure 5 may also include one or more than one seed layers.

Figure 6:
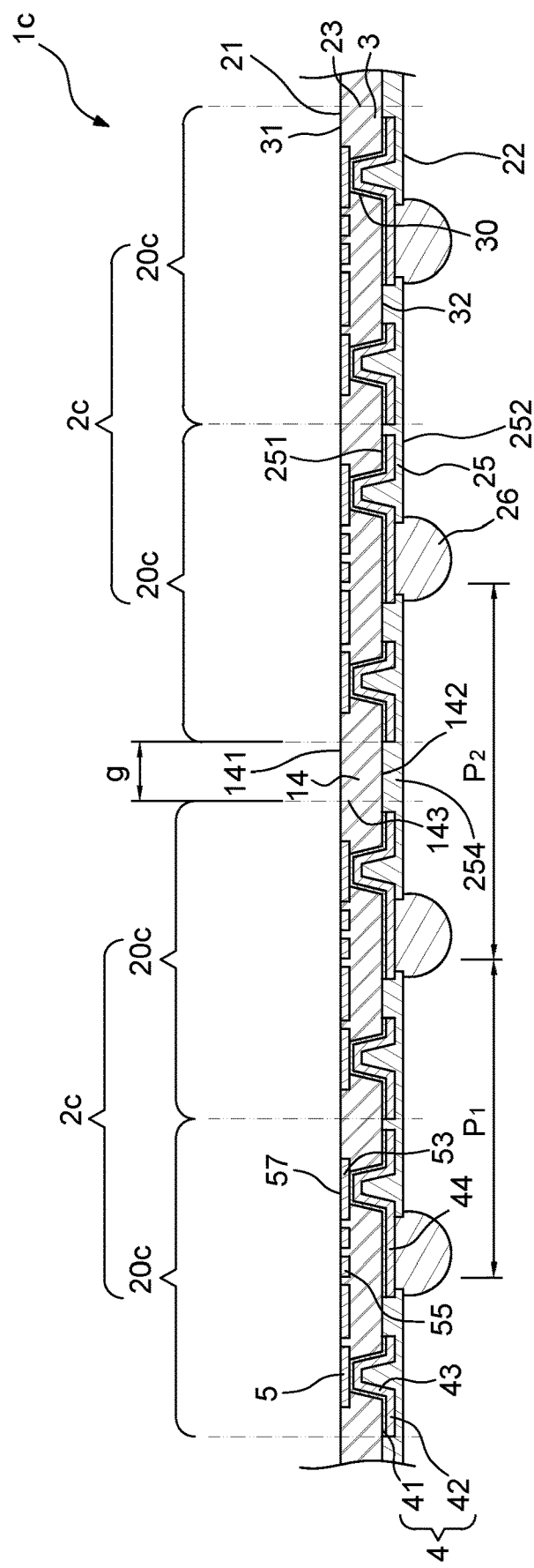
FIG. 6 illustrates a cross-sectional view of an example of a substrate panel structure according to some embodiments of the present disclosure.

FIG. 6 illustrates a cross-sectional view of an example of a substrate panel structure 1c according to some embodiments of the present disclosure. The substrate panel structure 1c also includes a plurality of sub-panels 2c, and a dielectric portion 14 disposed between the sub-panels 2c. Each of the sub-panels 2c includes a plurality of substrate units 20c. Components and arrangements of the substrate panel structure 1c, including the sub-panels 2c and the substrate units 20c, are similar to the substrate panel structure 1b shown in FIG. 5, except for the dielectric portion 14 as describe below.

As shown in FIG. 6, the upper surface 141 of the dielectric portion 14 is substantially coplanar with the upper surface (e.g., the first surface 21) of each of the sub-panels 2c. The cavity 140 of the substrate panel structure 1b shown in FIG. 5 is omitted. The upper surface 141 of the dielectric portion 14 is substantially coplanar with the upper surface (e.g., the first surface 31) of the first dielectric layer 3 and/or the upper surface (e.g., first surface 57) of the circuit structure 5 of each of the sub-panels 2c.

Figure 7:
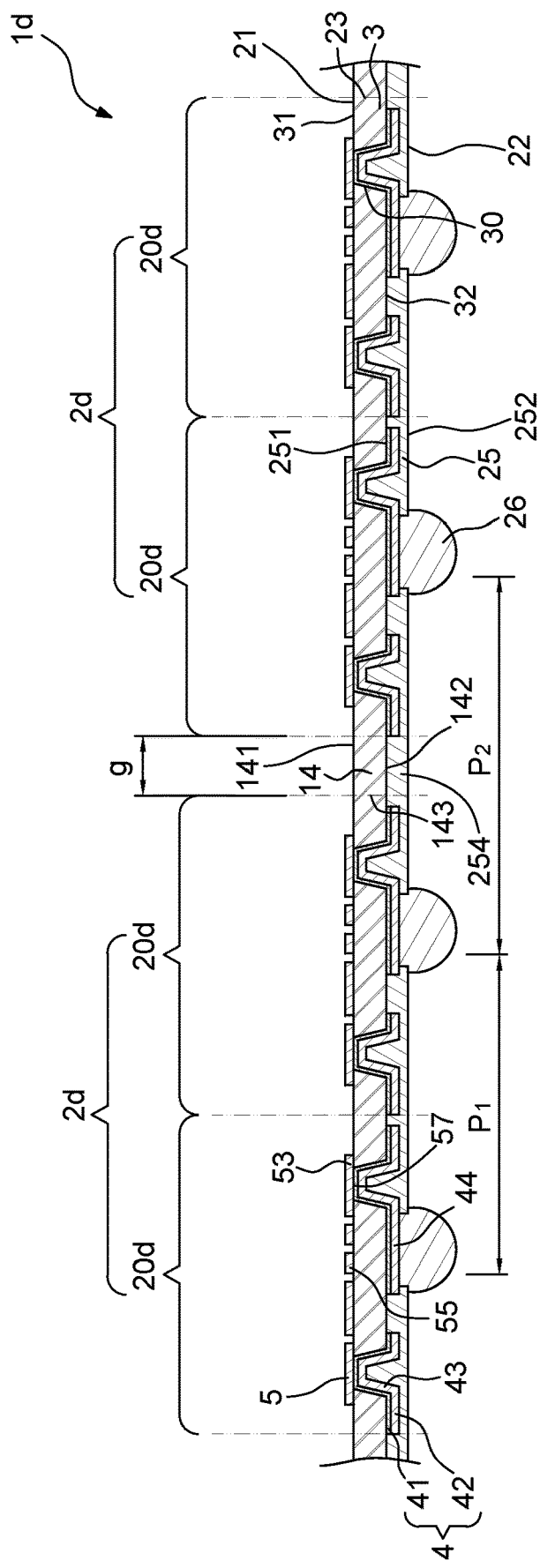
FIG. 7 illustrates a cross-sectional view of an example of a substrate panel structure according to some embodiments of the present disclosure.

FIG. 7 illustrates a cross-sectional view of an example of a substrate panel structure 1d according to some embodiments of the present disclosure. The substrate panel structure 1d also includes a plurality of sub-panels 2d, and a dielectric portion 14 disposed between the sub-panels 2d. Each of the sub-panels 2d includes a plurality of substrate units 20d. The substrate panel structure 1d is similar to the substrate panel structure 1c shown in FIG. 6, except for the follows.

As shown in FIG. 7, the circuit structure 5 is not embedded in the first dielectric layer 3. The circuit structure 5 protrudes from the first dielectric layer 3. For example, the circuit structure 5 is disposed on the upper surface (e.g., the first surface 31) of the first dielectric layer 3. The first surface 57, which is a lower surface as shown in FIG. 7, contacts and is substantially coplanar with the upper surface (e.g., the first surface 31) of the first dielectric layer 3.

Figure 8:
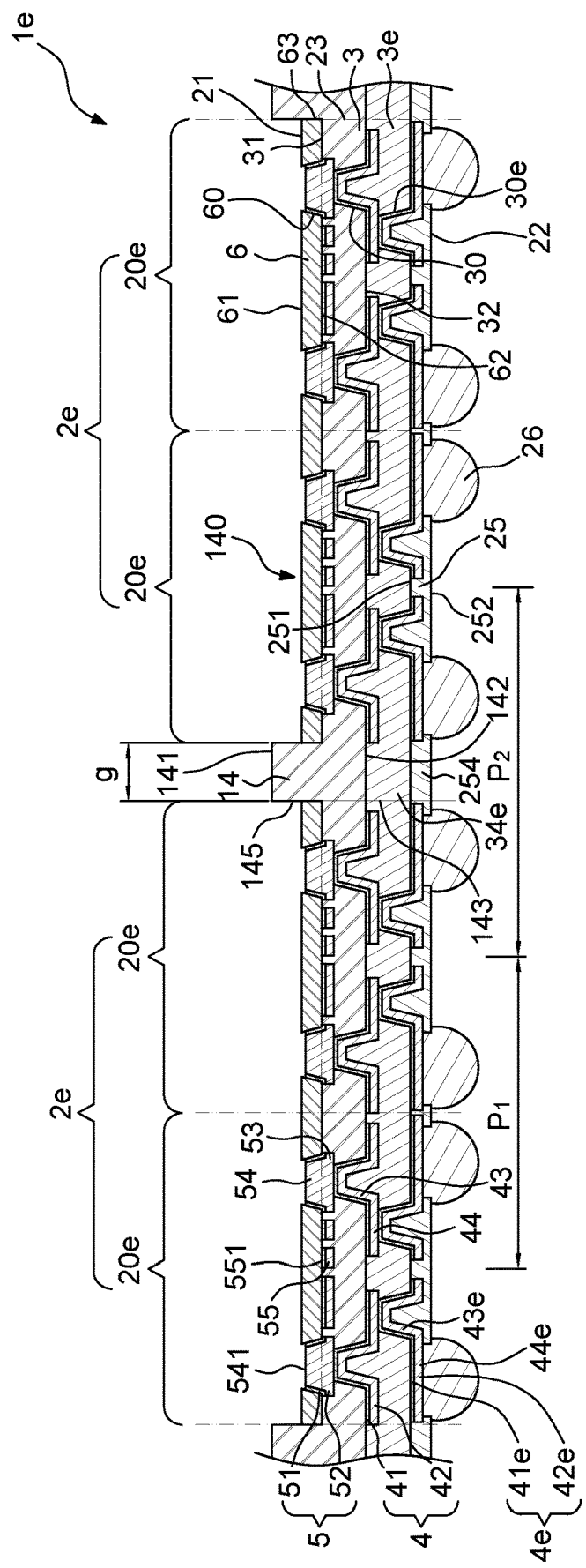
FIG. 8 illustrates a cross-sectional view of an example of a substrate panel structure according to some embodiments of the present disclosure.

FIG. 8 illustrates a cross-sectional view of an example of a substrate panel structure 1e according to some embodiments of the present disclosure. The substrate panel structure 1e also includes a plurality of sub-panels 2e, and a dielectric portion 14 disposed between the sub-panels 2e. Each of the sub-panels 2e includes a plurality of substrate units 20e. The substrate panel structure 1e is similar to the substrate panel structure 1 shown in FIGS. 2 and 3, but further includes an additional dielectric layer 3e and an additional redistribution layer 4e.

Structures, configurations, materials and relative positions of the first dielectric layers 3, the redistribution layers 4, the circuit structures 5, the second dielectric layers 6 and the dielectric portion 14 in the substrate panel structure 1e shown in FIG. 8 are similar to those of the first dielectric layers 3, the redistribution layers 4, the circuit structures 5, the second dielectric layers 6 and the dielectric portion 14 in the substrate panel structure 1 shown in FIGS. 2 and 3, thus are not described redundantly.

The additional dielectric layer 3e is disposed on the first dielectric layer 3 and covers the redistribution layer 4. The additional layer 3e may further include a portion 34e extending into the gap "g" between the sub-panels 2e and disposed on the dielectric portion 14. The additional dielectric layer 3e may be made of an insulating material or a dielectric material, such as, for example, polypropylene (PP). It is noted that the additional dielectric layer 3e may include, or be formed from, a cured photoimageable dielectric (PID) material such as epoxy or polyimide (PI) including photoinitiators. The material of the additional dielectric layer 3e may be the same as or different from the material of the first dielectric layer 3. The material of the additional dielectric layers 3e in each of the sub-panels 2e may be the same, and may be formed integrally and concurrently. The additional dielectric portion 3e of the sub-panels 2e may be connected with each other through the extending portion 34e. The additional dielectric layer 3e defines at least one through hole 30e to expose at least a portion of the redistribution layer 4, such as the conductive pad 44 of the redistribution layer 4.

The additional redistribution layer 4e is disposed on the additional dielectric layer 3e, and in the through hole 30e. The additional redistribution layer 4e may also include a seed layer 41e disposed on the additional dielectric layer 3e, and a conductive layer 42e disposed on the seed layer 41e. Materials of the seed layer 41e and the conductive layer 42e of the additional redistribution layer 4e may be the same as the materials of the seed layer 41 and the conductive layer 42 of the redistribution layer 4. The additional redistribution layer 4e may include at least one conductive via 43e disposed in the through hole 30e of the additional dielectric layer 3e, and at least one conductive pad 44e disposed on the additional dielectric layer 3e. The additional redistribution layer 4e is electrically connected to the redistribution layer 4, such as through the conductive via 43e. In some embodiments, the additional redistribution layer 4e may further include at least one trace (not shown). An L/S of the additional redistribution layer 4e may be substantially equal to or greater than 10 μm/10 μm. The L/S of the additional redistribution layer 4e may be substantially the same as the L/S of the redistribution layer 4. The material and L/S of the additional redistribution layer 4e in each of the sub-panels 2e may be the same, and may be formed integrally and concurrently.

The protection layer 25 is disposed on the additional dielectric layer 3e and the additional redistribution layer 4e. The protection layer 25 has a first surface 251 and a second surface 252 opposite to the first surface 251. The first surface 251 contacts the additional dielectric layer 3e. The second surface 252 may be a portion of the lower surface (e.g., the second surface 22) of each of the sub-panels 2e. The second surface 252 may be a portion of the lower surface (e.g., the second surface 22) of each of the sub-panels 2e. In some embodiments, the protection layer 25 further includes a portion 254 extending into a gap "g" defined between adjacent two of the sub-panels 2e and disposed on the extending portion 34e of the additional dielectric layer 3e. The protection layer 25 may include, or be formed from, a cured photoimageable dielectric (PID) material such as epoxy or polyimide (PI) including photoinitiators, or a solder resist layer. The protection layer 25 covers the additional redistribution layer 4e. At least a portion of the additional redistribution layer 4e, such as the conductive pad 44e, is exposed from the protection layer 25 for external connection. The solder connector 26 is disposed on the exposed portion of the additional redistribution layer 4e, such as the conductive pad 44e of the additional redistribution layer 4e. In some embodiments, the panel structure 1e may include more than one of the additional dielectric layer 3e and more than one of the additional redistribution layer 4e.

Figure 9:
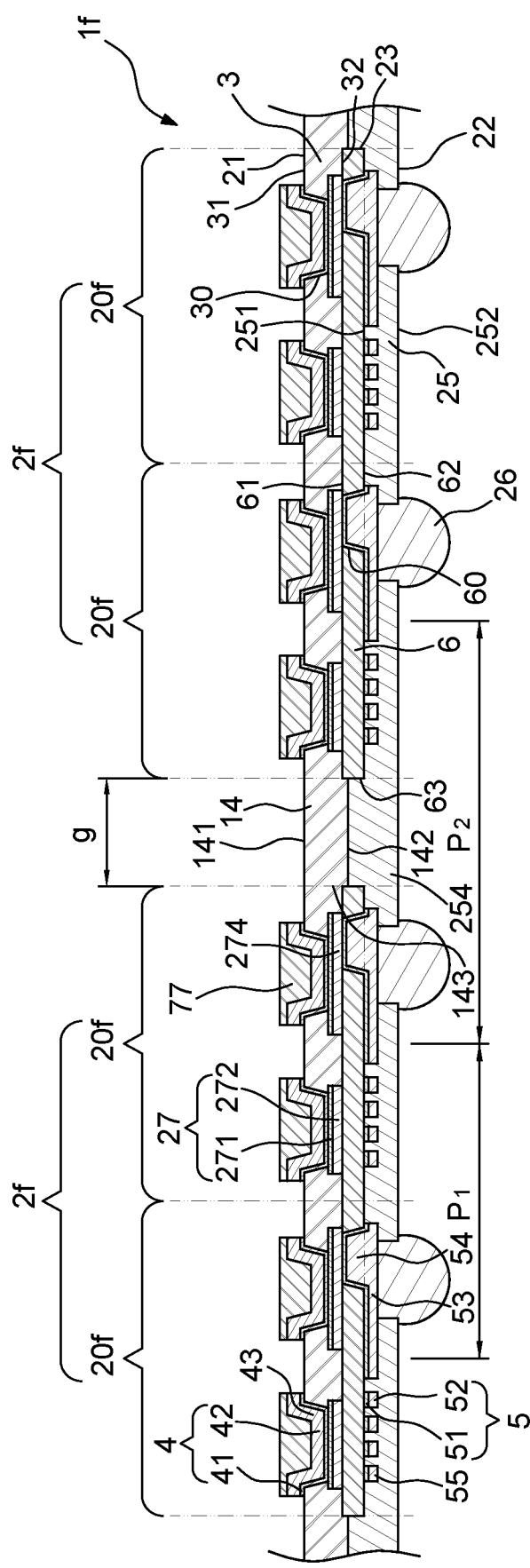
FIG. 9 illustrates a cross-sectional view of an example of a substrate panel structure according to some embodiments of the present disclosure.

FIG. 9 illustrates a cross-sectional view of an example of a substrate panel structure 1f according to some embodiments of the present disclosure. The substrate panel structure 1f also includes a plurality of sub-panels 2f, and a dielectric portion 14 disposed between the sub-panels 2f. Each of the sub-panels 2f includes a plurality of substrate units 20f.

Referring to FIG. 9, each of the sub-panels 2f has a first surface 21, a second surface 22 opposite to the first surface 21, and a lateral surface 23 extending between the first surface 21 and the second surface 22. In some embodiments, at least a portion of the lateral surface 23 is an imaginary surface or an imaginary plane. As shown in FIG. 9, the first surface 21 is an upper surface, and the second surface 22 is a lower surface. Each of the sub-panels 2f includes a first dielectric layer 3, a circuit layer 27, a redistribution layer 4, a second dielectric layer 6, a circuit structure 5, a protection layer 25, and at least one solder connecter 26. Similarly, each of the substrate units 20f may include at least a portion of the first dielectric layer 3, at least a portion of the circuit layer 27, at least a portion of the redistribution layer 4, at least a portion of the second dielectric layer 6, at least a portion of the circuit structure 5, at least a portion of the protection layer 25, and at least one solder connecter 26.

The first dielectric layer 3 includes a first surface 31 and a second surface 32 opposite to the first surface 31. As shown in FIG. 9, the first surface 31 is an upper surface, and the second surface 32 is a lower surface. The first surface 31 of the first dielectric layer 3 may be a portion of the upper surface (e.g., the first surface 21) of each of the sub-panels 2f. The first dielectric layer 3 may be made of an insulating material or a dielectric material, such as, for example, polypropylene (PP). It is noted that the first dielectric layer 3 may include, or be formed from, a cured photoimageable dielectric (PID) material such as epoxy or polyimide (PI) including photoinitiators.

The circuit layer 27 is disposed adjacent to the second surface 32 of the first dielectric layer 3. The circuit layer 27 may be embedded in the first dielectric layer 3 and exposed from the second surface 32 of the first dielectric layer 3. The circuit layer 27 may include a seed layer 271 and a conductive layer 272. The seed layer 271 is disposed between the conductive layer 272 and the first dielectric layer 3. A material of the seed layer 271 may be, for example, titanium or copper. In some embodiments, the seed layer 271 may include a titanium layer and a copper layer. A material of the conductive layer 272 may be, for example, a conductive metal, such as copper, or another metal or combination of metals. However, in some embodiments, the seed layer 271 may be omitted, and the conductive layer 272 may directly contact the first dielectric layer 3. The circuit layer 27 may include at least one conductive pad 274, and may further include at least one trace (not shown). The circuit layer 27, including the conductive pad 274 and the trace, may be formed by patterning a metal layer.

The first dielectric layer 3 may further define a through hole 30 exposing a portion of the circuit layer 27, such as the conductive pad 274 of the circuit layer 27. The redistribution layer 4 is disposed on the first dielectric layer 3 and in the through hole 30. The redistribution layer 4 may include a seed layer 41 and a conductive layer 42. The seed layer 41 is disposed between the conductive layer 42 and the first dielectric layer 3. A material of the seed layer 41 may be, for example, titanium or copper. In some embodiments, the seed layer 41 may include a titanium layer and a copper layer. A material of the conductive layer 42 may be, for example, a conductive metal, such as copper, or another metal or combination of metals. However, in some embodiments, the seed layer 41 may be omitted, and the conductive layer 42 may directly contact the first dielectric layer 3. The redistribution layer 4 may include at least one conductive via 43, and may further include at least one trace (not shown). The conductive via 43 is disposed in the through hole 30, and contacts and electrically connects the circuit layer 27. A solder material 77 is disposed on the conductive via 43 of the redistribution layer 4 for external connection. The solder material 77 may be made of tin, or another metal or combination of metals.

The second dielectric layer 6 is disposed on the second surface 32 of the first dielectric layer 3 and covers the circuit layer 27. The second dielectric layer 6 has a first surface 61, a second surface 62 opposite to the first surface 61 and a lateral surface 63 extending between the first surface 61 and the second surface 62. As shown in FIG. 9, the first surface 61 is an upper surface, and the second surface 62 is a lower surface. The first surface 61 of the second dielectric layer 6 contacts the first dielectric layer 3 and the circuit layer 27. The lateral surface 63 of the second dielectric layer 6 is a portion of the lateral surface 23 of each of the sub-panels 2f. The second dielectric layer 6 may define at least one through hole 60 to expose a portion of the circuit layer 27, such as the conductive pad 274 of the circuit layer 27. The second dielectric layer 6 may be made of an insulating material or a dielectric material, such as, for example, polypropylene (PP). It is noted that the second dielectric layer 6 may include, or be formed from, a cured photoimageable dielectric (PID) material such as epoxy or polyimide (PI) including photoinitiators.

The circuit structure 5 is disposed on the second surface 62 of the second dielectric layer 6 and in the through hole 60 of the second dielectric layer 6. The circuit structure 5 may include a seed layer 51 and a conductive layer 52. The seed layer 51 is disposed on the second dielectric layer 6, in the through hole 60 of the second dielectric layer 6 and on the redistribution layer 4. The conductive layer 52 is disposed on the seed layer 51. A material of the seed layer 51 may be, for example, titanium or copper. In some embodiments, the seed layer 51 may include a titanium layer and a copper layer. A material of the conductive layer 52 may be, for example, a conductive metal, such as copper, or another metal or combination of metals. However, in some embodiments, the seed layer 51 may be omitted, and the conductive layer 52 may directly contact the second dielectric layer 6 and/or the redistribution layer 4. The circuit structure 5 includes at least one conductive pad 53, at least one conductive via 54 and at least one trace 55. The conductive pad 53, the conductive via 54 and the trace 55 may be formed integrally and concurrently. In some embodiments, the conductive via 54 is disposed on and formed integrally with the conductive pad 53. The conductive via 54 is disposed in the through hole 60 of the second dielectric layer 6 to contact and electrically connect the circuit layer 27 embedded in the first dielectric layer 3. Accordingly, the redistribution layer 4 is electrically connected to the circuit structure 5 through the circuit layers 27. That is, each of the redistribution layers 4 is electrically connected to the respective one of the circuit structures 5 through respective one of the circuit layers 27. In some embodiments, an L/S of the circuit structure 5 may be equal to or less than 2 μm/2 μm.

The protection layer 25 is disposed on the second dielectric layer 6 and covers the circuit structure 5. That is, the second dielectric layer 6 is sandwiched between the first dielectric layer 3 and the protection layer 25. The protection layer 25 has a first surface 251 and a second surface 252 opposite to the first surface 251. The first surface 251 contacts the lower surface (e.g., the second surface 62) of the second dielectric layer 6. The second surface 252 may be a portion of the lower surface (e.g., the second surface 22) of each of the sub-panels 2f. In some embodiments, the protection layer 25 further includes a portion 254 extending into the gap "g" between the sub-panels 2f and disposed on the dielectric portion 14. The extending portion 254 of the protection layer 25 may contact a portion of the lateral surface 63 of the second dielectric layer 6. The protection layer 25 exposes a portion of the circuit structure 5, such as the conductive pad 53 of the circuit structure 5, for external connection. The protection layer 25 may include, or be formed from, a cured photoimageable dielectric (PID) material such as epoxy or polyimide (PI) including photoinitiators, or a solder resist layer.

The solder connector 26 is disposed on the exposed portion of the circuit structure 5, such as the conductive pad 53 of the circuit structure 5. A material of the solder connector 26 may be a conductive metal, such as tin, or another metal or combination of metals.

The dielectric portion 14 is disposed between the sub-panels 2f For example, the dielectric portion 14 is disposed in the gap "g" between the sub-panels 2f The dielectric portion 14 has an upper surface 141, a lower surface 142 and at least one lateral surface 143 extending between the upper surface 141 and the lower surface 142. At least a portion of the lateral surface 143 is an imaginary surface or an imaginary plane. As shown in FIG. 9, the upper surface 141 of the dielectric portion 14 is substantially coplanar with the upper surface (e.g., the first surface 21) of each of the sub-panels 2f and/or the upper surface (e.g., the first surface 31) of the first dielectric layer 3. The lower surface 142 of the dielectric portion 14 is at a level lower than the lower surface (e.g., the second surface 32) of the first dielectric layer 37 and the upper surface (e.g., the first surface 61) of the second dielectric layer 6, while higher than the lower surface (e.g., the second surface 62) of the second dielectric layer 6. However, in other embodiments, The lower surface 142 of the dielectric portion 14 may be substantially coplanar with the lower surface (e.g., the second surface 32) of the first dielectric layer 3 and the upper surface (e.g., the first surface 61) of the second dielectric layer 6, or may be substantially coplanar with the lower surface (e.g., the second surface 62) of the second dielectric layer 6.

In some embodiments, the dielectric portion 14 covers and contacts at least a portion of a lateral surface 23 of each of the sub-panels 2f. For example, the lateral surface 143 of the dielectric portion 14 contacts and is substantially coplanar with the lateral surface 63 of the second dielectric layer 6 of each of the sub-panels 2f In some embodiments, the first dielectric layer 3 of each of the sub-panels 2f is formed integrally and concurrently with the dielectric portion 14. For example, the dielectric layers 3 of the sub-panels 2f and the dielectric portion 14 may be integrally and concurrently formed as a monolithic structure. That is, there is no boundary or interface between the dielectric portion 14 and the first dielectric layers 3 of the sub-panels 2f.

The dielectric portion 14 may be made of an insulating material or a dielectric material, such as, for example, polypropylene (PP). It is noted that the dielectric portion 14 may include, or be formed from, a cured photoimageable dielectric (PID) material such as epoxy or polyimide (PI) including photoinitiators. The material of the dielectric portion 14 may be the same as the material of the first dielectric layer 3 of each of the sub-panels 2f. As shown in FIG. 9, a thickness of the first dielectric layer 3 is less than a thickness of the dielectric portion 14. However, in other embodiments, the thickness of the first dielectric layer 3 may be substantially the same as or greater than a thickness of the dielectric portion 14.

Figure 10:
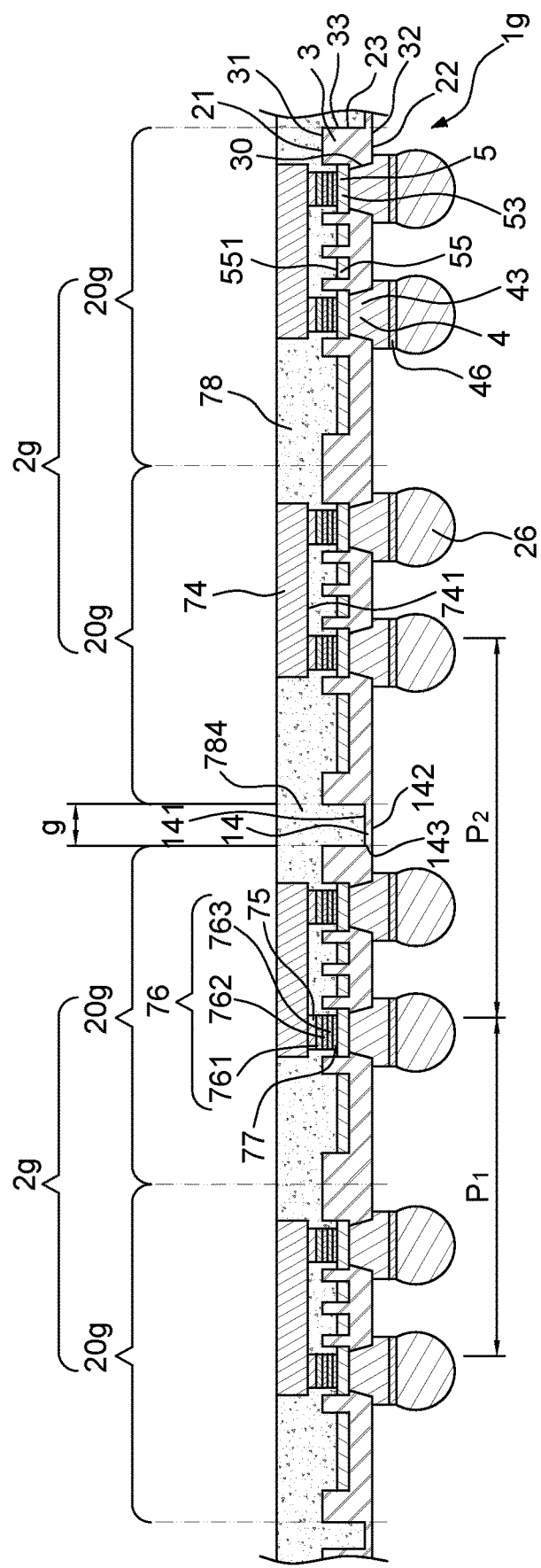
FIG. 10 illustrates a cross-sectional view of an example of a substrate panel structure according to some embodiments of the present disclosure.

FIG. 10 illustrates a cross-sectional view of an example of a substrate panel structure 1g according to some embodiments of the present disclosure. The substrate panel structure 1g also includes a plurality of sub-panels 2g, and a dielectric portion 14 disposed between the sub-panels 2g. Each of the sub-panels 2g includes a plurality of substrate units 20g.

Referring to FIG. 10, each of the sub-panels 2g has a first surface 21, a second surface 22 opposite to the first surface 21, and a lateral surface 23 extending between the first surface 21 and the second surface 22. In some embodiments, at least a portion of the lateral surface 23 is an imaginary surface or an imaginary plane. As shown in FIG. 10, the first surface 21 is an upper surface, and the second surface 22 is a lower surface. Each of the sub-panels 2g includes a first dielectric layer 3, a circuit structure 5, a redistribution layer 4, and at least one solder connecter 26. Similarly, each of the substrate units 20g may include at least a portion of the first dielectric layer 3, at least a portion of the circuit structure 5, at least a portion of the redistribution layer 4, and at least one solder connecter 26.

The first dielectric layer 3 includes a first surface 31, a second surface 32 opposite to the first surface 31, and a lateral surface 33 extending between the first surface 31 and the second surface 32. As shown in FIG. 10, the first surface 31 is an upper surface, and the second surface 32 is a lower surface. The first surface 31 of the first dielectric layer 3 may be a portion of the upper surface (e.g., the first surface 21) of each of the sub-panels 2g, the second surface 32 of the dielectric layer 3 may be a portion of the lower surface (e.g., the second surface 22) of each of the sub-panels 2g, and the lateral surface 33 of the first dielectric layer 3 may be a portion of the lateral surface 23 of the sub-panels 2g. The first dielectric layer 3 may be made of an insulating material or a dielectric material, such as, for example, polypropylene (PP). It is noted that the first dielectric layer 3 may include, or be formed from, a cured photoimageable dielectric (PID) material such as epoxy or polyimide (PI) including photoinitiators.

The circuit structure 5 is disposed adjacent to the first surface 31 of the first dielectric layer 3. For example, as shown in FIG. 10, the circuit structure 5 is embedded in the first dielectric layer 3 and exposed from the first surface 31 of the first dielectric layer 3. A material of the circuit structure 5 may be, for example, a conductive metal, such as copper, or another metal or combination of metals. FIG. 10 shows the circuit structure 5 composed of a single layer. However, in some embodiments, the circuit structure 5 may also include other layers, such as one or more seed layers. The circuit structure 5 includes at least one conductive pad 53 and at least one trace 55. The conductive pad 53 and the trace 55 may be formed integrally and concurrently. The trace 55 has an upper surface 551, which is at a level lower than the upper surface 31 of the first dielectric layer 3. In some embodiments, an L/S of the circuit structure 5 may be equal to or less than 2 μm/2 μm.

The first dielectric layer 3 may further define at least one through hole 30, such that a portion of the circuit structure 5, such as the conductive pad 53 of the circuit structure 5, can be exposed in the through hole 30 and from the second surface 32 of the dielectric layer 3.

The redistribution layer 4 is electrically connected to the circuit structure 5. For example, the redistribution layer 4 includes at least one conductive via 43 disposed in the through hole 30 of the first dielectric layer 3 and embedded in the first dielectric layer 3. The conductive via 43 extends through the first dielectric layer 3 to contact and electrically connect the circuit structure 5, such as the conductive pad 53 of the circuit structure 5. In some embodiments, the redistribution layer 4 may further include at least one trace (not shown). A material of the redistribution layer 4 may be, for example, a conductive metal, such as copper, or another metal or combination of metals. In some embodiments, one or more seed layers may be disposed between the redistribution layer 4 and the first dielectric layer 3. In some embodiments, a line width/line space (L/S) of the redistribution layer 4 may be equal to or greater than 10 μm/10 μm.

The solder connector 26 is disposed on and electrically connected to the conductive via 43 of the redistribution layer 4. A material of the solder connector 26 may be a conductive metal, such as tin, or another metal or combination of metals. An under bump metallization (UBM) 46 may be disposed between the conductive via 43 and the solder connector 26.

The dielectric portion 14 is disposed between the sub-panels 2g. For example, a gap "g" is defined between adjacent two of the sub-panels 2g, and the dielectric portion 14 is disposed in the gap "g". The dielectric portion 14 has an upper surface 141, a lower surface 142 and at least one lateral surface 143 extending between the upper surface 141 and the lower surface 142. At least a portion of the lateral surface 143 is an imaginary surface or an imaginary plane.

As shown in FIG. 10, the dielectric portion 14 has at least one lateral surface 143 corresponding to each of the sub-panels 2g. The upper surface 141 of the dielectric portion 14 is at a level lower than the upper surface (e.g., the first surface 21) of each of the sub-panels 2g and/or the upper surface (e.g., the first surface 31) of the first dielectric layer 3. The lower surface 142 of the dielectric portion 14 is substantially coplanar with the lower surface (e.g., the second surface 22) of each of the sub-panels 2g and/or the lower surface (e.g., the second surface 32) of the first dielectric layer 3.

In some embodiments, the dielectric portion 14 covers and contacts at least a portion of a lateral surface 23 of each of the sub-panels 2g. For example, the lateral surface 143 of the dielectric portion 14 contacts and is substantially coplanar with the lateral surface 23 of the first dielectric layer 3 of each of the sub-panels 2g and/or the lateral surface 33 of the first dielectric layer 3. In some embodiments, the first dielectric layer 3 of each of the sub-panels 2g is formed integrally and concurrently with the dielectric portion 14. For example, the dielectric layers 3 of the sub-panels 2g and the dielectric portion 14 may be integrally and concurrently formed as a monolithic structure. That is, there is no boundary or interface between the dielectric portion 14 and the first dielectric layers 3 of the sub-panels 2g.

The dielectric portion 14 may be made of an insulating material or a dielectric material, such as, for example, polypropylene (PP). It is noted that the dielectric portion 14 may include, or be formed from, a cured photoimageable dielectric (PID) material such as epoxy or polyimide (PI) including photoinitiators. The material of the dielectric portion 14 may be the same as the material of the first dielectric layer 3 of each of the sub-panels 2g. A thickness of the first dielectric layer 3 may be greater than a thickness of the dielectric portion 14.

As shown in FIG. 10, at least one semiconductor die 74 is connected to each of the substrate units 20g. That is, a plurality of semiconductor dice 74 is connected to each of the sub-panels 2g. The semiconductor die 74 may include a bump 75 and an UBM 76. The bump 75 is disposed on a lower surface 741 of the semiconductor die 74, and the UBM 76 is disposed on the bump 75. A material of the bump 75 may be copper. The UBM 76 may include a first layer 761, a second layer 762 and a third layer 763 sequentially disposed on the bump 75. For example, a material of the first layer 761 may be nickel, a material of the second layer 762 may be palladium, and a material of the third layer 763 may be gold, but not limited thereto. The UBM 76 of the semiconductor die 74 may be electrically connected to the conductive pad 53 of the circuit structure 5 through a solder material 77 disposed therebetween. The solder material 77 may be made of tin, or another metal or combination of metals.

An encapsulant 78 is disposed on and covers the substrate panel structure 1g. For example, the encapsulant 78 is disposed on the first dielectric layer 3 of each of the sub-panels 2g, and covers and encapsulates the semiconductor dice 74. The encapsulant 78 may further include a portion 784 disposed in the gap "g" between the sub-panels 2g and on the dielectric portion 14. The portion 784 of the encapsulant 78 contacts the lateral surface 33 of the first dielectric layer 3. The encapsulant 78 may be a molding compound. The substrate panel structure 1g and the encapsulant 78 may be separated by a singulation process into a plurality of package units, such as the package unit 7g shown in FIG. 16.

Figure 11:
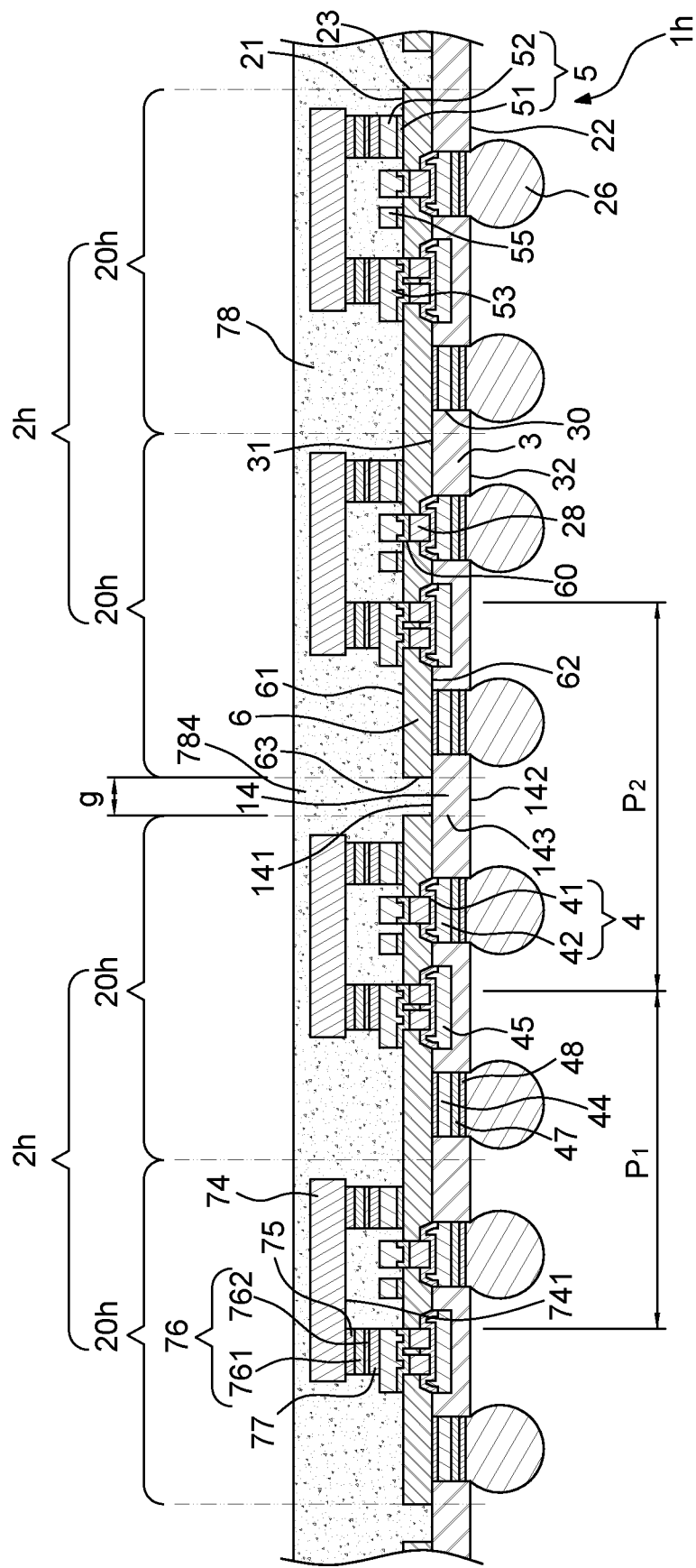
FIG. 11 illustrates a cross-sectional view of an example of a substrate panel structure according to some embodiments of the present disclosure.

FIG. 11 illustrates a cross-sectional view of an example of a substrate panel structure 1h according to some embodiments of the present disclosure. The substrate panel structure 1h also includes a plurality of sub-panels 2h, and a dielectric portion 14 disposed between the sub-panels 2h. Each of the sub-panels 2h includes a plurality of substrate units 20h.

Referring to FIG. 11, each of the sub-panels 2h has a first surface 21, a second surface 22 opposite to the first surface 21, and a lateral surface 23 extending between the first surface 21 and the second surface 22. In some embodiments, at least a portion of the lateral surface 23 is an imaginary surface or an imaginary plane. As shown in FIG. 11, the first surface 21 is an upper surface, and the second surface 22 is a lower surface. Each of the sub-panels 2h includes a second dielectric layer 6, a plurality of conductive pillars 28, a circuit structure 5, a first dielectric layer 3, a redistribution layer 4, and at least one solder connecter 26. Similarly, each of the substrate units 20h may include at least a portion of the second dielectric layer 6, a plurality of conductive pillars 28, at least a portion of the circuit structure 5, at least a portion of the first dielectric layer 3, at least a portion of the redistribution layer 4, and at least one solder connecter 26.

The second dielectric layer 6 has a first surface 61, a second surface 62 opposite to the first surface 61, and a lateral surface 63 extending between the first surface 61 and the second surface 62. As shown in FIG. 11, the first surface 61 is an upper surface, and the second surface 62 is a lower surface. The first surface 61 of the dielectric layer 6 is a portion of the upper surface (e.g., first surface 21) of the sub-panel 2h. The lateral surface 63 is a portion of the lateral surface 23 of the sub-panel 2h. The second dielectric layer 6 defines a plurality of through holes 60 extending through the second dielectric layer 6 and between the first surface 61 and the second surface 62. The second dielectric layer 6 may be made of an insulating material or a dielectric material, such as, for example, polypropylene (PP). It is noted that the second dielectric layer 6 may include, or be formed from, a cured photoimageable dielectric (PID) material such as epoxy or polyimide (PI) including photoinitiators.

The conductive pillars 28 are disposed in the through holes 60 of the second dielectric layer 6, and two ends of each of the conductive pillars 28 are exposed from the second dielectric layer 6. A material of the conductive pillars 28 may be, for example, a conductive metal, such as copper, or another metal or combination of metals.

The circuit structure 5 is disposed adjacent to the first surface 61 of the second dielectric layer 6 and electrically connected to the conductive pillars 28. For example, as shown in FIG. 11, the circuit structure 5 is disposed on the first surface 61 of the second dielectric layer 6, and portions of the circuit structure 5 may extend into the through holes 60 to contact the conductive pillars 28. The circuit structure 5 may include a seed layer 51 and a conductive layer 52. The seed layer 51 is disposed between the conductive layer 52 and the second dielectric layer 6, and between the conductive layer 52 and the conductive pillars 28. A material of the seed layer 51 may be, for example, titanium or copper. In some embodiments, the seed layer 51 may include a titanium layer and a copper layer. A material of the conductive layer 52 may be, for example, a conductive metal, such as copper, or another metal or combination of metals. However, in some embodiments, the seed layer 51 may be omitted, and the conductive layer 52 may directly contact the second dielectric layer 6 and the conductive pillars 28. The circuit structure 5 includes at least one conductive pad 53 and at least one trace 55. The conductive pad 53 and the trace 55 may be formed integrally and concurrently. In some embodiments, an L/S of the circuit structure 5 may be equal to or less than 2 μm/2 μm.

The redistribution layer 4 is disposed adjacent to the second surface 62 of the second dielectric layer 6. For example, as shown in FIG. 11, the redistribution layer 4 is disposed on the second surface 62 of the second dielectric layer 6, and portions of the redistribution layer 4 may extend into the through holes 60 to contact the conductive pillars 28. The redistribution layer 4 is electrically connected to the circuit structure 5 through the conductive pillars 28. The redistribution layer 4 may include a seed layer 41 and a conductive layer 42. The seed layer 41 is disposed between the conductive layer 42 and the second dielectric layer 6, and between the conductive layer 42 and the conductive pillars 28. A material of the seed layer 41 may be, for example, titanium or copper. In some embodiments, the seed layer 41 may include a titanium layer and a copper layer. A material of the conductive layer 42 may be, for example, a conductive metal, such as copper, or another metal or combination of metals. However, in some embodiments, the seed layer 41 may be omitted, and the conductive layer 42 may directly contact the second dielectric layer 6 and the conductive pillars 28. The redistribution layer 4 may include at least one conductive pad 44 and at least one trace 45. In some embodiments, a line width/line space (L/S) of the redistribution layer 4 may be equal to or greater than 10 μm/10 μm.

The first dielectric layer 3 is disposed on the second surface 62 of the second dielectric layer 6 and covers the redistribution layer 4. The first dielectric layer 3 includes a first surface 31 and a second surface 32 opposite to the first surface 31. As shown in FIG. 11, the first surface 31 is an upper surface, and the second surface 32 is a lower surface. The upper surface (e.g., the first surface 31) of the first dielectric layer 3 may contact the lower surface (e.g., the second surface 62) of the second dielectric layer 6.

The first dielectric layer 3 may be made of an insulating material or a dielectric material, such as, for example, polypropylene (PP). It is noted that the first dielectric layer 3 may include, or be formed from, a cured photoimageable dielectric (PID) material such as epoxy or polyimide (PI) including photoinitiators. The first dielectric layer 3 defines at least one through hole 30 to expose at least a portion of the redistribution layer 4, such as the conductive pad 44 of the redistribution layer 4.

The solder connector 26 is disposed in the through hole 30 of the first dielectric layer 3, and is on and electrically connected to the exposed portion of the redistribution layer 4, such as the conductive pad 44. A material of the solder connector 26 may be a conductive metal, such as tin, or another metal or combination of metals. A barrier layer 47 and a wetting layer 48 may be disposed between the conductive pad 44 and the solder connector 26. A material of the barrier layer 47 may be nickel, and a material of the wetting layer may be gold.

The dielectric portion 14 is disposed between the sub-panels 2h. For example, a gap "g" is defined between adjacent two of the sub-panels 2h, and the dielectric portion 14 is disposed in the gap "g". The dielectric portion 14 has an upper surface 141, a lower surface 142 and at least one lateral surface 143 extending between the upper surface 141 and the lower surface 142. At least a portion of the lateral surface 143 is an imaginary surface or an imaginary plane. As shown in FIG. 11, the upper surface 141 of the dielectric portion 14 is substantially coplanar with the upper surface (e.g., the first surface 31) of the first dielectric layer 3 and the lower surface (e.g., the second surface 62) of the second dielectric layer 6 of each of the sub-panels 2h, and is lower than the upper surface (e.g., the first surface 21) of each of the sub-panels 2h. The lower surface 142 of the dielectric portion 14 is substantially coplanar with the lower surface (e.g., the second surface 22) of each of the sub-panels 2h and/or the lower surface (e.g., the second surface 32) of the first dielectric layer 3. The lateral surface 143 of the dielectric portion 14 is substantially coplanar with the lateral surface 63 of the second dielectric layer 6 of each of the sub-panels 2h.

In some embodiments, the dielectric portion 14 covers and contacts at least a portion of a lateral surface 23 of each of the sub-panels 2. In some embodiments, the first dielectric layer 3 of each of the sub-panels 2h is formed integrally and concurrently with the dielectric portion 14. For example, the dielectric layers 3 of the sub-panels 2h and the dielectric portion 14 may be integrally and concurrently formed as a monolithic structure. That is, there is no boundary or interface between the dielectric portion 14 and the first dielectric layers 3 of the sub-panels 2h.

As shown in FIG. 11, at least one semiconductor die 74 is connected to each of the substrate units 20h. That is, a plurality of semiconductor dice 74 is connected to each of the sub-panels 2h. The semiconductor die 74 may include a bump 75 and an UBM 76. The bump 75 is disposed on a lower surface 741 of the semiconductor die 74, and the UBM 76 is disposed on the bump 75. A material of the bump 75 may be copper. The UBM 76 may include a first layer 761 and second layer 762 sequentially disposed on the bump 75. For example, a material of the first layer 761 may be nickel, and a material of the second layer 762 may be palladium, but not limited thereto. In some embodiments, the UBM 76 may include three layers made of nickel, palladium and gold. The UBM 76 of the semiconductor die 74 may be electrically connected to the conductive pad 53 of the circuit structure 5 through a solder material 77 disposed therebetween. The solder material 77 may be made of tin, or another metal or combination of metals.

An encapsulant 78 is disposed on and covers the substrate panel structure 1h. For example, the encapsulant 78 is disposed on the second dielectric layer 6 of each of the sub-panels 2h, and covers and encapsulates the semiconductor dice 74. The encapsulant 78 includes a portion 784 disposed in the gap "g" formed between two adjacent sub-panels 2h and on the dielectric portion 14. The encapsulant 78 may contact and cover the lateral surface 63 of the second dielectric layer 6. The encapsulant 78 may be a molding compound. The substrate panel structure 1h and the encapsulant 78 may be separated by a singulation process into a plurality of package units, such as the package unit 7h shown in FIG. 17.

FIG. 12 illustrates a cross-sectional view of an example of a package unit 7 according to some embodiments of the present disclosure. The package unit 7 corresponds to each of the substrate units 20 shown in FIG. 3 or FIG. 4. That is, the package unit 7 includes the substrate unit 20, and further includes a semiconductor die 74 and an encapsulant 78.

The semiconductor die 74 is connected to the substrate unit 20. The semiconductor die 74 may include a bump 75 disposed on a lower surface 741 of the semiconductor die 74. The bump 75 of the semiconductor die 74 is electrically connected to the conductive via 54 of the circuit structure 5 of the substrate unit 20 through a solder material 77 disposed therebetween. The solder material 77 may be made of tin, or another metal or combination of metals.

The encapsulant 78 is disposed on the substrate unit 20, and covers at least a portion of the substrate unit 20 and/or the semiconductor die 74. For example, the encapsulant 78 is disposed between the second dielectric layer 6 of the substrate unit 20 and the semiconductor die 74, and encapsulates the bump 75 and the solder material 77. The encapsulant 78 may be an underfill or a molding compound.

Figure 13:
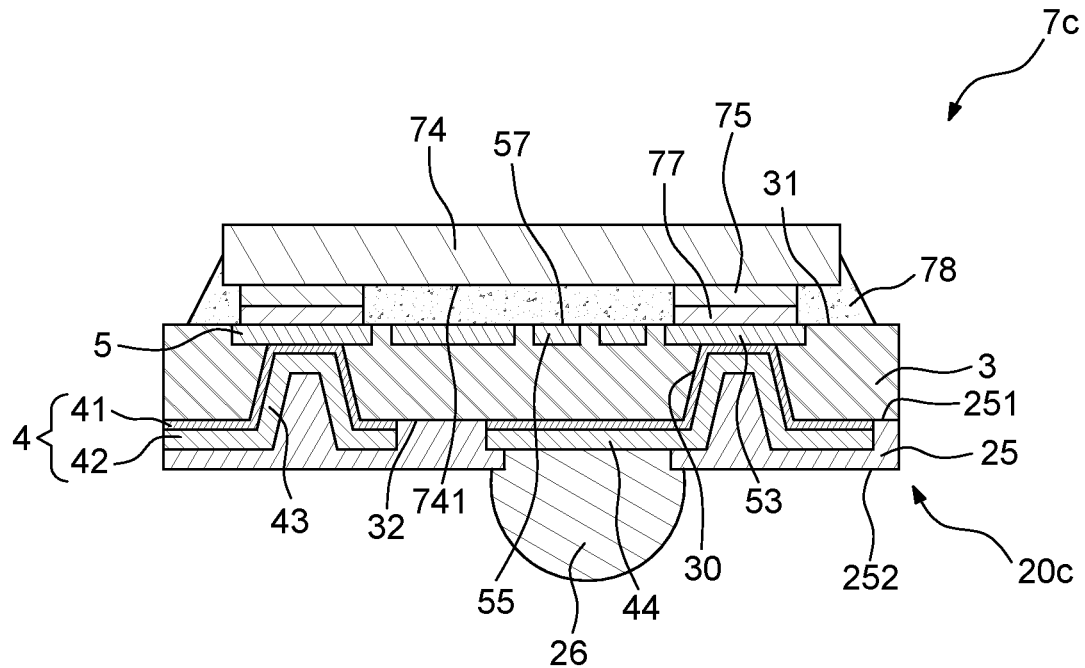
FIG. 13 illustrates a cross-sectional view of an example of a package unit according to some embodiments of the present disclosure.

FIG. 13 illustrates a cross-sectional view of an example of a package unit 7c according to some embodiments of the present disclosure. The package unit 7c corresponds to each of the substrate units 20c shown in FIG. 5 or FIG. 6. That is, the package unit 7c includes the substrate unit 20c, and further includes a semiconductor die 74 and an encapsulant 78.

The semiconductor die 74 is connected to the substrate unit 20c. The semiconductor die 74 may include a bump 75 disposed on a lower surface 741 of the semiconductor die 74. The bump 75 of the semiconductor die 74 is electrically connected to the conductive pad 53 of the circuit structure 5 of the substrate unit 20c through a solder material 77 disposed therebetween. The solder material 77 may be made of tin, or another metal or combination of metals.

The encapsulant 78 is disposed on the substrate unit 20c, and covers at least a portion of the substrate unit 20c and/or the semiconductor die 74. For example, the encapsulant 78 is disposed between the first dielectric layer 3 of the substrate unit 20c and the semiconductor die 74, and encapsulates the bump 75, the solder material 77 and a portion of the circuit structure 5. The encapsulant 78 may be an underfill or a molding compound.

Figure 14:
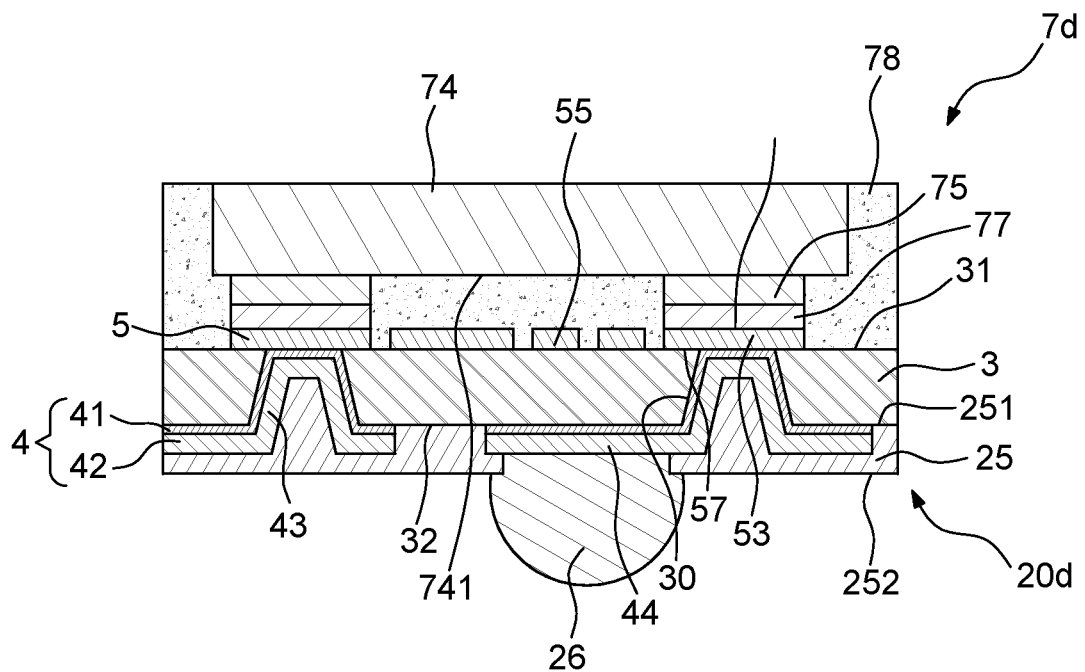
FIG. 14 illustrates a cross-sectional view of an example of a package unit according to some embodiments of the present disclosure.

FIG. 14 illustrates a cross-sectional view of an example of a package unit 7d according to some embodiments of the present disclosure. The package unit 7d corresponds to each of the substrate units 20d shown in FIG. 7. That is, the package unit 7d includes the substrate unit 20d, and further includes a semiconductor die 74 and an encapsulant 78.

The semiconductor die 74 is connected to the substrate unit 20d. The semiconductor die 74 may include a bump 75 disposed on a lower surface 741 of the semiconductor die 74. The bump 75 of the semiconductor die 74 is electrically connected to the conductive pad 53 of the circuit structure 5 of the substrate unit 20d through a solder material 77 disposed therebetween. The solder material 77 may be made of tin, or another metal or combination of metals.

The encapsulant 78 is disposed on the substrate unit 20d, and covers at least a portion of the substrate unit 20d and/or the semiconductor die 74. For example, the encapsulant 78 is disposed between the first dielectric layer 3 of the substrate unit 20d and the semiconductor die 74, and encapsulates the bump 75, the solder material 77 and a portion of the circuit structure 5. The encapsulant 78 may be an underfill or a molding compound.

Figure 15:
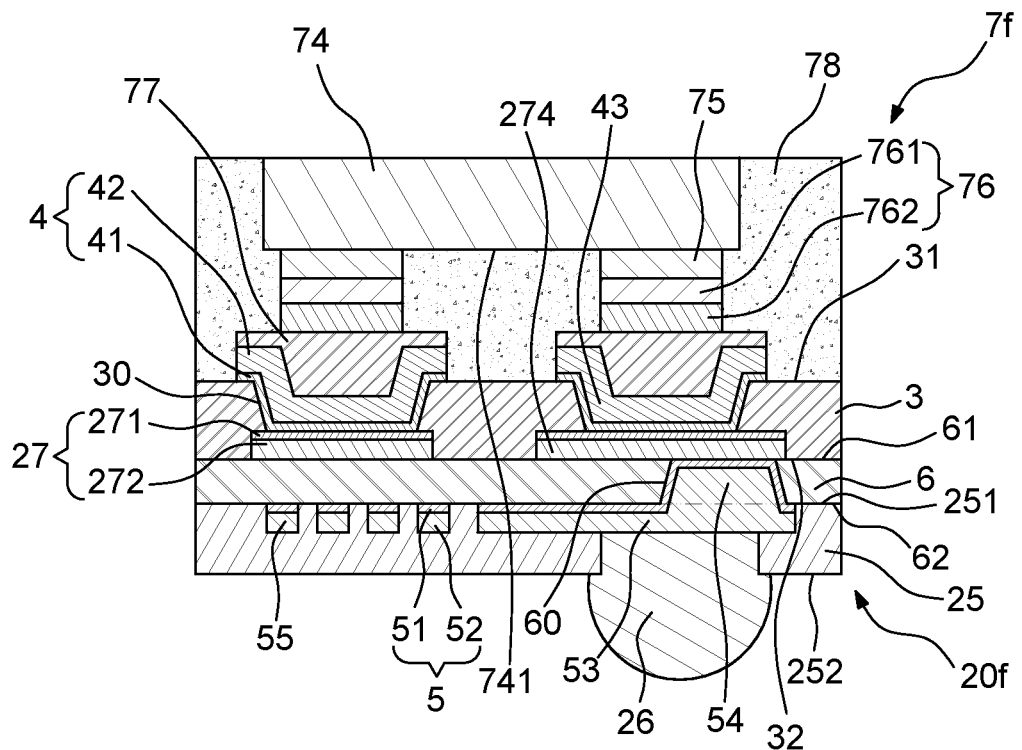
FIG. 15 illustrates a cross-sectional view of an example of a package unit according to some embodiments of the present disclosure.

FIG. 15 illustrates a cross-sectional view of an example of a package unit 7f according to some embodiments of the present disclosure. The package unit 7f corresponds to each of the substrate units 20f shown in FIG. 9. That is, the package unit 7f includes the substrate unit 20f, and further includes a semiconductor die 74 and an encapsulant 78.

The semiconductor die 74 is connected to the substrate unit 20f The semiconductor die 74 may include a bump 75 disposed on a lower surface 741 of the semiconductor die 74, and an UBM 76 disposed on the bump 75. The UBM 76 may include a first layer 761 and second layer 762 sequentially disposed on the bump 75. For example, a material of the first layer 761 may be nickel, and a material of the second layer 762 may be palladium, but not limited thereto. In some embodiments, the UBM 76 may include three layers made of nickel, palladium and gold. The UBM 76 of the semiconductor die 74 is connected through the solder material 77 to the redistribution layer 4 of the substrate unit 20f, such as the conductive via 43 of the redistribution layer 4.

The encapsulant 78 is disposed on the substrate unit 20f, and covers at least a portion of the substrate unit 20f and/or the semiconductor die 74. For example, the encapsulant 78 is disposed on the first dielectric layer 3 of the substrate unit 20f, and covers and encapsulates the semiconductor die 74, the bump 75 and the UBM 76 of the semiconductor die 74, the solder material 77, and the redistribution layer 4 of the substrate unit 20f. The encapsulant 78 may be an underfill or a molding compound.

Figure 16:
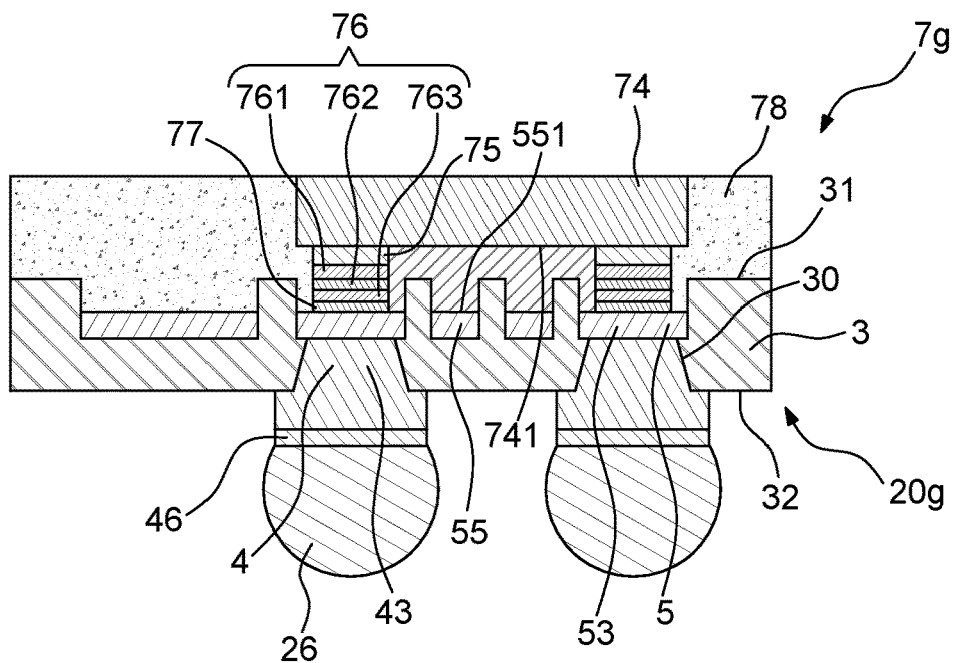
FIG. 16 illustrates a cross-sectional view of an example of a package unit according to some embodiments of the present disclosure.

FIG. 16 illustrates a cross-sectional view of an example of a package unit 7g according to some embodiments of the present disclosure. The package unit 7g corresponds to each of the substrate units 20g shown in FIG. 10. That is, the package unit 7g includes the substrate unit 20g, and further includes the semiconductor die 74 and the encapsulant 78. The semiconductor 74 and the encapsulant 78 are the same as those described in FIG. 10, thus are not repeated redundantly here.

Figure 17:
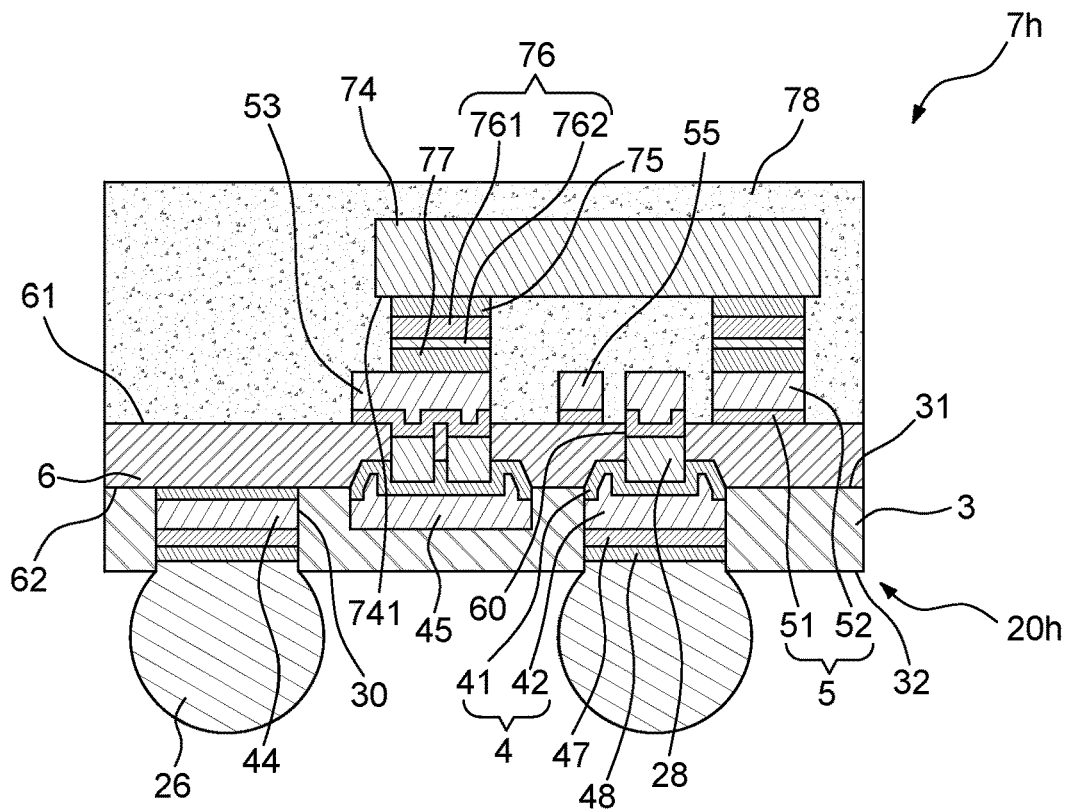
FIG. 17 illustrates a cross-sectional view of an example of a package unit according to some embodiments of the present disclosure.

FIG. 17 illustrates a cross-sectional view of an example of a package unit 7h according to some embodiments of the present disclosure. The package unit 7h corresponds to each of the substrate units 20h shown in FIG. 11. That is, the package unit 7h includes the substrate unit 20h, and further includes the semiconductor die 74 and the encapsulant 78. The semiconductor 74 and the encapsulant 78 are the same as those described in FIG. 11, thus are not repeated redundantly here.

Figure 18:
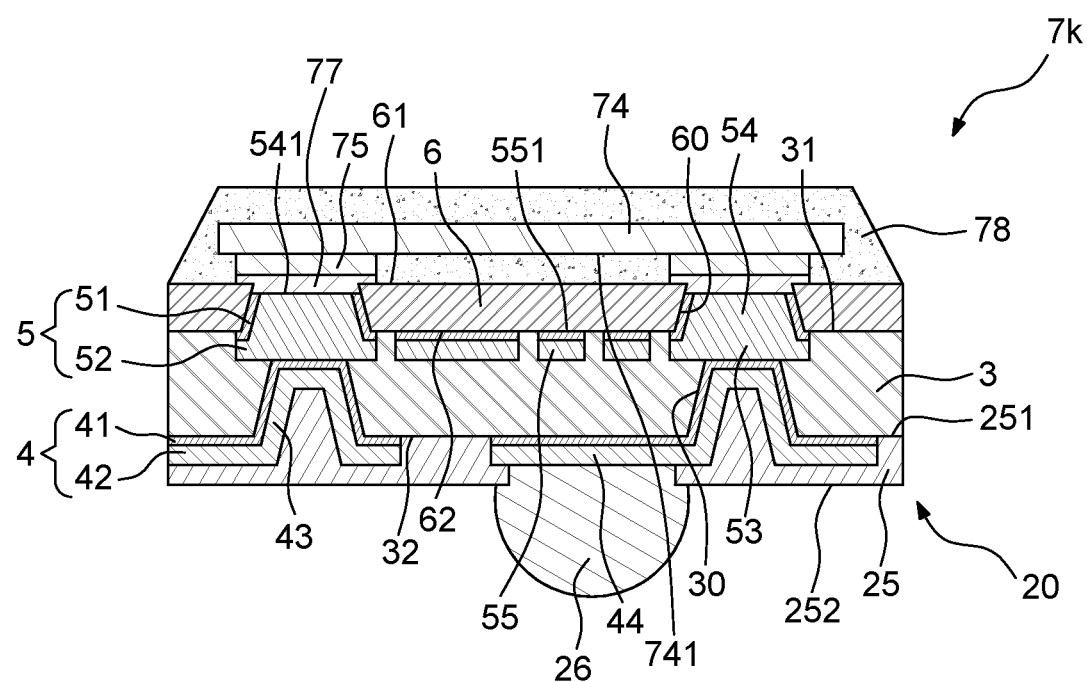
FIG. 18 illustrates a cross-sectional view of an example of a package unit according to some embodiments of the present disclosure.

FIG. 18 illustrates a cross-sectional view of an example of a package unit 7k according to some embodiments of the present disclosure. The package unit 7k corresponds to each of the substrate units 20 shown in FIG. 3 or FIG. 4. That is, the package unit 7 includes the substrate unit 20, and further includes a semiconductor die 74 and an encapsulant 78. The package unit 7k is similar to the package unit 7 shown in FIG. 12, except that the encapsulant 78 of the package unit 7k completely covers the semiconductor die 74.

FIGS. 19 to 26 illustrate a manufacturing process according to some embodiments of the present disclosure. In some embodiments, the manufacturing process is for manufacturing a substrate panel structure such as the substrate panel structure 1 shown in FIGS. 2 and 3, and/or the package unit such as the package unit 7 shown in FIG. 12.

Figure 19:
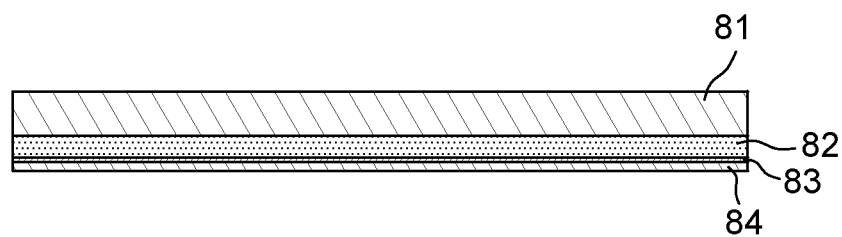
FIG. 19 illustrates a cross-sectional view of an example of a package unit according to some embodiments of the present disclosure.

Referring to FIG. 19, an intermediate carrier 81 is provided. The intermediate carrier 81 may include a releasing film 82 disposed thereon. A seed layer is formed or disposed on the intermediate carrier 81, by, for example, sputtering. As shown in FIG. 19, the seed layer includes a titanium layer 83 and a copper layer 84 sequentially disposed on the releasing film 82 of the intermediate carrier 81.

Figure 20:
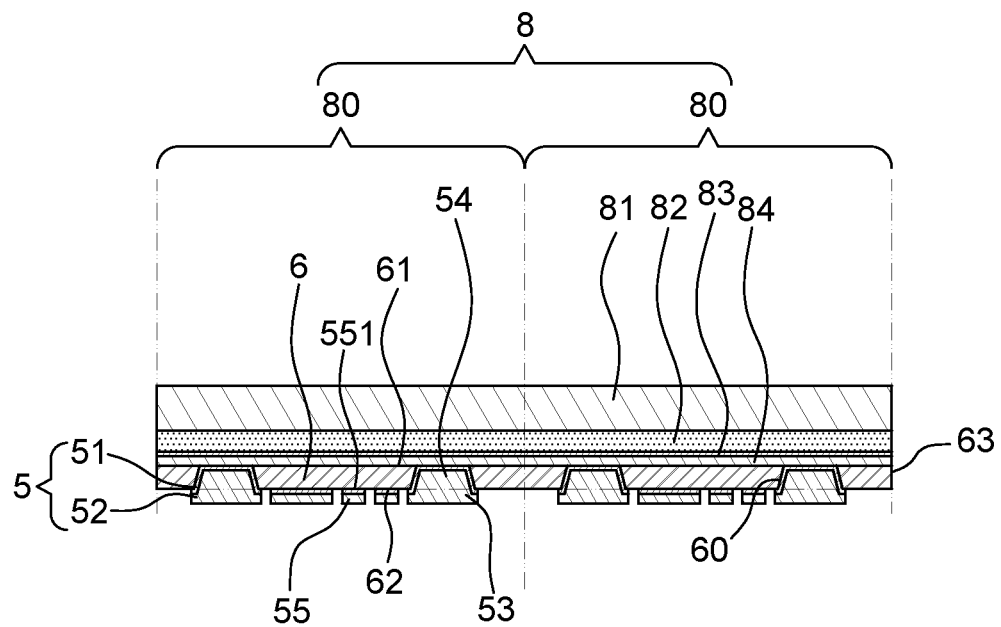
FIG. 20 illustrates one or more stages of an example of a manufacturing process according to some embodiments of the present disclosure.

Referring to FIG. 20, a second dielectric layer 6 is formed on the seed layer (e.g., the copper layer 84). The second dielectric layer 6 has a first surface 61, a second surface 62 opposite to the first surface 61, and a lateral surface 63 extending between the first surface 61 and the second surface 62. As shown in FIG. 20, the first surface 61 is an upper surface, and the second surface 62 is a lower surface. The first surface 61 contacts the seed layer (e.g., the copper layer 84). The second dielectric layer 6 defines at least one through hole 60 extending through the second dielectric layer 6 and between the first surface 61 and the second surface 62 to expose a portion of the seed layer (e.g., the copper layer 84). Then, a circuit structure 5 is formed on the second surface 62 of the second dielectric layer 6 and in the through hole 60 of the second dielectric layer 6. The circuit structure 5 includes a seed layer 51 and a conductive layer 52. The seed layer 51 is disposed between the conductive layer 52 and the second dielectric layer 6, and between the conductive layer 52 and the seed layer (e.g., the copper layer 84) in the through hole 60. For example, the seed layer 51 may be formed by sputtering, and the conductive layer 52 may be formed by plating. A material of the seed layer 51 may be, for example, titanium or copper. In some embodiments, the seed layer 51 may include a titanium layer and a copper layer. A material of the conductive layer 52 may be, for example, a conductive metal, such as copper, or another metal or combination of metals. The circuit structure 5 includes at least one conductive pad 53, at least one conductive via 54 and at least one trace 55. The conductive pad 53, the conductive via 54 and the trace 55 may be formed integrally and concurrently. In some embodiments, the conductive via 54 is disposed on and formed integrally with the conductive pad 53. The conductive via 54 of the circuit structure 5 may be disposed in the through hole 60 of the second dielectric layer 6. That is, each of the circuit structures 5 includes at least one conductive via 54 disposed in the through hole 60 of respective one of the second dielectric layers 6. The trace 55 has an upper surface 551, which contacts and is substantially coplanar with the lower surface 62 of the second dielectric layer 6. In some embodiments, an L/S of the circuit structure 5 may be equal to or less than 2 μm/2 μm. Accordingly, an intermediate panel 8 is formed. The intermediate panel 8 includes a plurality of panel units 80 connected with each other. Each of the panel units 80 corresponds to a package unit, such as the package unit 7 shown in FIG. 12.

For illustration purpose, FIGS. 19 and 20 shows one intermediate panel 8. However, a plurality of intermediate panels 8 may be provided or formed through the aforementioned process. Each of the intermediate panels 8 includes one circuit structure 5, and these intermediate panels 8 are separated from each other. That is, a plurality of intermediate carriers 81 may be provided, and the second dielectric layer 6 may be formed on each of the intermediate carriers 81. Similarly, the circuit structure 5 may be formed on each of the intermediate carriers 81, such as formed on the second dielectric layer 6, thus forming each intermediate panel 8. Since the intermediate panels 8 can be separately formed, materials and structures of each of the intermediate panels 8 may be different from others.

Figure 21:
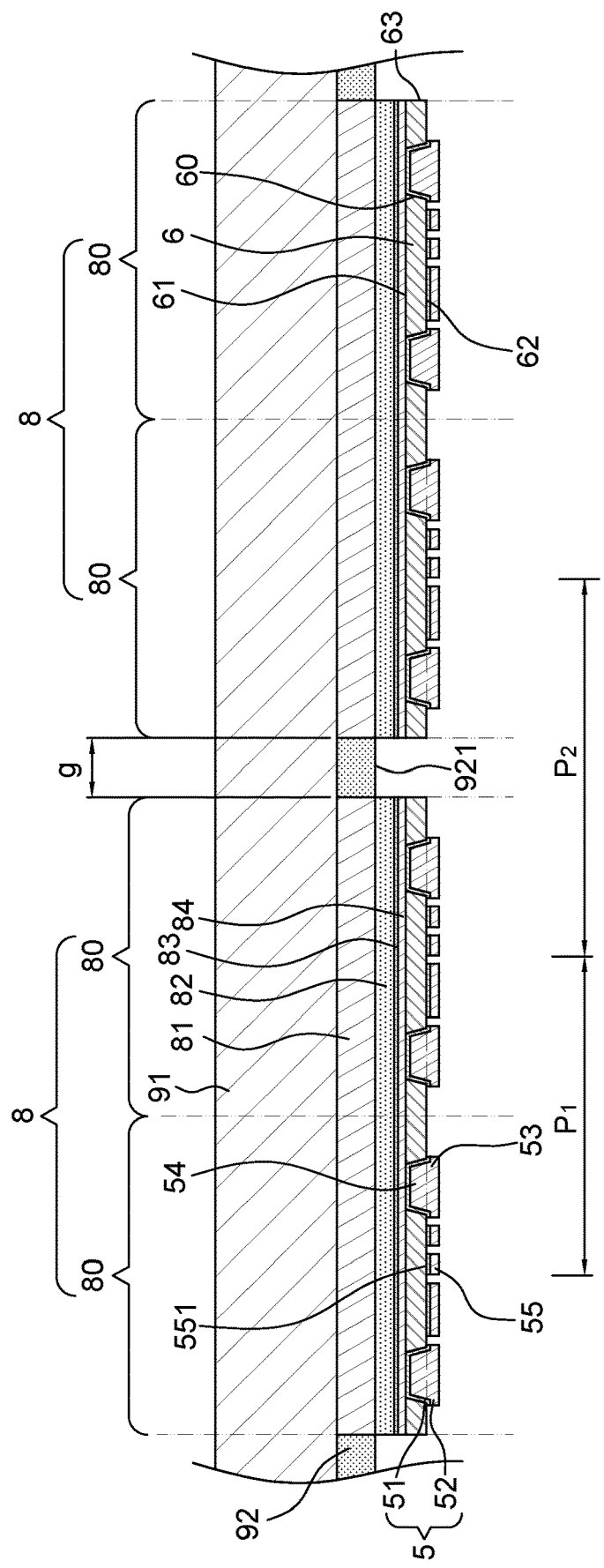
FIG. 21 illustrates one or more stages of an example of a manufacturing process according to some embodiments of the present disclosure.

Referring to FIG. 21, a main carrier 91 is provided. The main carrier 91 includes a soft releasing film 92 disposed thereon. The intermediate panels 8 are disposed on the main carrier 91 and are partially embedded in the soft releasing film 92. The intermediate carriers 81 are located between the main carrier 91 and the circuit structures 5. A lower surface 921 of the soft releasing film 92 is at a level higher than the upper surface (e.g., the first surface 61) of the second dielectric layer 6. The intermediate panels 8 are spaced from each other, and a gap "g" is defined between adjacent two of the intermediate panels 8. For illustration purpose, FIG. 21 shows two intermediate panels 8. However, an amount of the intermediate panels 8 may be more than two.

Figure 22:
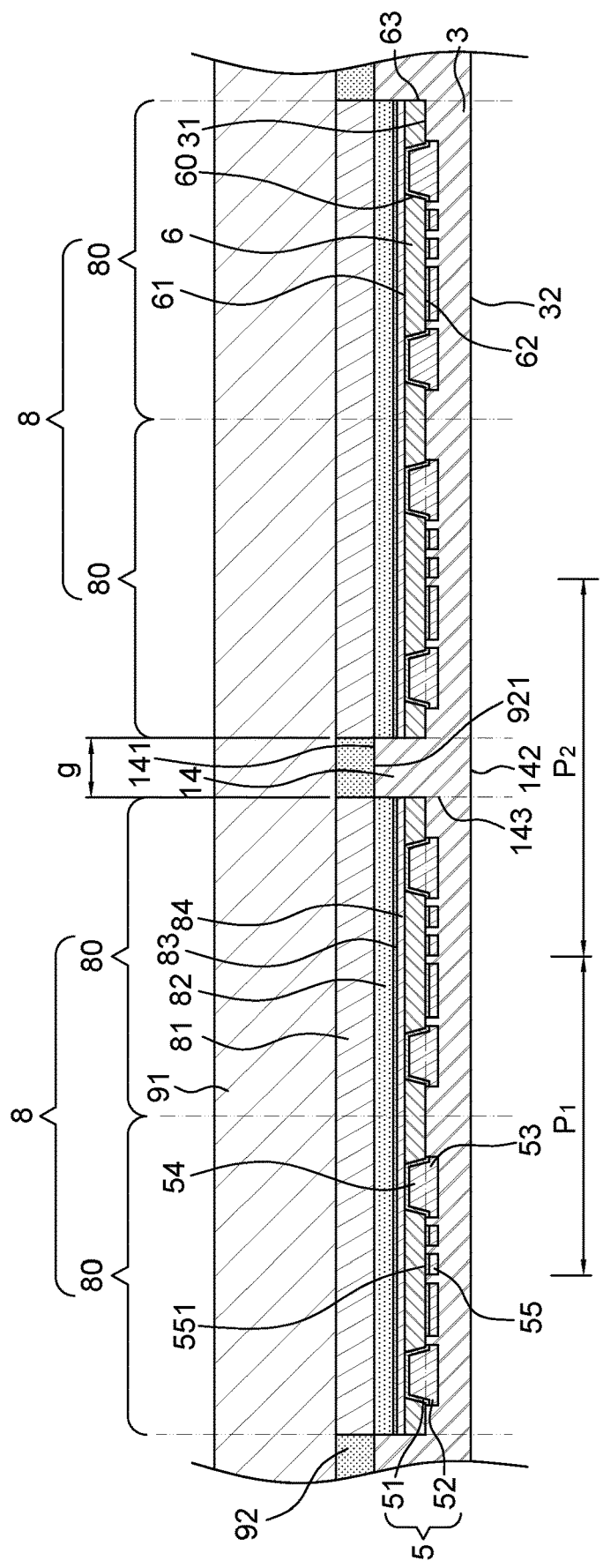
FIG. 22 illustrates one or more stages of an example of a manufacturing process according to some embodiments of the present disclosure.

Referring to FIG. 22, a dielectric material is provided on the main carrier 91 to form a plurality of first dielectric layer 3 and a dielectric portion 14. The dielectric material covers the intermediate panels 8 and the soft releasing film 92. Each of the first dielectric layers 3 is disposed on respective one of the intermediate panels 8. The dielectric portion 14 is disposed in the gap "g" between two adjacent intermediate panels 8 and on the soft releasing film 92. The dielectric portion 14 is disposed between and connects the first dielectric layers 3. The first dielectric layers 3 and the dielectric portion 14 are formed concurrently and integrally as a monolithic structure. That is, there is no boundary or interface between the dielectric portion 14 and the first dielectric layers 3. The dielectric material may be an insulating material or a dielectric material, such as, for example, polypropylene (PP). It is noted that the dielectric material may include, or be formed from, a cured photoimageable dielectric (PID) material such as epoxy or polyimide (PI) including photoinitiators. Accordingly, the first dielectric layers 3 and the dielectric portion 14 may be made of an insulating material or a dielectric material, such as, for example, polypropylene (PP), or may include, or be formed from, a cured photoimageable dielectric (PID) material such as epoxy or polyimide (PI) including photoinitiators.

The first dielectric layer 3 includes a first surface 31 and a second surface 32 opposite to the first surface 31. As shown in FIG. 22, the first surface 31 is an upper surface, and the second surface 32 is a lower surface. The upper surface (e.g., the first surface 31) of the first dielectric layer 3 contacts the lower surface (e.g., the second surface 62) of the second dielectric layer 6, thus is substantially coplanar with the upper surface 551 of the trace 55 of the circuit structure 5. In some embodiments, a thickness of the first dielectric layer 3 may be about 3 µm to about 20 preferably about 3 µm to about 15 µm.

The dielectric portion 14 has an upper surface 141, a lower surface 142 and at least one lateral surface 143 extending between the upper surface 141 and the lower surface 142. The upper surface 141 contacts the lower surface 921 of the soft releasing film 92, thus is at a level higher than the upper surface (e.g., the first surface 61) of the second dielectric layer 6. At least a portion of the lateral surface 143 is an imaginary surface or an imaginary plane. The lateral surface 143 may contact and be substantially coplanar with the lateral surface 63 of the second dielectric layer 6, and may further contact the releasing film 82 and the intermediate carrier 81.

Figure 23:
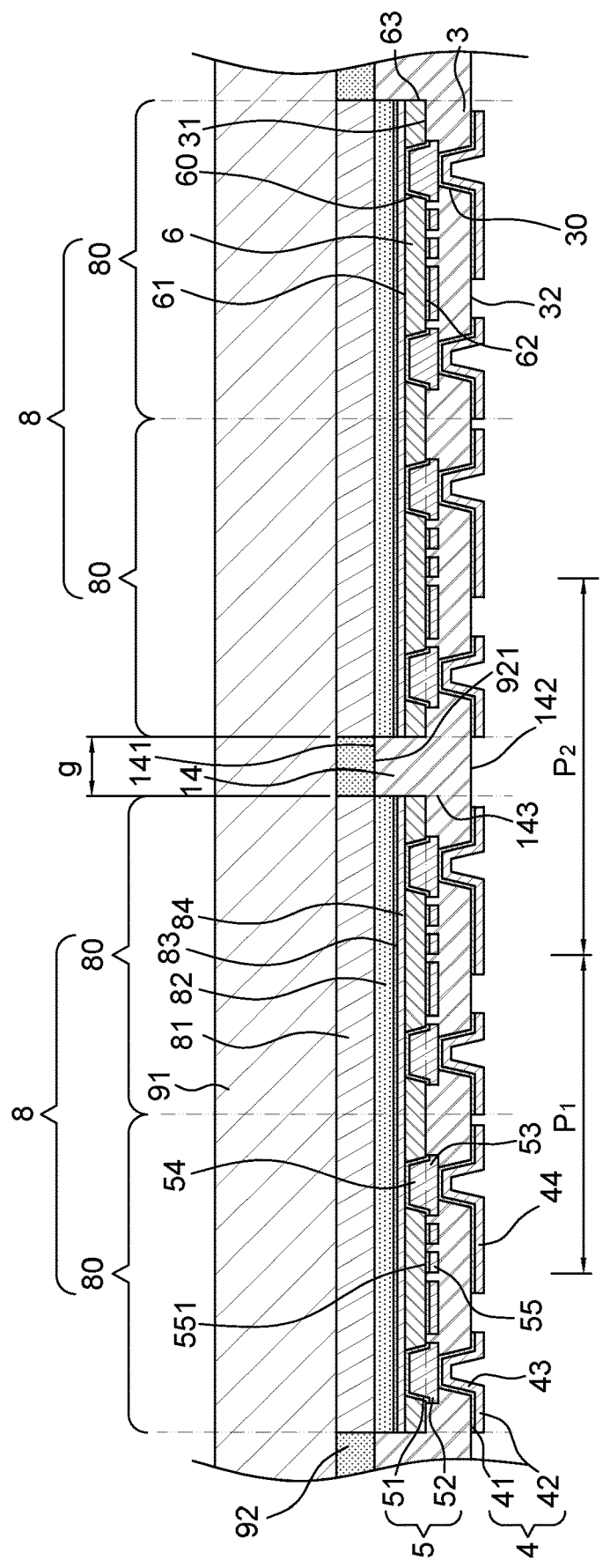
FIG. 23 illustrates one or more stages of an example of a manufacturing process according to some embodiments of the present disclosure.

Referring to FIG. 23, at least one through hole 30 is formed through each of the first dielectric layers 3 by, for example, lithography or drilling. The through hole 30 exposes a portion of the circuit structure 5, such as the conductive pad 53 of the circuit structure 5. Then, a plurality of redistribution layers 4 are formed on the first dielectric layers 3, and each of the redistribution layers 4 is electrically connected to respective one of the circuit structures 5 of the intermediate panels 8. The redistribution layer 4 is disposed on the second surface 32 of the first dielectric layer 3 and in the through hole 30. The redistribution layer 4 may include a seed layer 41 disposed on the first dielectric layer 3, and a conductive layer 42 disposed on the seed layer 41. A material of the seed layer 41 may be, for example, titanium or copper. In some embodiments, the seed layer 41 may include a titanium layer and a copper layer. For example, the seed layer 41 may be formed by sputtering, and the conductive layer 42 may be formed by plating. A material of the conductive layer 42 may be, for example, a conductive metal, such as copper, or another metal or combination of metals. The redistribution layer 4 may include at least one conductive via 43 disposed in the through hole 30 of the first dielectric layer 3, and at least one conductive pad 44 disposed on the second surface 32 of the first dielectric layer 3. The redistribution layer 4 is electrically connected to the circuit structure 5 through the conductive via 43. In some embodiments, the redistribution layer 4 may further include at least one trace (not shown). In some embodiments, a line width/line space (L/S) of the redistribution layer 4 may be equal to or greater than 10 µm/10 µm.

Figure 24:
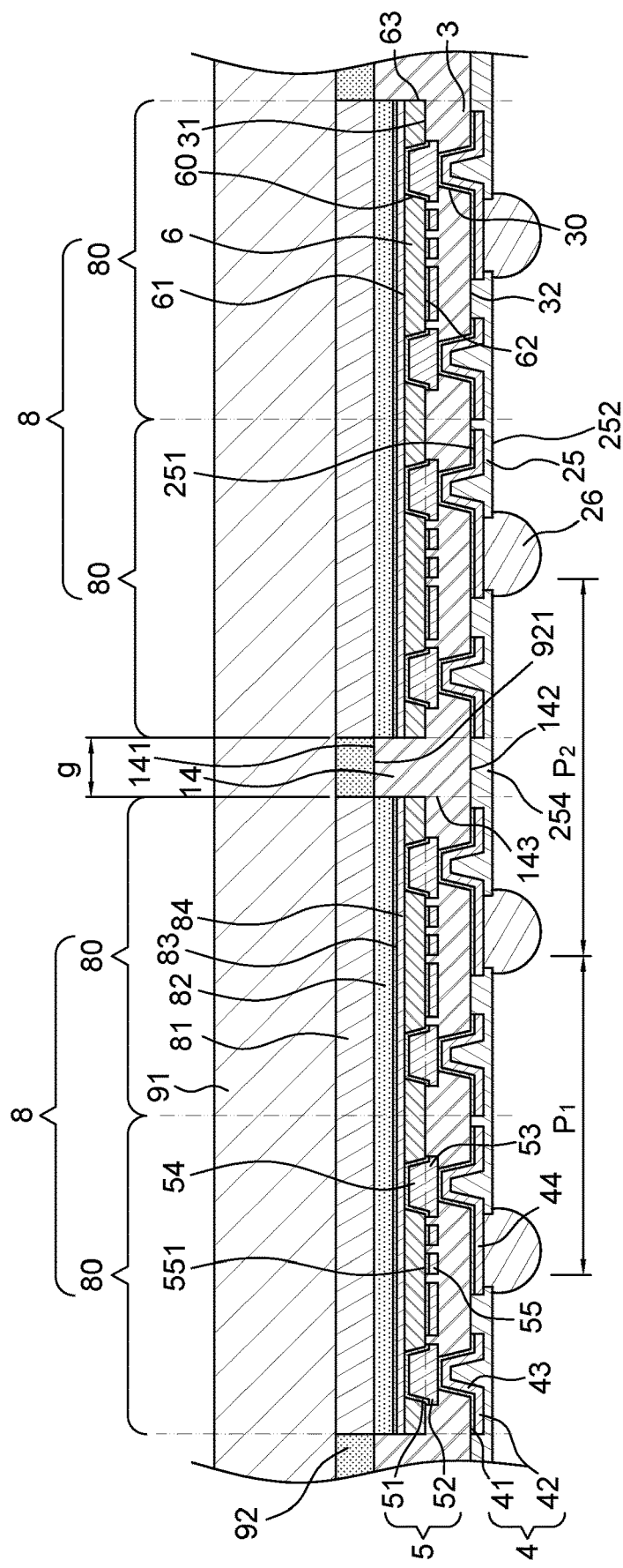
FIG. 24 illustrates one or more stages of an example of a manufacturing process according to some embodiments of the present disclosure.

Referring to FIG. 24, a protection layer 25 is formed on the first dielectric layers 3 and covers the redistribution layers 4. The protection layer 25 has a first surface 251 and a second surface 252 opposite to the first surface 251. The first surface 251 contacts the second surface 32 of the first dielectric layer 3. In some embodiments, the protection layer 25 further includes a portion 254 extending into the gap "g" between the intermediate panels 8 and disposed on the dielectric portion 14. The protection layer 25 may include, or be formed from, a cured photoimageable dielectric (PID) material such as epoxy or polyimide (PI) including photoinitiators, or a solder resist layer. The protection layer 25 covers the redistribution layer 4, and at least a portion of the redistribution layer 4, such as the conductive pad 44, is exposed from the protection layer 25 for external connection. In some embodiments, a thickness of the protection layer 25 may be about 10 µm to about 30 At least one solder connectors 26 is then formed on the exposed portion of the redistribution layer 4, such as the conductive pad 44 of the redistribution layer 4. A material of the solder connector 26 may be a conductive metal, such as tin, or another metal or combination of metals.

Figure 25:
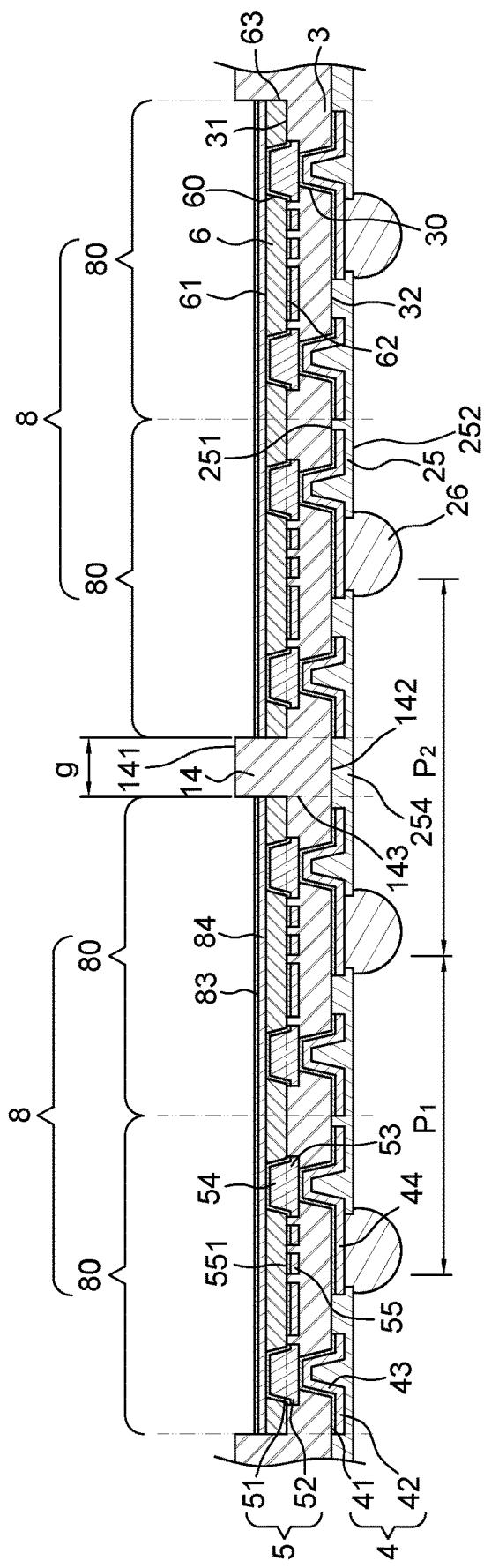
FIG. 25 illustrates one or more stages of an example of a manufacturing process according to some embodiments of the present disclosure.

Referring to FIG. 25, the main carrier 91, including the soft releasing layer 92, is removed. Then, the intermediate carriers 81, including the releasing films 82, are removed, such that the seed layer (e.g., the titanium layer 83) is exposed. Then, the seed layer (e.g., the titanium layer 83 and the copper layer 84) are removed by, for example, etching, thus forming the substrate panel structure 1 shown in FIGS. 2 and 3. Each of the intermediate panels 8 corresponds to respective one of the sub-panels 2. During the etching process, a portion of the seed layer 51 of the circuit structure 5 adjacent to the first surface 61 of the second dielectric layer 6 may also be removed, thus the conductive layer 52 of the conductive via 54 is exposed from the first surface 61 of the second dielectric layer 6. Accordingly, the upper surface 541 of the conductive via 54 is recessed from the upper surface (e.g., the first surface 61) of the second dielectric layer 6.

Figure 26:
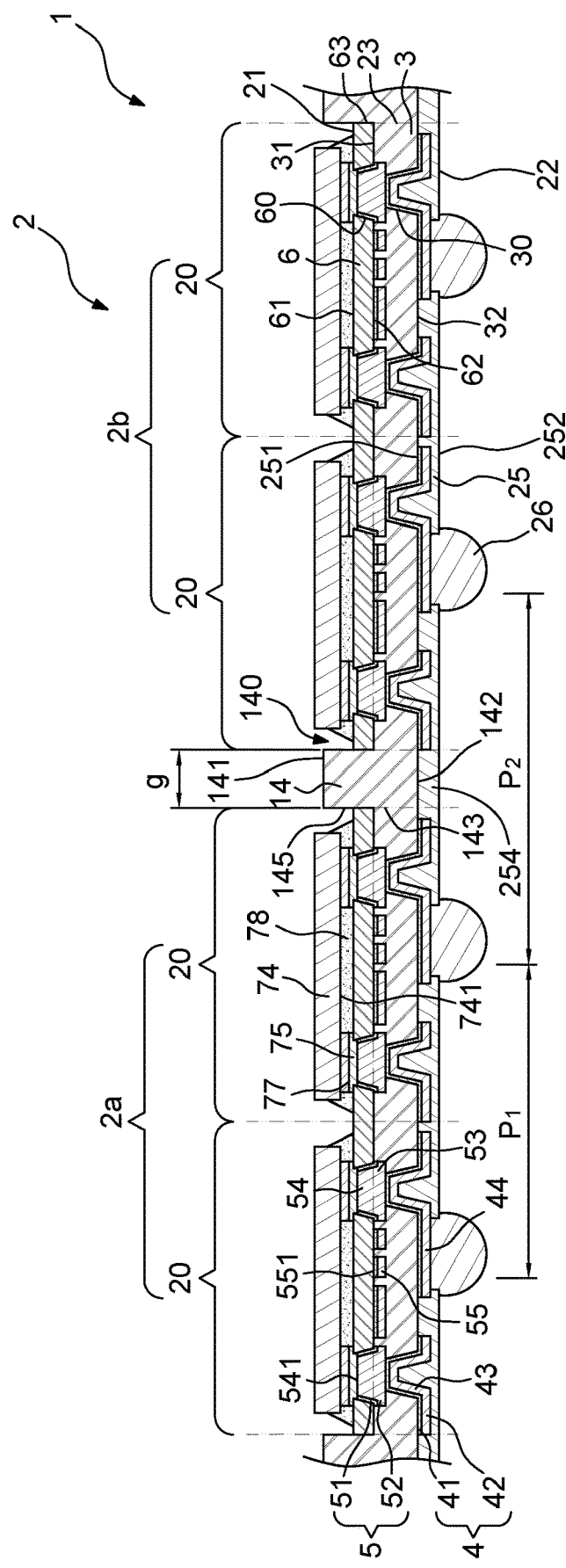
FIG. 26 illustrates one or more stages of an example of a manufacturing process according to some embodiments of the present disclosure.

Referring to FIG. 26, a plurality of semiconductor dice 74 are then connected or mounted to the circuit structure 5 of each of the intermediate panels 8 (e.g., the sub-panels 2 in the substrate panel structure 1). For example, at least one semiconductor die 74 is connected to each of the substrate units 20. The semiconductor die 74 may include a bump 75 disposed on a lower surface 741 of the semiconductor die 74. The bump 75 of the semiconductor die 74 is electrically connected to the conductive via 54 of the circuit structure 5 of the substrate unit 20 through a solder material 77 disposed therebetween. The solder material 77 may be made of tin, or another metal or combination of metals. A plurality of encapsulants 78 are then formed on each of the substrate units 20 to cover respective one of the semiconductor dice 74. For example, the encapsulant 78 is disposed between the second dielectric layer 6 and the semiconductor die 74, and encapsulates the bump 75 and the solder material 77. Then, each of the sub-panels 2 is singulated. That is, each of the intermediate panels 8 (e.g., including the second dielectric layer 6 and the circuit structure 5), each of the first dielectric layers 3 and each of the redistribution layers 4 are singulated, forming a plurality of package units, such as the package unit 7 shown in FIG. 12. For example, the edge of each sub-panel 2 may be cut along the lateral surface 23, such that the dielectric portion 14 and the portion 254 of the protection layer 25 are removed during the singulation process.

In a comparative manufacturing process (e.g., a reconstitution process), an intermediate panel is first cut into a plurality of panel units separated from each other. The panel units are then picked up and placed on a main carrier. Then, other layers, such as a dielectric layer and a redistribution layer, are formed on main carriers, and a plurality of semiconductor dice are then connected to the panel units. The reason for cutting the intermediate panel into the panel units lies in that the intermediate panel is usually a wafer of a round shape, thus the cutting process may effectively decrease the waste area of the wafer. However, these panel units are placed on the main carrier by a machine, which may cause about 1 μm to 3 μm position shift of these units. That is, pitches of these panel units are not consistent, thus the semiconductor dice cannot be bond accurately to the panel units.

In comparison, since the intermediate panel 8 in the aforementioned manufacturing process of the present disclosure includes a plurality of panel units 80 which are connected to each other, pitches therebetween are not affected by pick and place process. That is, pitches between the panel units in the same intermediate panel are substantially consistent, thus the semiconductor dice can be mounted accurately to the panel units.

Figure 27:
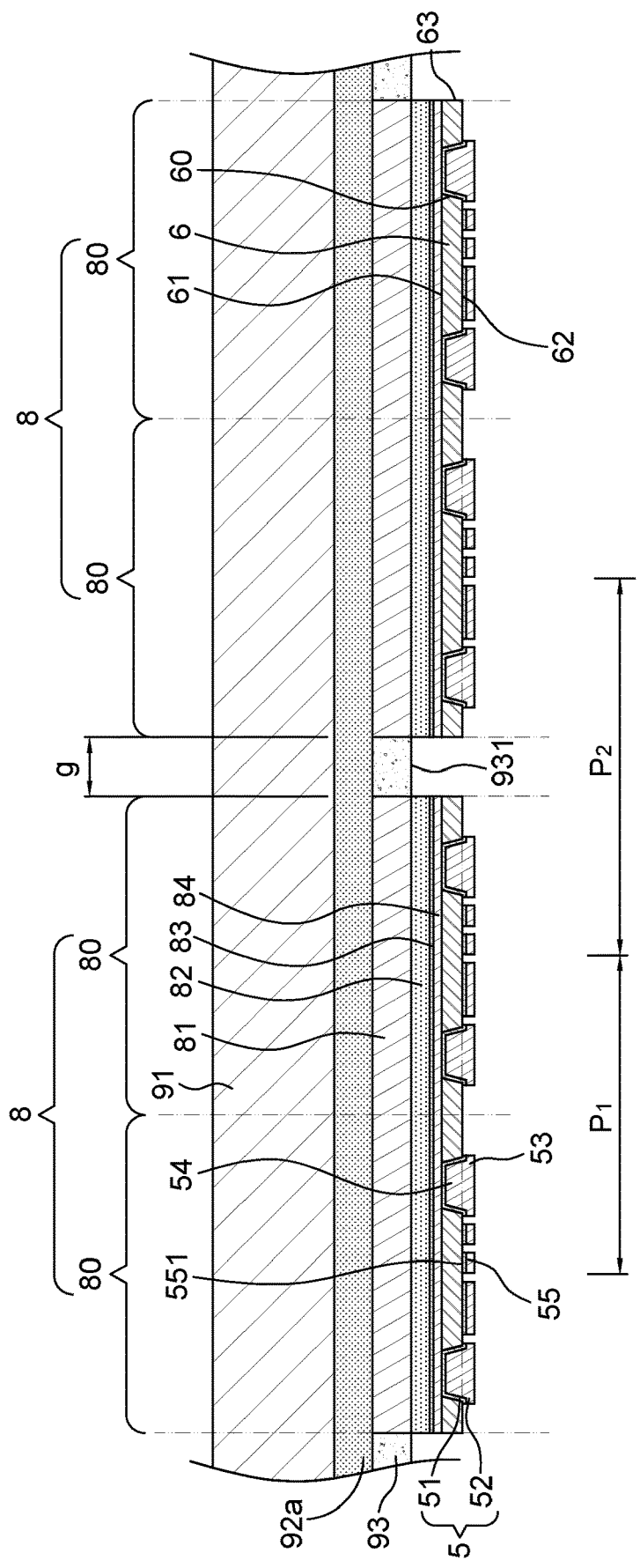
FIG. 27 illustrates one or more stages of an example of a manufacturing process according to some embodiments of the present disclosure.

FIG. 27 illustrates a manufacturing process according to some embodiments of the present disclosure. In some embodiments, the manufacturing process is also for manufacturing a substrate panel structure such as the substrate panel structure 1 shown in FIGS. 2 and 3, and/or the package unit such as the package unit 7 shown in FIG. 12. The initial stages of the illustrated process are the same as, or similar to, the stages illustrated in FIG. 19 through FIG. 20. FIG. 27 depicts a stage subsequent to that depicted in FIG. 20.

The stage shown in FIG. 27 is similar to that shown in FIG. 21, except for the follows. As shown in FIG. 27, the main carrier 91 includes a hard releasing film 92a instead of the soft releasing film 92 shown in FIG. 21. Accordingly, the intermediate panels 8 are disposed on the hard releasing film 92a, instead of being embedded therein. A gap "g" is defined between adjacent two of the intermediate panels 8. A resin material 93, such as a photoresist, is applied in the gap "g" defined between adjacent two of the intermediate panels 8. The resin material 93 may be applied on the hard releasing film 92a before the intermediate panels 8 are disposed, such that the intermediate panels 8 may be embedded in the resin material 93. Alternatively, the resin material 93 may be applied in the in the gap "g" after the intermediate panels 8 are disposed. A lower surface 931 of the resin material 93 is at a level higher than the upper surface (e.g., the first surface 61) of the second dielectric layer 6. In a subsequent stage similar to the stage shown in FIG. 22, the lower surface 931 of the resin material 93 contacts the upper surface 141 of the dielectric portion 14. That is, the thickness of the dielectric portion 14 can be adjusted by varying the thickness of the resin material 93. A position of the upper surface 141 of the dielectric portion 14 can be adjusted by varying a position of the lower surface 931 of the resin material 93.

The stages subsequent to that shown in FIG. 27 of the illustrated process are similar to the stages illustrated in FIG. 22 through FIG. 25, thus forming the substrate panel structure 1 shown in FIGS. 2 and 3. Further stages, such as the stage shown in FIG. 26, may then be conducted to the substrate panel structure 1 shown in FIGS. 2 and 3 to form a plurality of package units, such as the package unit 7 shown in FIG. 12.

Figure 28:
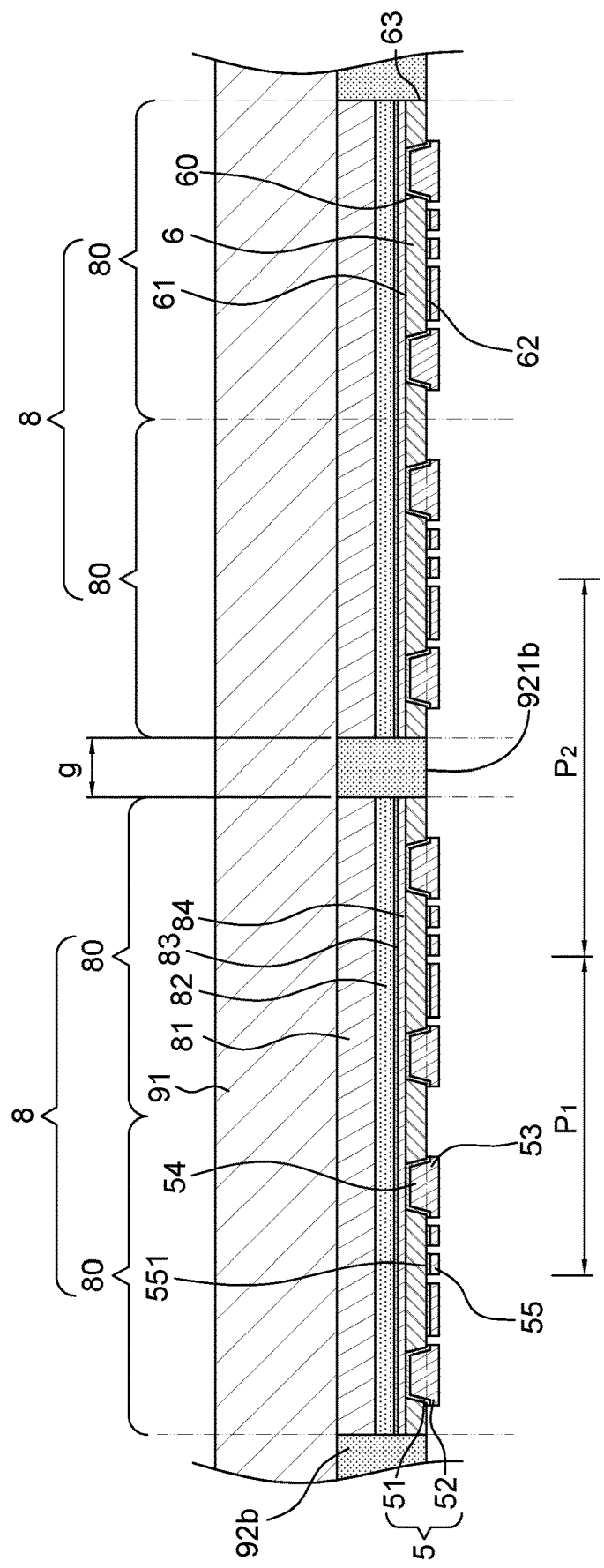
FIG. 28 illustrates one or more stages of an example of a manufacturing process according to some embodiments of the present disclosure.
Figure 29:
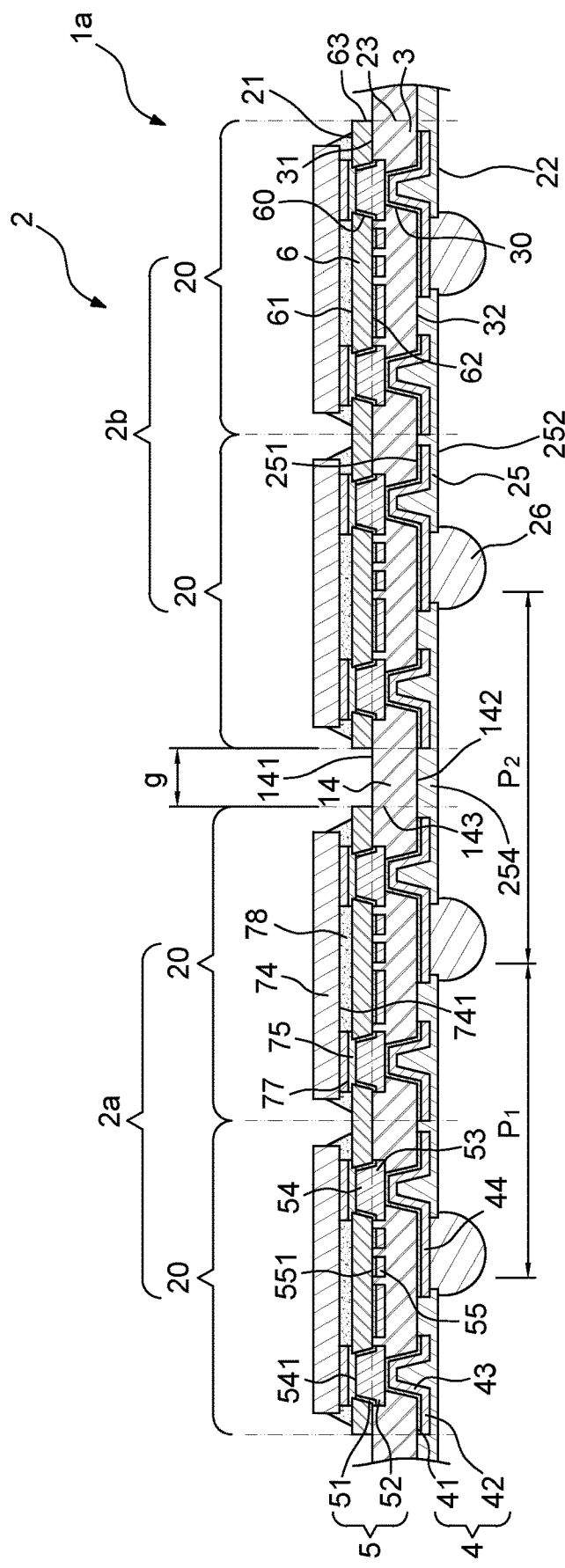
FIG. 29 illustrates one or more stages of an example of a manufacturing process according to some embodiments of the present disclosure.

FIGS. 28 and 29 illustrate a manufacturing process according to some embodiments of the present disclosure. In some embodiments, the manufacturing process is for manufacturing a substrate panel structure such as the substrate panel structure 1a shown in FIG. 4, and/or the package unit such as the package unit 7 shown in FIG. 12. The initial stages of the illustrated process are the same as, or similar to, the stages illustrated in FIG. 19 through FIG. 20. FIG. 28 depicts a stage subsequent to that depicted in FIG. 20.

The stage shown in FIG. 28 is similar to that shown in FIG. 21, except for the follows. As shown in FIG. 28, the main carrier 91 includes a soft releasing film 92b having a thickness greater than that of the soft releasing film 92 shown in FIG. 21. A lower surface 921b of the soft releasing film 92b is substantially coplanar with the lower surface (e.g., the second surface 62) of the second dielectric layer 6. In a subsequent stage similar to the stage shown in FIG. 22, the lower surface 921b of the soft releasing film 92b contacts the upper surface 141 of the dielectric portion 14. Accordingly, the upper surface 141 of the dielectric portion 14 is substantially coplanar with the lower surface (e.g., the second surface 62) of the second dielectric layer 6, as shown in FIG. 4.

The stages subsequent to that shown in FIG. 28 of the illustrated process are similar to the stages illustrated in FIG. 22 through FIG. 25, thus forming the substrate panel structure 1a shown in FIG. 4. Each of the intermediate panels 8 corresponds to respective one of the sub-panels 2.

Referring to FIG. 29, a plurality of semiconductor dice 74 are then connected or mounted to the circuit structure 5 of each of the intermediate panels 8 (e.g., the sub-panels 2 in the substrate panel structure 1). For example, at least one semiconductor die 74 is connected to each of the substrate units 20. The semiconductor die 74 may include a bump 75 disposed on a lower surface 741 of the semiconductor die 74. The bump 75 of the semiconductor die 74 is electrically connected to the conductive via 54 of the circuit structure 5 of the substrate unit 20 through a solder material 77 disposed therebetween. The solder material 77 may be made of tin, or another metal or combination of metals. A plurality of encapsulants 78 are then formed on each of the substrate units 20 to cover respective one of the semiconductor dice 74. For example, the encapsulant 78 is disposed between the second dielectric layer 6 and the semiconductor die 74, and encapsulates the bump 75 and the solder material 77. Then, each of the sub-panels 2 is singulated. That is, each of the intermediate panels 8 (e.g., including the second dielectric layer 6 and the circuit structure 5), each of the first dielectric layers 3 and each of the redistribution layers 4 are singulated, forming a plurality of package units, such as the package unit 7 shown in FIG. 12. For example, the edge of each sub-panel 2 may be cut along the lateral surface 23, such that the dielectric portion 14 and the portion 254 of the protection layer 25 are removed during the singulation process.

Figure 30:
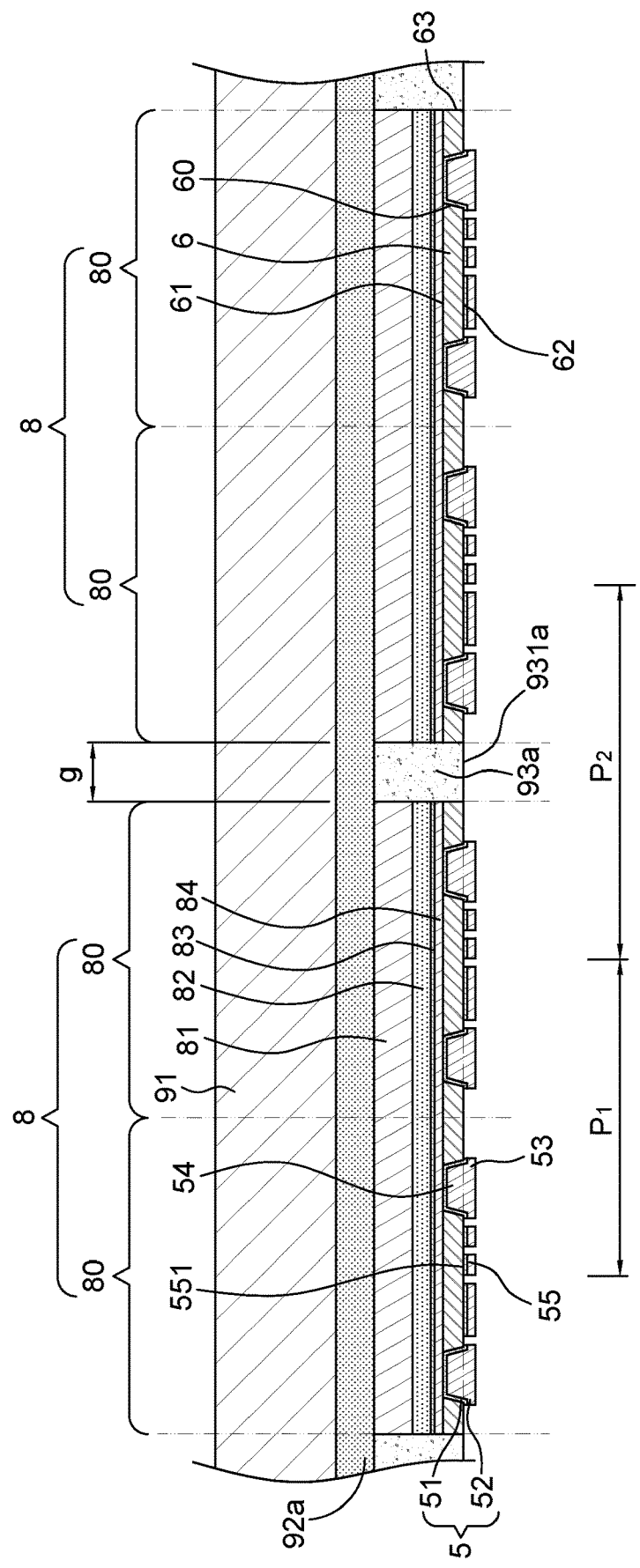
FIG. 30 illustrates one or more stages of an example of a manufacturing process according to some embodiments of the present disclosure.

FIG. 30 illustrates a manufacturing process according to some embodiments of the present disclosure. In some embodiments, the manufacturing process is also for manufacturing a substrate panel structure such as the substrate panel structure 1a shown in FIG. 4, and/or the package unit such as the package unit 7 shown in FIG. 12. The initial stages of the illustrated process are the same as, or similar to, the stages illustrated in FIG. 19 through FIG. 20. FIG. 27 depicts a stage subsequent to that depicted in FIG. 20.

The stage shown in FIG. 30 is similar to that shown in FIG. 28, except for the follows. As shown in FIG. 30, the main carrier 91 includes a hard releasing film 92a instead of the soft releasing film 92b shown in FIG. 28. Accordingly, the intermediate panels 8 are disposed on the hard releasing film 92a, instead of being embedded therein. A gap "g" is defined between adjacent two of the intermediate panels 8. A resin material 93a, such as a photoresist, is applied in the gap "g" defined between adjacent two of the intermediate panels 8. The resin material 93a may be applied on the hard releasing film 92a before the intermediate panels 8 are disposed, such that the intermediate panels 8 may be embedded in the resin material 93a. Alternatively, the resin material 93a may be applied in the in the gap "g" after the intermediate panels 8 are disposed. A lower surface 931a of the resin material 93a is substantially coplanar with the lower surface (e.g., the second surface 62) of the second dielectric layer 6. In a subsequent stage similar to the stage shown in FIG. 22, the lower surface 931a of the resin material 93a contacts the upper surface 141 of the dielectric portion 14. Accordingly, the upper surface 141 of the dielectric portion 14 is substantially coplanar with the lower surface (e.g., the second surface 62) of the second dielectric layer 6, as shown in FIG. 4.

The stages subsequent to that shown in FIG. 30 of the illustrated process are similar to the stages illustrated in FIG. 22 through FIG. 25, thus forming the substrate panel structure 1a shown in FIG. 4. Further stages, such as the stage shown in FIG. 29, may then be conducted to the substrate panel structure 1a shown in FIG. 4 to form a plurality of package units, such as the package unit 7 shown in FIG. 12.

Figure 31:
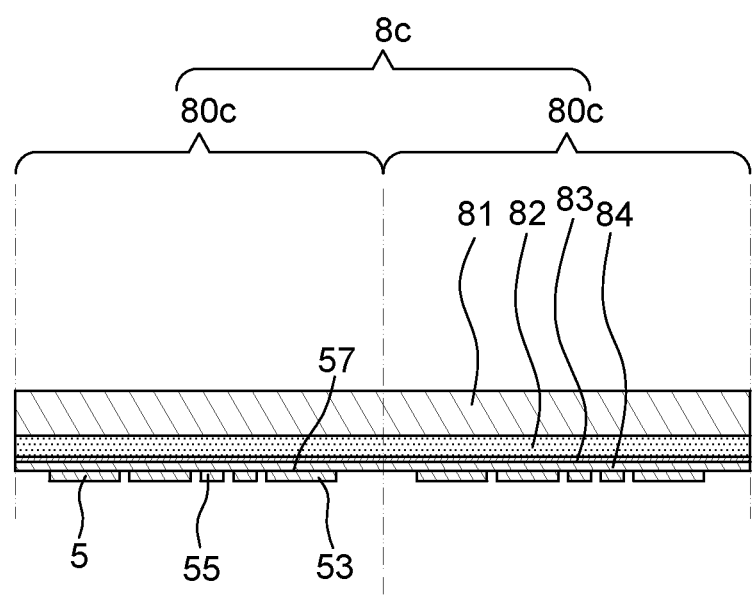
FIG. 31 illustrates one or more stages of an example of a manufacturing process according to some embodiments of the present disclosure.
Figure 32:
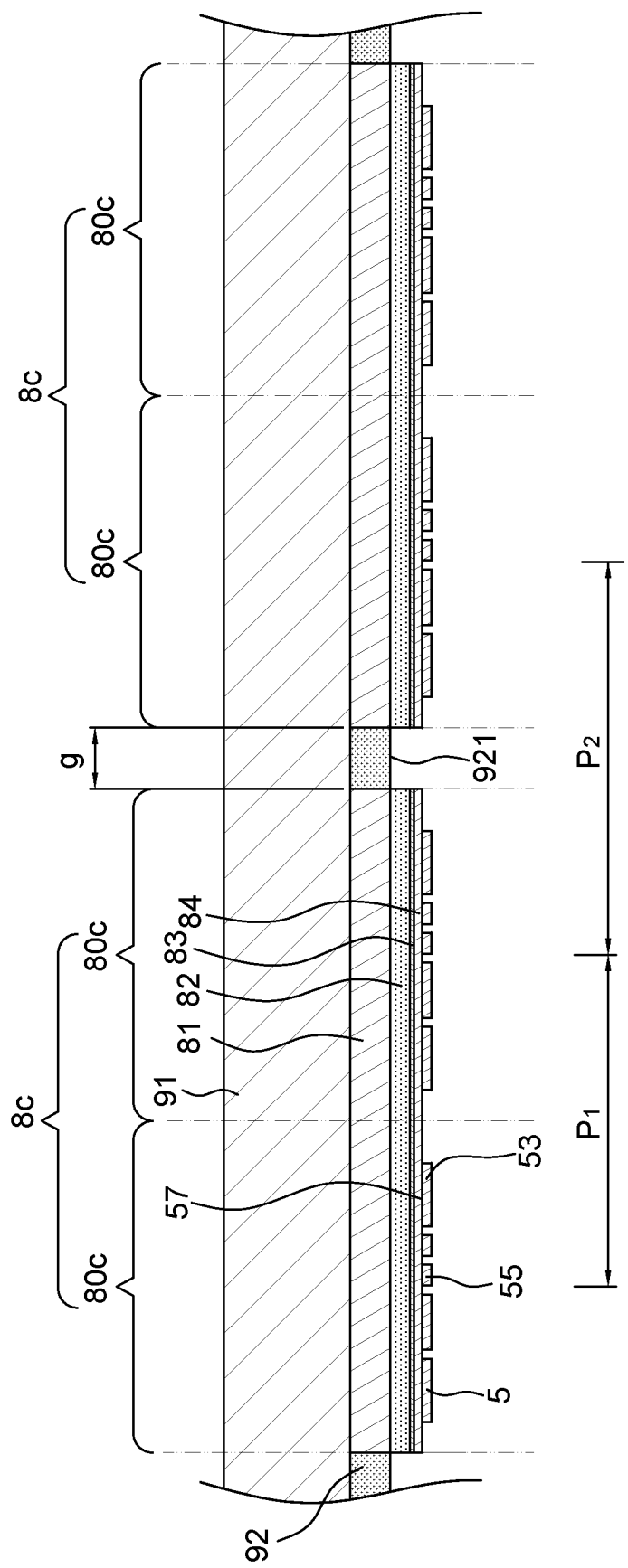
FIG. 32 illustrates one or more stages of an example of a manufacturing process according to some embodiments of the present disclosure.
Figure 33:
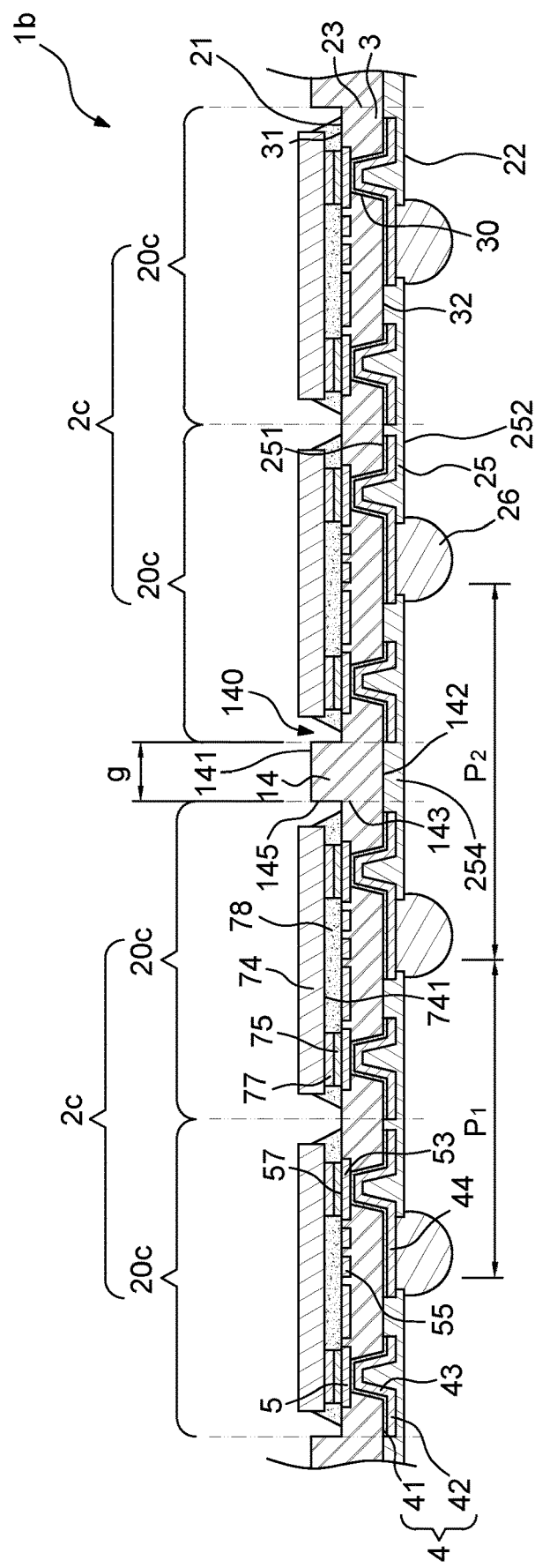
FIG. 33 illustrates one or more stages of an example of a manufacturing process according to some embodiments of the present disclosure.

FIGS. 31 to 33 illustrate a manufacturing process according to some embodiments of the present disclosure. In some embodiments, the manufacturing process is for manufacturing a substrate panel structure such as the substrate panel structure 1b shown in FIG. 5, and/or the package unit such as the package unit 7c shown in FIG. 13. The initial stages of the illustrated process are the same as, or similar to, the stage illustrated in FIG. 19. FIG. 31 depicts a stage subsequent to that depicted in FIG. 19.

Referring to FIG. 31, a circuit structure 5 is formed on the seed layer (e.g., the copper layer 84). A first surface 57 of the circuit structure 5 contacts the seed layer (e.g., the copper layer 84). A material of the circuit structure 5 may be, for example, a conductive metal, such as copper, or another metal or combination of metals. The circuit structure 5 includes at least one conductive pad 53 and at least one trace 55. The conductive pad 53 and the trace 55 may be formed integrally and concurrently. In some embodiments, an L/S of the circuit structure 5 may be equal to or less than 2 μm/2 μm. Accordingly, an intermediate panel 8c is formed. The intermediate panel 8c includes a plurality of panel units 80c connected with each other. Each of the panel units 80c corresponds to a package unit, such as the package unit 7c shown in FIG. 13.

Referring to FIG. 32, a main carrier 91 is provided. The main carrier 91 includes a soft releasing film 92 disposed thereon. The intermediate panels 8c are disposed on the main carrier 91 and are partially embedded in the soft releasing film 92. A lower surface 921 of the soft releasing film 92 is at a level higher than the first surface 57 of the circuit structure 5. As shown in FIG. 32, the first surface 57 of the circuit structure 5 is an upper surface. The intermediate panels are spaced 8c from each other, and a gap "g" is defined between adjacent two of the intermediate panels 8c. As shown in FIG. 32, the intermediate carriers 81 are located between the main carrier 91 and the circuit structures 5. In a subsequent stage similar to the stage shown in FIG. 22, the lower surface 921 of the soft releasing film 92 contacts the upper surface 141 of the dielectric portion 14. Accordingly, the upper surface 141 of the dielectric portion 14 is at a level higher than the upper surface (e.g., the first surface 57) of the circuit structure 5, as shown in FIG. 5. Besides, the first dielectric layer 3 formed on each of the intermediate panels 8c contacts the seed layer (e.g., the copper layer 84), thus the upper surface (e.g., the first surface 31) of the first dielectric layer 3 is substantially coplanar with the upper surface (e.g., the first surface 57) of the circuit structure 5, as shown in FIG. 5.

The stages subsequent to that shown in FIG. 32 of the illustrated process are similar to the stages illustrated in FIG. 22 through FIG. 25, thus forming the substrate panel structure 1b shown in FIG. 5. Each of the intermediate panels 8c corresponds to respective one of the sub-panels 2c.

Referring to FIG. 33, a plurality of semiconductor dice 74 are then connected or mounted to the circuit structure 5 of each of the intermediate panels 8c (e.g., the sub-panels 2c in the substrate panel structure 1b). For example, at least one semiconductor die 74 is connected to each of the substrate units 20c. The semiconductor die 74 may include a bump 75 disposed on a lower surface 741 of the semiconductor die 74. The bump 75 of the semiconductor die 74 is electrically connected to the conductive pad 53 of the circuit structure 5 of the substrate unit 20c through a solder material 77 disposed therebetween. The solder material 77 may be made of tin, or another metal or combination of metals. A plurality of encapsulants 78 are then formed on each of the substrate units 20c to cover respective one of the semiconductor dice 74. For example, the encapsulant 78 is disposed between the first dielectric layer 3 and the semiconductor die 74, and covers and encapsulates the bump 75, the solder material 77 and a portion of the circuit structure 5. Then, each of the sub-panels 2c is singulated. That is, each of the intermediate panels 8c (e.g., including the circuit structure 5), each of the first dielectric layers 3 and each of the redistribution layers 4 are singulated, forming a plurality of package units, such as the package unit 7c shown in FIG. 13. For example, the edge of each sub-panel 2c may be cut along the lateral surface 23, such that the dielectric portion 14 and the portion 254 of the protection layer 25 are removed during the singulation process.

Figure 34:
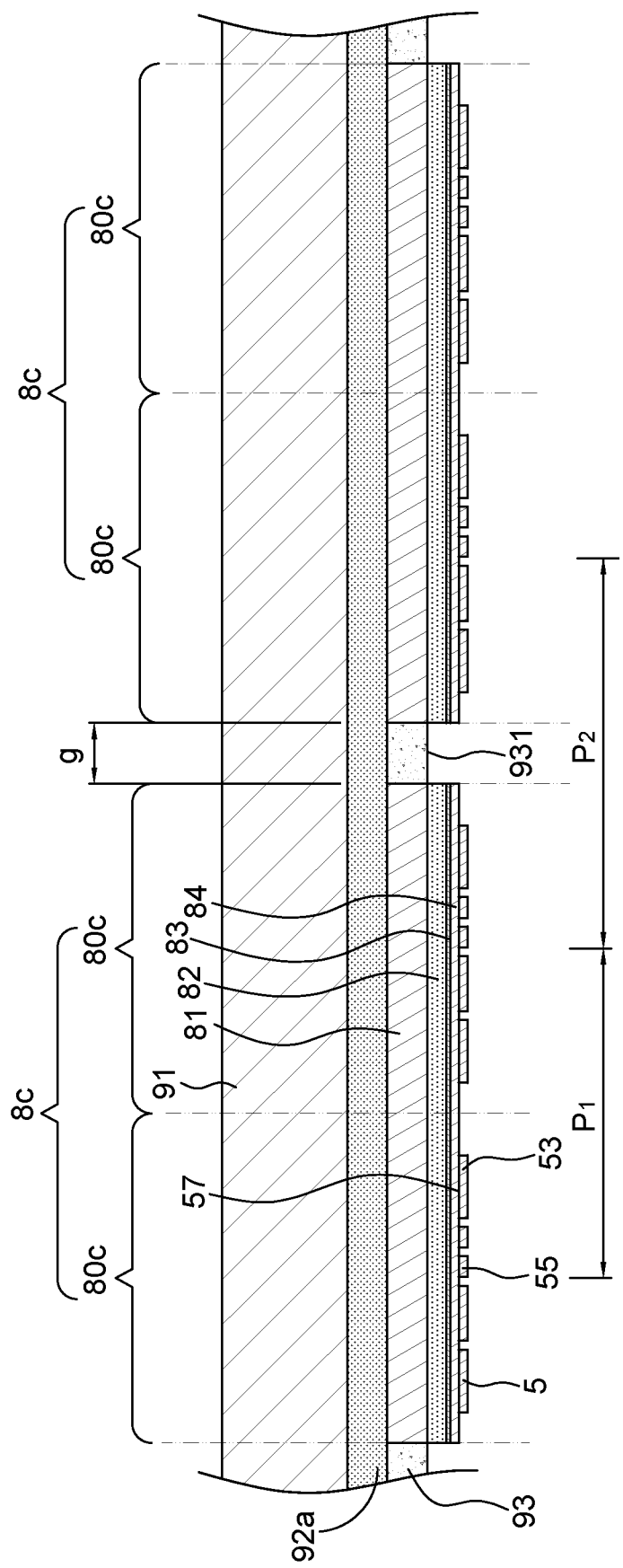
FIG. 34 illustrates one or more stages of an example of a manufacturing process according to some embodiments of the present disclosure.

FIG. 34 illustrates a manufacturing process according to some embodiments of the present disclosure. In some embodiments, the manufacturing process is also for manufacturing a substrate panel structure such as the substrate panel structure 1b shown in FIG. 5, and/or the package unit such as the package unit 7c shown in FIG. 13. The initial stages of the illustrated process are the same as, or similar to, the stages illustrated in FIGS. 19 and 31. FIG. 34 depicts a stage subsequent to that depicted in FIG. 31.

The stage shown in FIG. 34 is similar to that shown in FIG. 32, except for the follows. As shown in FIG. 34, the main carrier 91 includes a hard releasing film 92a instead of the soft releasing film 92 shown in FIG. 32. Accordingly, the intermediate panels 8c are disposed on the hard releasing film 92a, instead of being embedded therein. A gap "g" is defined between adjacent two of the intermediate panels 8c. A resin material 93, such as a photoresist, is applied in the gap "g" defined between adjacent two of the intermediate panels 8c. The resin material 93 may be applied on the hard releasing film 92a before the intermediate panels 8c are disposed, such that the intermediate panels 8c may be embedded in the resin material 93. Alternatively, the resin material 93 may be applied in the in the gap "g" after the intermediate panels 8c are disposed. A lower surface 931 of the resin material 93 is at a level higher than the upper surface e.g., the first surface 57) of the circuit structure 5. In a subsequent stage similar to the stage shown in FIG. 22, the lower surface 931 of the resin material 93 contacts the upper surface 141 of the dielectric portion 14. Accordingly, the upper surface 141 of the dielectric portion 14 is at a level higher than the upper surface (e.g., the first surface 57) of the circuit structure 5, as shown in FIG. 5. Besides, the first dielectric layer 3 formed on each of the intermediate panels 8c contacts the seed layer (e.g., the copper layer 84), thus the upper surface (e.g., the first surface 31) of the first dielectric layer 3 is substantially coplanar with the upper surface (e.g., the first surface 57) of the circuit structure 5, as shown in FIG. 5.

The stages subsequent to that shown in FIG. 34 of the illustrated process are similar to the stages illustrated in FIG. 22 through FIG. 25, thus forming the substrate panel structure 1b shown in FIG. 5. Further stages, such as the stage shown in FIG. 33, may then be conducted to the substrate panel structure 1b shown in FIG. 5 to form a plurality of package units, such as the package unit 7c shown in FIG. 13.

Figure 35:
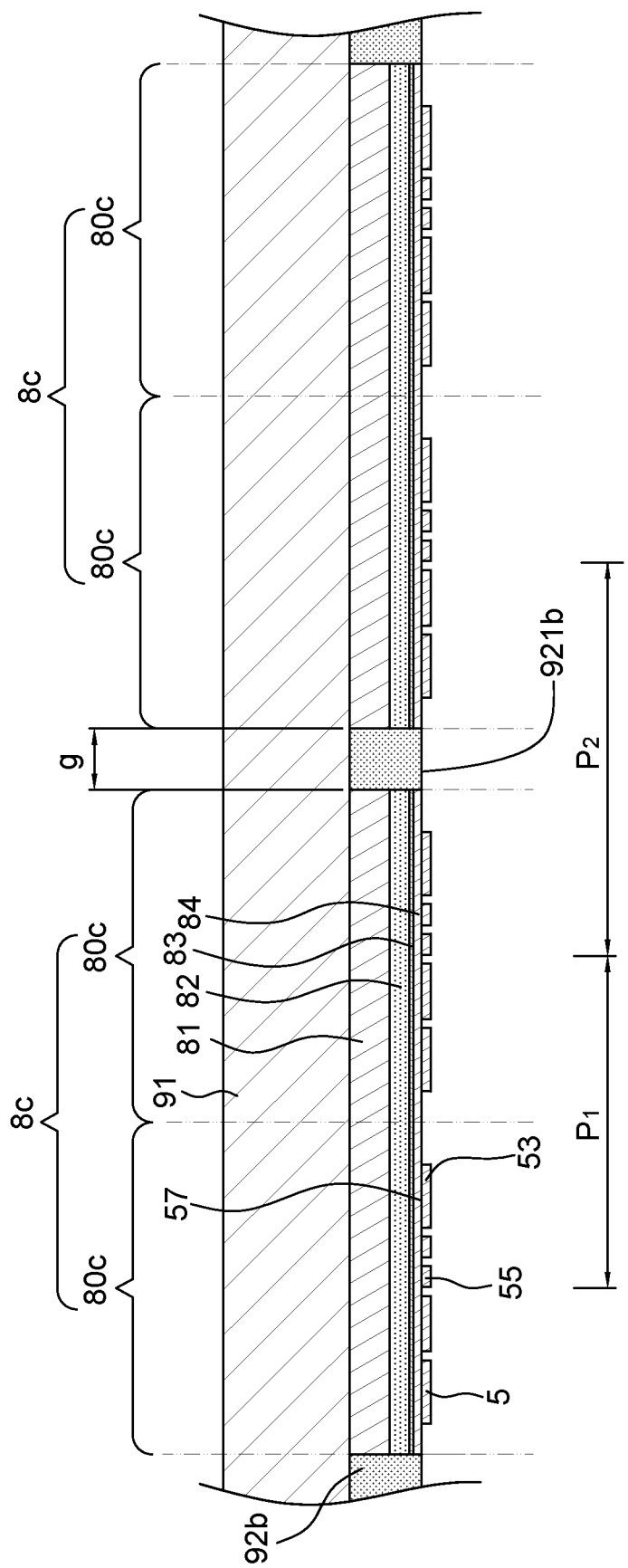
FIG. 35 illustrates one or more stages of an example of a manufacturing process according to some embodiments of the present disclosure.
Figure 36:
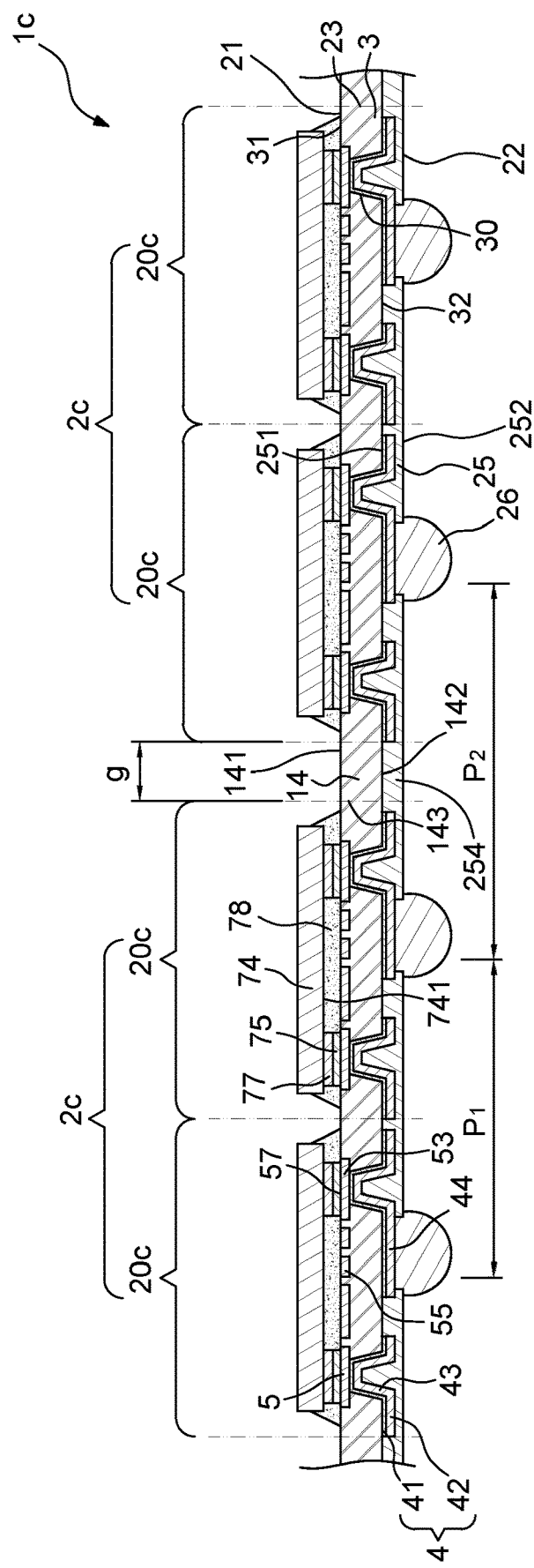
FIG. 36 illustrates one or more stages of an example of a manufacturing process according to some embodiments of the present disclosure.

FIGS. 35 and 36 illustrate a manufacturing process according to some embodiments of the present disclosure. In some embodiments, the manufacturing process is for manufacturing a substrate panel structure such as the substrate panel structure 1c shown in FIG. 6, and/or the package unit such as the package unit 7c shown in FIG. 13. The initial stages of the illustrated process are the same as, or similar to, the stages illustrated in FIGS. 19 and 31. FIG. 35 depicts a stage subsequent to that depicted in FIG. 31.

The stage shown in FIG. 35 is similar to that shown in FIG. 32, except for the follows. As shown in FIG. 35, the main carrier 91 includes a soft releasing film 92b having a thickness greater than that of the soft releasing film 92 shown in FIG. 32. A lower surface 921b of the soft releasing film 92b is substantially coplanar with the upper surface (e.g., the first surface 57) of the circuit structure 5. In a subsequent stage similar to the stage shown in FIG. 22, the lower surface 921b of the soft releasing film 92b contacts the upper surface 141 of the dielectric portion 14. Accordingly, the upper surface 141 of the dielectric portion 14 is substantially coplanar with the upper surface (e.g., the first surface 57) of the circuit structure 5, as shown in FIG. 6. Besides, the first dielectric layer 3 formed on each of the intermediate panels 8c contacts the seed layer (e.g., the copper layer 84), thus the upper surface (e.g., the first surface 31) of the first dielectric layer 3 is substantially coplanar with the upper surface (e.g., the first surface 57) of the circuit structure 5 and the upper surface 141 of the dielectric portion 14, as shown in FIG. 6.

The stages subsequent to that shown in FIG. 35 of the illustrated process are similar to the stages illustrated in FIG. 22 through FIG. 25, thus forming the substrate panel structure 1c shown in FIG. 6. Each of the intermediate panels 8c corresponds to respective one of the sub-panels 2c.

Referring to FIG. 36, a plurality of semiconductor dice 74 are then connected or mounted to the circuit structure 5 of each of the intermediate panels 8c (e.g., the sub-panels 2c in the substrate panel structure 1c). For example, at least one semiconductor die 74 is connected to each of the substrate units 20c. The semiconductor die 74 may include a bump 75 disposed on a lower surface 741 of the semiconductor die 74. The bump 75 of the semiconductor die 74 is electrically connected to the conductive pad 53 of the circuit structure 5 of the substrate unit 20c through a solder material 77 disposed therebetween. The solder material 77 may be made of tin, or another metal or combination of metals. A plurality of encapsulants 78 are then formed on each of the substrate units 20c to cover respective one of the semiconductor dice 74. For example, the encapsulant 78 is disposed between the first dielectric layer 3 and the semiconductor die 74, and covers and encapsulates the bump 75, the solder material 77 and a portion of the circuit structure 5. Then, each of the sub-panels 2c is singulated. That is, each of the intermediate panels 8c (e.g., including the circuit structure 5), each of the first dielectric layers 3 and each of the redistribution layers 4 are singulated, forming a plurality of package units, such as the package unit 7c shown in FIG. 13. For example, the edge of each sub-panel 2c may be cut along the lateral surface 23, such that the dielectric portion 14 and the portion 254 of the protection layer 25 are removed during the singulation process.

Figure 37:
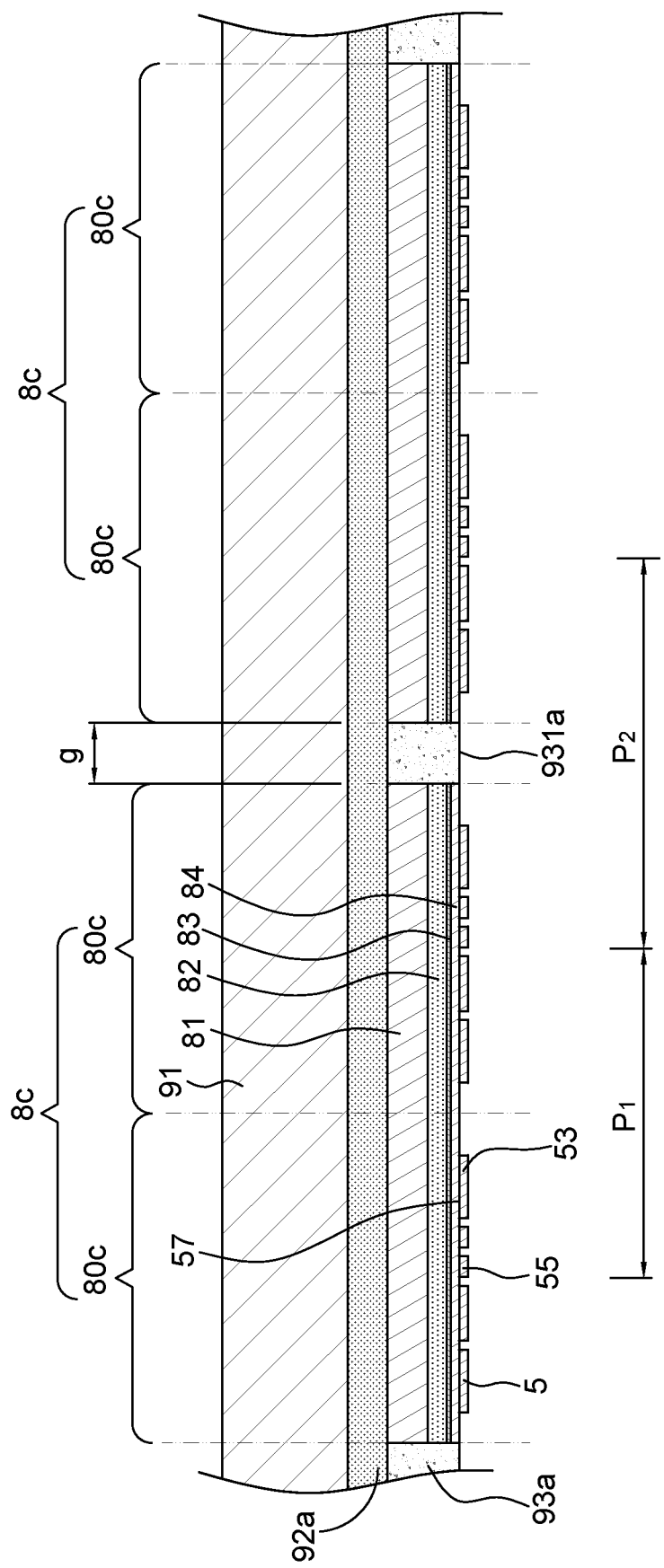
FIG. 37 illustrates one or more stages of an example of a manufacturing process according to some embodiments of the present disclosure.

FIG. 37 illustrates a manufacturing process according to some embodiments of the present disclosure. In some embodiments, the manufacturing process is also for manufacturing a substrate panel structure such as the substrate panel structure 1c shown in FIG. 6, and/or the package unit such as the package unit 7c shown in FIG. 13. The initial stages of the illustrated process are the same as, or similar to, the stages illustrated in FIGS. 19 and 31. FIG. 27 depicts a stage subsequent to that depicted in FIG. 31.

The stage shown in FIG. 37 is similar to that shown in FIG. 35, except for the follows. As shown in FIG. 37, the main carrier 91 includes a hard releasing film 92a instead of the soft releasing film 92b shown in FIG. 35. Accordingly, the intermediate panels 8c are disposed on the hard releasing film 92a, instead of being embedded therein. A gap "g" is defined between adjacent two of the intermediate panels 8c. A resin material 93a, such as a photoresist, is applied in the gap "g" defined between adjacent two of the intermediate panels 8c. The resin material 93a may be applied on the hard releasing film 92a before the intermediate panels 8c are disposed, such that the intermediate panels 8c may be embedded in the resin material 93a. Alternatively, the resin material 93a may be applied in the in the gap "g" after the intermediate panels 8c are disposed. A lower surface 931a of the resin material 93a is substantially coplanar with the upper surface (e.g., the first surface 57) of the circuit structure 5. In a subsequent stage similar to the stage shown in FIG. 22, the lower surface 931a of the resin material 93a contacts the upper surface 141 of the dielectric portion 14. Accordingly, the upper surface 141 of the dielectric portion 14 is substantially coplanar with the upper surface (e.g., the first surface 57) of the circuit structure 5, as shown in FIG. 6. Besides, the first dielectric layer 3 formed on each of the intermediate panels 8c contacts the seed layer (e.g., the copper layer 84), thus the upper surface (e.g., the first surface 31) of the first dielectric layer 3 is substantially coplanar with the upper surface (e.g., the first surface 57) of the circuit structure 5 and the upper surface 141 of the dielectric portion 14, as shown in FIG. 6.

The stages subsequent to that shown in FIG. 37 of the illustrated process are similar to the stages illustrated in FIG. 22 through FIG. 25, thus forming the substrate panel structure 1c shown in FIG. 6. Further stages, such as the stage shown in FIG. 36, may then be conducted to the substrate panel structure 1c shown in FIG. 6 to form a plurality of package units, such as the package unit 7c shown in FIG. 13.

Figure 38:
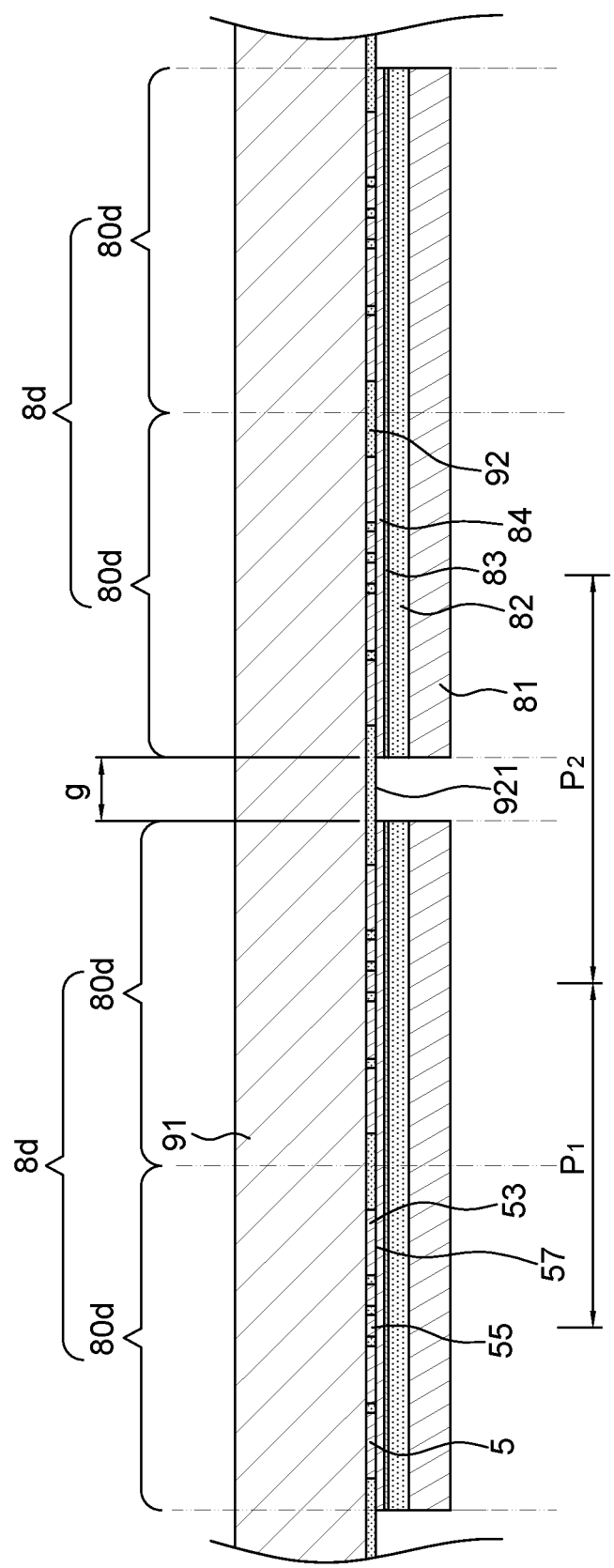
FIG. 38 illustrates one or more stages of an example of a manufacturing process according to some embodiments of the present disclosure.

FIGS. 38 to 41 illustrate a manufacturing process according to some embodiments of the present disclosure. In some embodiments, the manufacturing process is for manufacturing a substrate panel structure such as the substrate panel structure 1d shown in FIG. 7, and/or the package unit such as the package unit 7d shown in FIG. 14. The initial stages of the illustrated process are the same as, or similar to, the stage illustrated in FIGS. 19 and 31. FIG. 38 depicts a stage subsequent to that depicted in FIG. 31.

Referring to FIG. 38, a main carrier 91 is provided. The main carrier 91 includes a soft releasing film 92 disposed thereon. The intermediate panels 8d are disposed on the main carrier 91 and are partially embedded in the soft releasing film 92. The intermediate panel 8d includes a plurality of panel units 80d connected with each other. Each of the panel units 80d corresponds to a package unit, such as the package unit 7d shown in FIG. 14. The formation of the intermediate panels 8d may be same as, or similar to, the formation of the intermediate panel 8c shown in FIG. 31. The circuit structures 5 of the intermediate panels 8d are located between the main carrier 91 and the intermediate carriers 81. The circuit structure 5 is embedded in the soft releasing film 92. The first surface 57 of the circuit structure 5 is a lower surface, as shown in FIG. 38. A lower surface 921 of the soft releasing film 92 is substantially coplanar with the lower surface (e.g., the first surface 57) of the circuit structure 5. The intermediate panels 8d are spaced from each other, and a gap "g" is defined between adjacent two of the intermediate panels 8d. In an alternative manufacturing process, the soft releasing film 92 may be replaced by a hard releasing film 92a and a resin material 93, such as those shown in FIG. 27.

Figure 39:
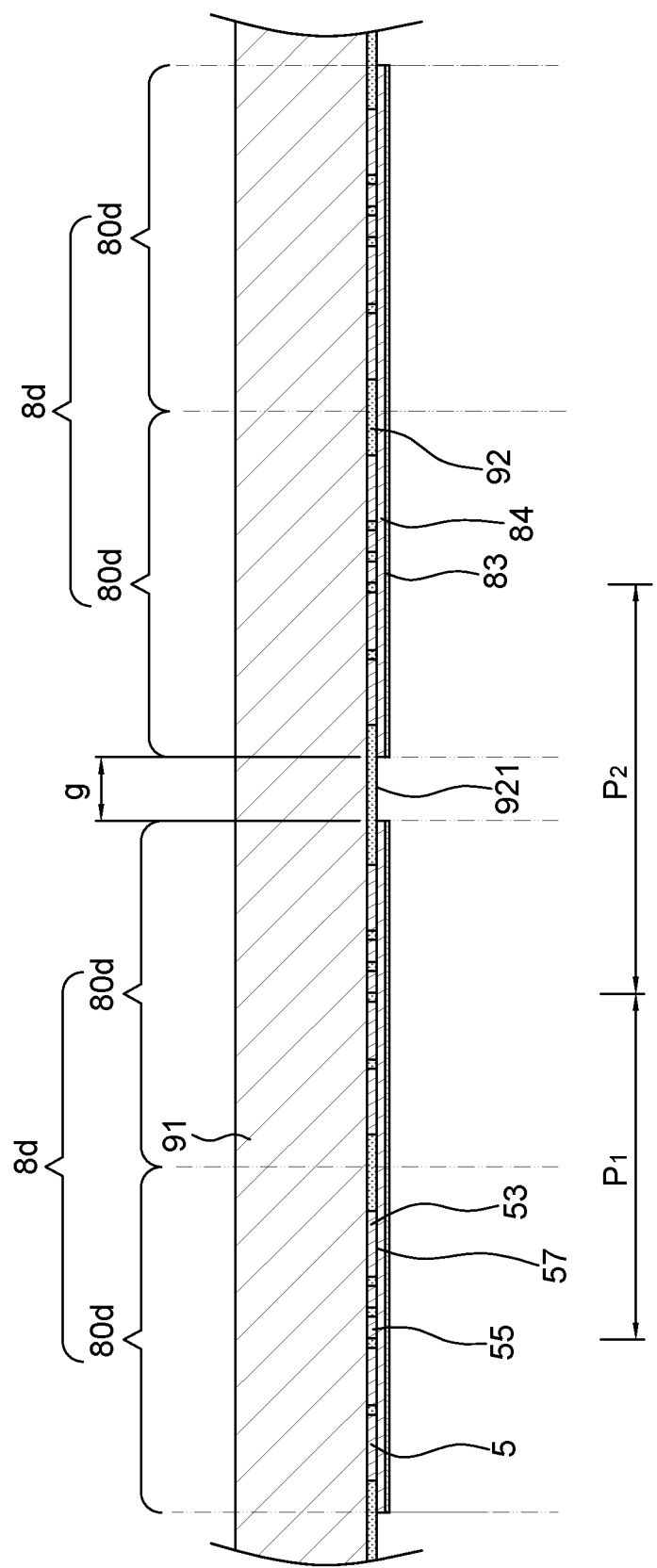
FIG. 39 illustrates one or more stages of an example of a manufacturing process according to some embodiments of the present disclosure.

Referring to FIG. 39, the intermediate carriers 81, including the releasing films 82, are removed, such that the seed layer (e.g., the titanium layer 83 and the copper layer 84) is exposed.

Figure 40:
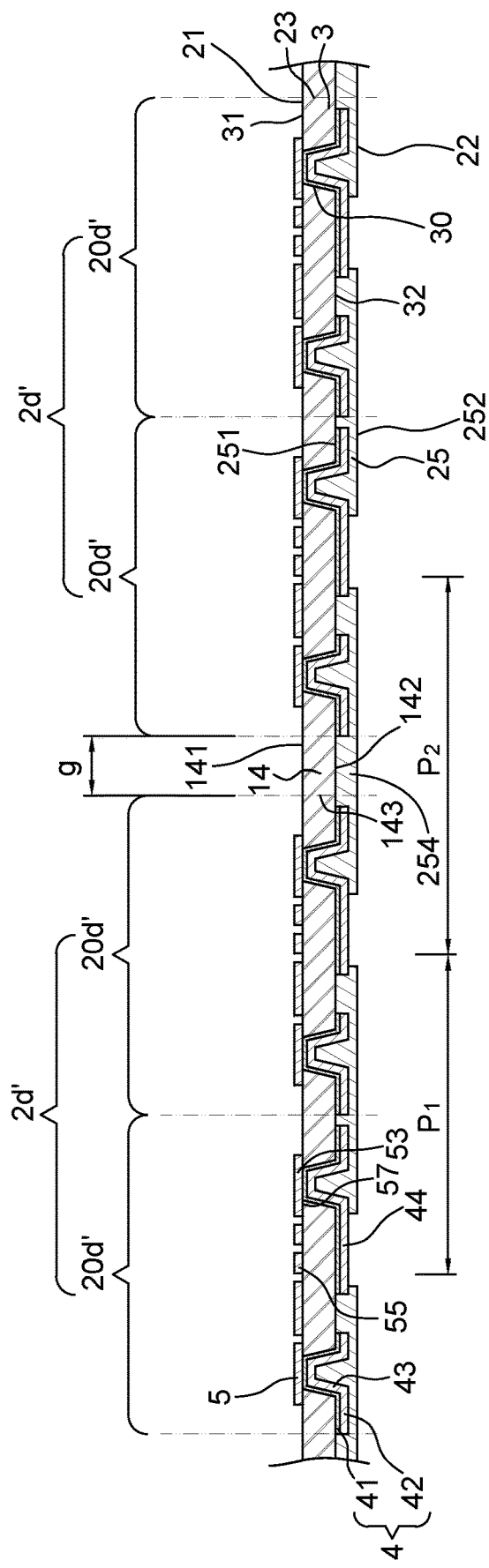
FIG. 40 illustrates one or more stages of an example of a manufacturing process according to some embodiments of the present disclosure.

Referring to FIG. 40, the seed layer (e.g., the titanium layer 83 and the copper layer 84) may be removed by, for example, etching. Then, a dielectric material may be provided on the main carrier 91 to form a plurality of first dielectric layer 3 and a dielectric portion 14. The formation of the first dielectric layer 3 and a dielectric portion 14 may be similar to those shown in FIG. 22. Each of the first dielectric layers 3 is disposed on respective one of the intermediate panels 8d and contacts the soft releasing film 92. An upper surface (e.g., the first surface 31) of the first dielectric layer 3 is thus substantially coplanar with the lower surface (e.g., the first surface 57) of the circuit structure 5. The dielectric portion 14 is disposed in the gap "g" between two adjacent intermediate panels 8d and on the soft releasing film 92. An upper surface 141 of the dielectric portion 14 is thus substantially coplanar with the lower surface (e.g., the first surface 57) of the circuit structure 5 and/or the upper surface (e.g., the first surface 31) of the first dielectric layer 3.

Then, at least one through hole 30 is formed through each of the first dielectric layers 3 by, for example, lithography or drilling. The through hole 30 exposes a portion of the circuit structure 5, such as the conductive pad 53 of the circuit structure 5. Then, a plurality of redistribution layers 4 are formed on the first dielectric layers 3, and each of the redistribution layers 4 is electrically connected to respective one of the circuit structures 5 of the intermediate panels 8d. The formation of the through hole 30 of the first dielectric layer 3 and the redistribution layer 4 may be similar to those shown in FIG. 23. The redistribution layer 4 is disposed on the second surface 32 of the first dielectric layer 3 and in the through hole 30. The redistribution layer 4 may include at least one conductive via 43 disposed in the through hole 30 of the first dielectric layer 3, and at least one conductive pad 44 disposed on the second surface 32 of the first dielectric layer 3. The redistribution layer 4 is electrically connected to the circuit structure 5 through the conductive via 43.

Then, a protection layer 25 is formed on the first dielectric layers 3 and covers the redistribution layers 4. The formation of the protection layer 25 may be similar to that shown in FIG. 24. The protection layer 25 has a first surface 251 and a second surface 252 opposite to the first surface 251. The first surface 251 contacts the second surface 32 of the first dielectric layer 3. In some embodiments, the protection layer 25 further includes a portion 254 extending into the gap "g" between the intermediate panels 8d and disposed on the dielectric portion 14. The protection layer 25 covers the redistribution layer 4, and at least a portion of the redistribution layer 4, such as the conductive pad 44, is exposed from the protection layer 25 for external connection. Then, at least one solder connector 26 may be formed on the exposed portion of the redistribution layer 4, such as the conductive pad 44 of the redistribution layer 4. The formation of the protection layer 25 and the solder connector 26 may be similar to those shown in FIG. 24.

Then, the main carrier 91, including the soft releasing layer 92, is removed, forming the substrate panel structure 2d shown in FIG. 7. Each of the intermediate panels 8d corresponds to respective one of the sub-panels 2d. In an alternative manufacturing process, the main carrier 91 may be removed before the solder connector 26 is formed, thus forming the structure shown in FIG. 40. The structure shown in FIG. 40 includes sub-panels 2d' similar to the sub-panels 2d shown in FIG. 7, but without the solder connectors 26. The structure shown in FIG. 40 may also be utilized as a substrate panel structure.

Figure 41:
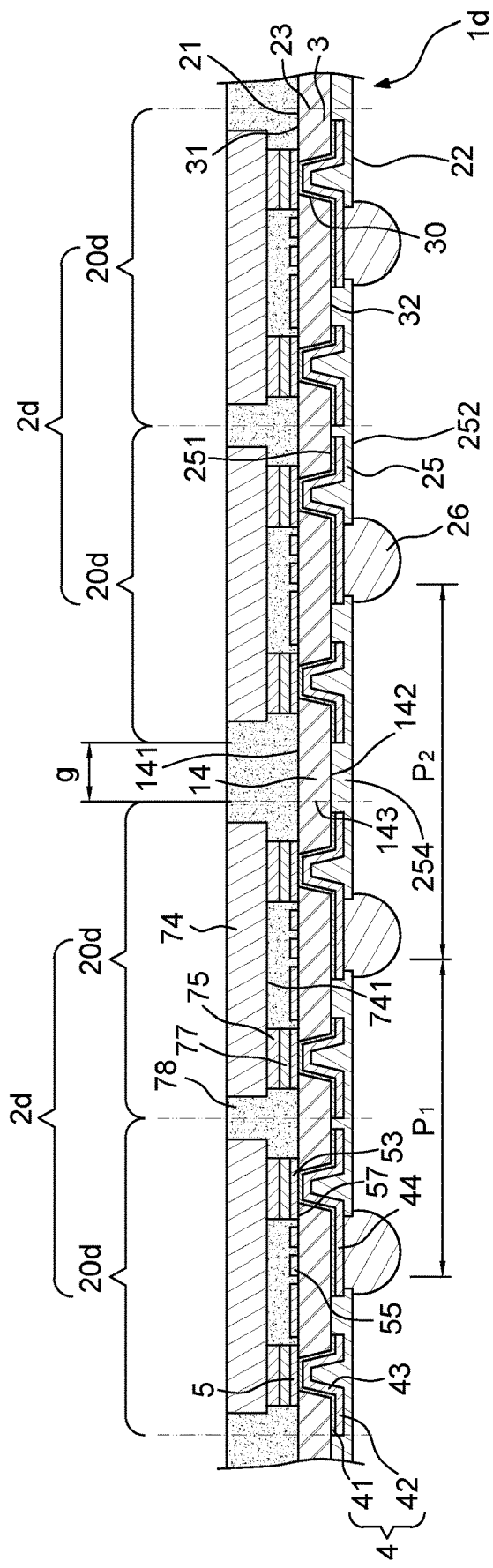
FIG. 41 illustrates one or more stages of an example of a manufacturing process according to some embodiments of the present disclosure.

Referring to FIG. 41, a plurality of semiconductor dice 74 are then connected or mounted to the circuit structure 5 of each of the intermediate panels 8d (e.g., the sub-panels 2d in the substrate panel structure 1d). For example, at least one semiconductor die 74 is connected to each of the substrate units 20d. The semiconductor die 74 may include a bump 75 disposed on a lower surface 741 of the semiconductor die 74. The bump 75 of the semiconductor die 74 is electrically connected to the conductive via 54 of the circuit structure 5 of the substrate unit 20d through a solder material 77 disposed therebetween. The solder material 77 may be made of tin, or another metal or combination of metals. An encapsulant 78 is then formed on and covers each of the first dielectric layers 3 and the dielectric portion 14, and covers the semiconductor dice 74. The encapsulant 78 covers and encapsulates the bump 75, the solder material 77 and a portion of the circuit structure 5. Then, each of the sub-panels 2d is singulated. That is, each of the intermediate panels 8d (e.g., including the circuit structure 5), each of the first dielectric layers 3, each of the redistribution layers 4 and the encapsulant 7 are singulated, forming a plurality of package units, such as the package unit 7d shown in FIG. 14. For example, the edge of each sub-panel 2d may be cut along the lateral surface 23, such that the dielectric portion 14 and the portion 254 of the protection layer 25 are removed during the singulation process.

Similarly, the above stages (e.g., the stages referring to FIG. 41) may also be conducted to the structure shown in FIG. 40 to form the package unit 7d shown in FIG. 14. In some embodiments, the solder connector 26 may be formed after formation of the encapsulant 78.

FIGS. 42 to 48 illustrate a manufacturing process according to some embodiments of the present disclosure. In some embodiments, the manufacturing process is for manufacturing a substrate panel structure such as the substrate panel structure 2f shown in FIG. 9, and/or the package unit such as the package unit 7f shown in FIG. 15.

Figure 42:
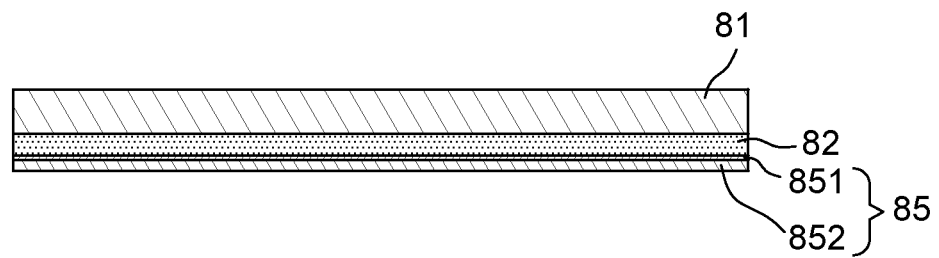
FIG. 42 illustrates one or more stages of an example of a manufacturing process according to some embodiments of the present disclosure.

Referring to FIG. 42, an intermediate carrier 81 is provided. The intermediate carrier 81 may include a releasing film 82 disposed thereon. A metal layer 85 is formed or disposed on the intermediate carrier 81. As shown in FIG.

42, the metal layer 85 may include a seed layer 851 and a conductive layer 852 sequentially disposed on the releasing film 82 of the intermediate carrier 81. For example, the seed layer 851 may be formed by sputtering, and the conductive layer 852 may be formed by plating. A material of the seed layer 851 may be, for example, titanium or copper. In some embodiments, the seed layer 851 may include a titanium layer and a copper layer. A material of the conductive layer 852 may be, for example, a conductive metal, such as copper, or another metal or combination of metals. However, in other embodiments the metal layer 85 may be a metal foil pressed and attached to the releasing film 82.

Figure 43:
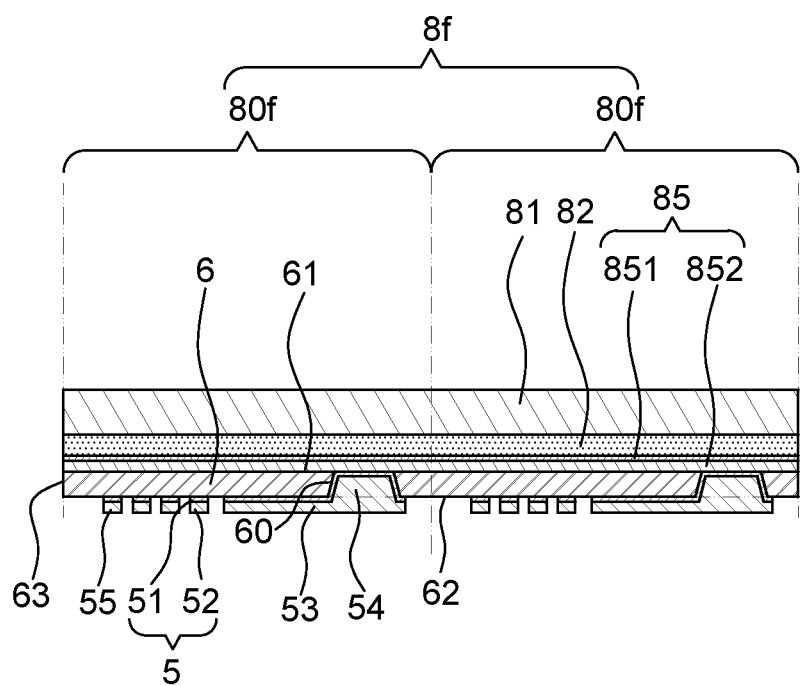
FIG. 43 illustrates one or more stages of an example of a manufacturing process according to some embodiments of the present disclosure.

Referring to FIG. 43, a second dielectric layer 6 is formed on the metal layer 85, such as formed on the conductive layer 852 of the metal layer 85. The second dielectric layer 6 has a first surface 61, a second surface 62 opposite to the first surface 61, and a lateral surface 63 extending between the first surface 61 and the second surface 62. The first surface 61 contacts the conductive layer 852 of the metal layer 85. The second dielectric layer 6 defines at least one through hole 60 extending through the second dielectric layer 6 and between the first surface 61 and the second surface 62 to expose a portion of the conductive layer 852 of the metal layer 85. Then, a circuit structure 5 is formed on the second surface 62 of the second dielectric layer 6 and in the through hole 60 of the second dielectric layer 6. The circuit structure 5 includes a seed layer 51 and a conductive layer 52. The seed layer 51 is disposed between the conductive layer 52 and the second dielectric layer 6, and between the conductive layer 52 and the conductive layer 852 of the metal layer 85 in the through hole 60. A material of the seed layer 51 may be, for example, titanium or copper. In some embodiments, the seed layer 51 may include a titanium layer and a copper layer. A material of the conductive layer 52 may be, for example, a conductive metal, such as copper, or another metal or combination of metals. The circuit structure 5 includes at least one conductive pad 53, at least one conductive via 54 and at least one trace 55. The conductive pad 53, the conductive via 54 and the trace 55 may be formed integrally and concurrently. In some embodiments, the conductive via 54 is disposed on and formed integrally with the conductive pad 53. The conductive via 54 of the circuit structure 5 may be disposed in the through hole 60 of the second dielectric layer 6 to connect the metal layer 85. That is, each of the circuit structures 5 includes at least one conductive via 54 disposed in the through hole 60 of respective one of the second dielectric layers 6. In some embodiments, an L/S of the circuit structure 5 may be equal to or less than 2 μm/2 μm. Accordingly, an intermediate panel 8f is formed. The intermediate panel 8f includes a plurality of panel units 80f connected with each other. Each of the panel units 80f corresponds to a package unit, such as the package unit 7f shown in FIG. 15.

Figure 44:
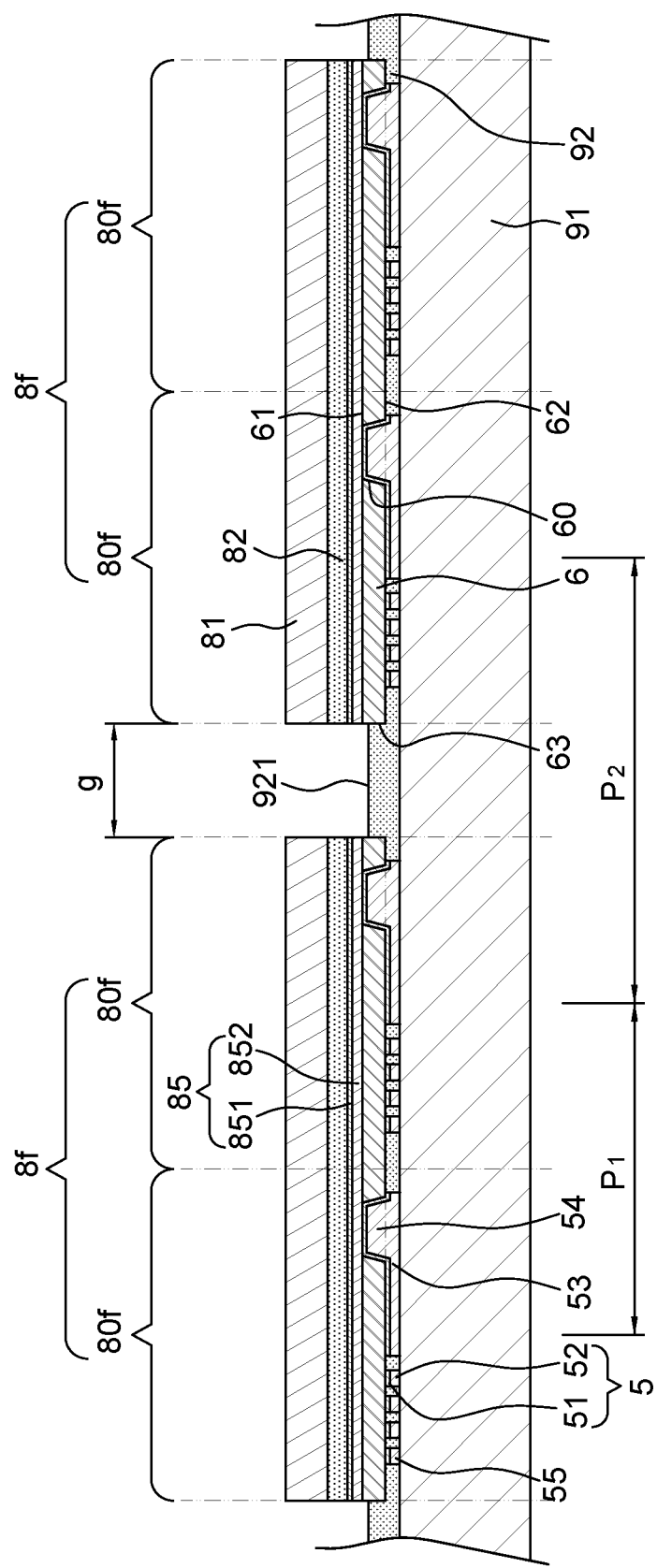
FIG. 44 illustrates one or more stages of an example of a manufacturing process according to some embodiments of the present disclosure.

Referring to FIG. 44, a main carrier 91 is provided. The main carrier 91 includes a soft releasing film 92 disposed thereon. The intermediate panels 8f are disposed on the main carrier 91 and are partially embedded in the soft releasing film 92. The circuit structures 5 of the intermediate panels 8f are located between the main carrier 91 and the intermediate carriers 81. The circuit structure 5 and the second dielectric layer 6 are embedded in the soft releasing film 92. An upper surface 921 of the soft releasing film 92 is at a level lower than the upper surface (e.g., the first surface 61) of the second dielectric layer 6, while higher than the lower surface (e.g., the second surface 62) of the second dielectric layer 6. The intermediate panels 8f are spaced from each other, and a gap "g" is defined between adjacent two of the intermediate panels 8f. In an alternative manufacturing process, the soft releasing film 92 may be replaced by a hard releasing film 92a and a resin material 93, such as those shown in FIG. 27.

Figure 45:
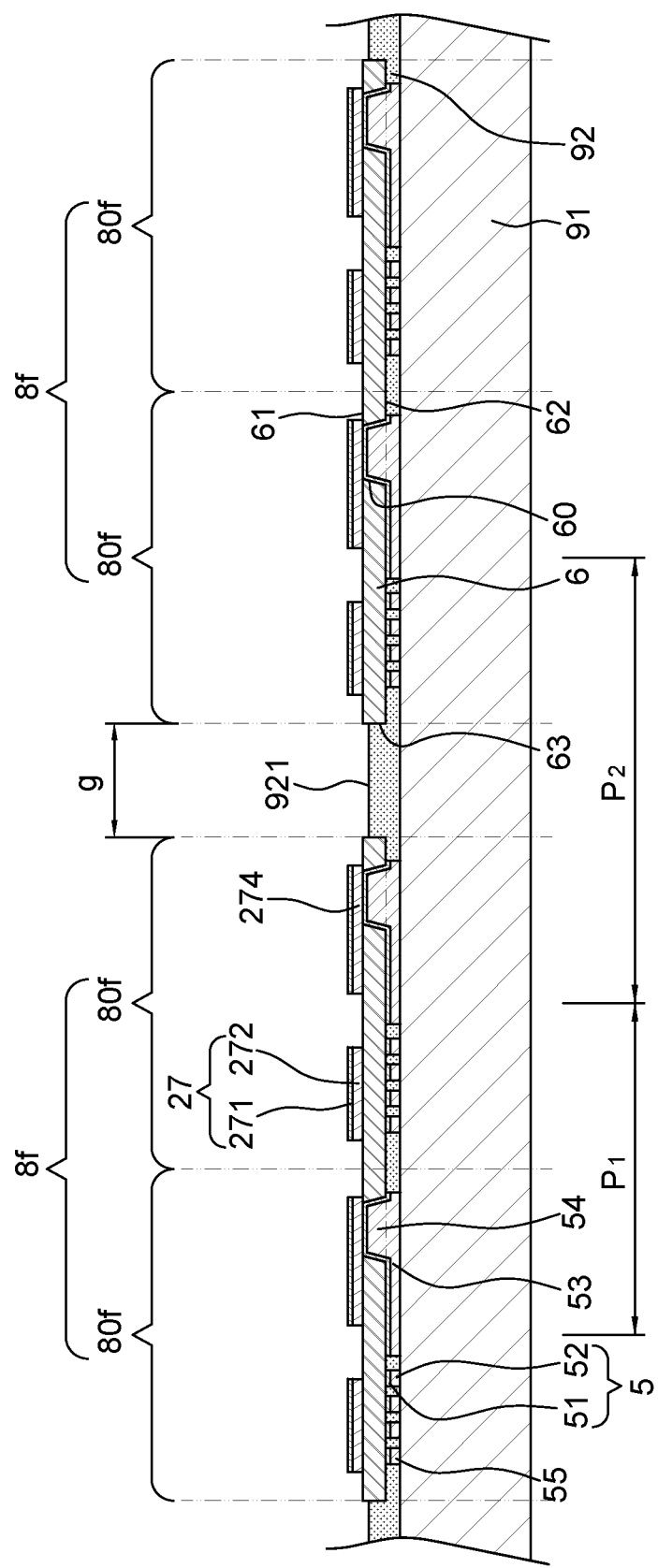
FIG. 45 illustrates one or more stages of an example of a manufacturing process according to some embodiments of the present disclosure.

Referring to FIG. 45, the intermediate carriers 81, including the releasing films 82, are removed, such that the metal layer 85 is exposed. Then, the metal layer 85 is pattern to form a circuit layer 27 on the first surface 61 of the second dielectric layer 6. The circuit layer 27 may include a seed layer 271 form of the seed layer 851 of the metal layer 85, and a conductive layer 272 formed of the conductive layer 852 of the metal layer 85. The circuit layer 27 may include at least one conductive pad 274, and may further include at least one trace (not shown). The conductive via 54 of the circuit structure 5 contacts and electrically connects the circuit layer 27.

Figure 46:
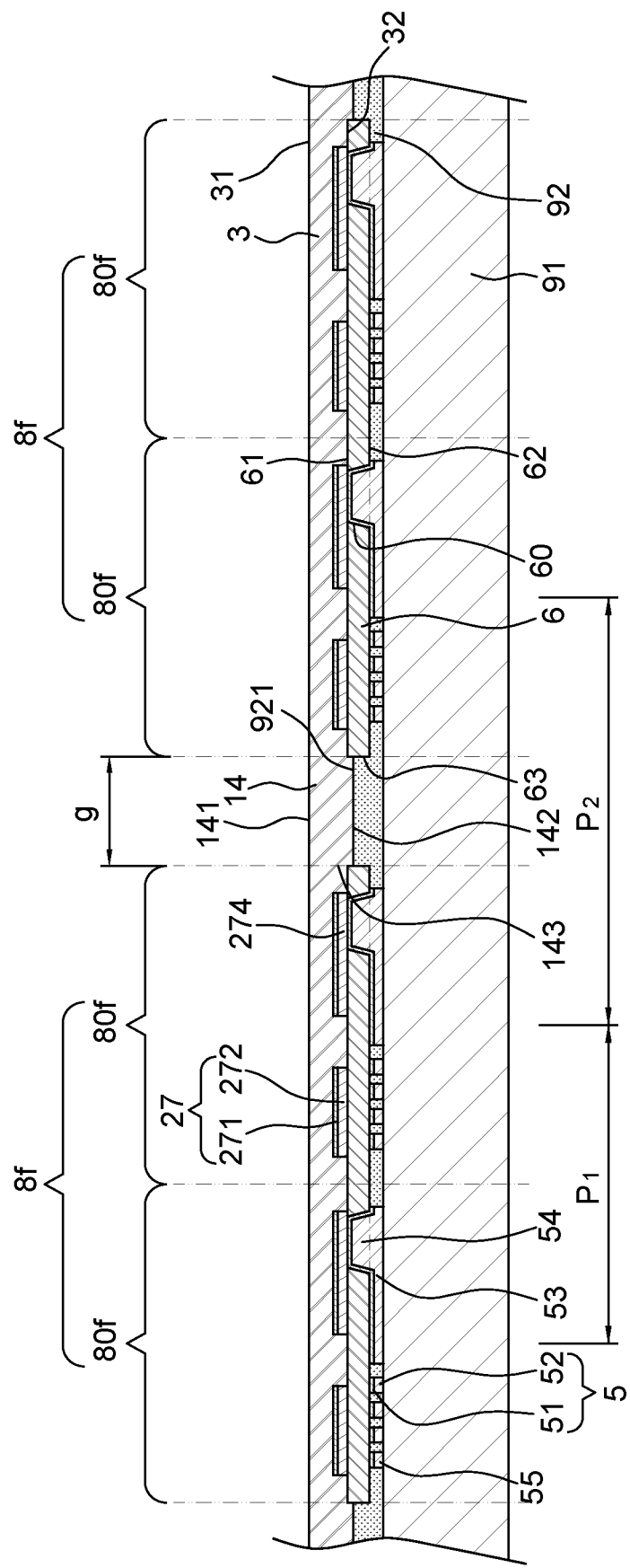
FIG. 46 illustrates one or more stages of an example of a manufacturing process according to some embodiments of the present disclosure.

Referring to FIG. 46, a dielectric material is provided on the main carrier 91 to form a plurality of first dielectric layer 3 and a dielectric portion 14. The dielectric material covers the intermediate panels 8f and the soft releasing film 92. Each of the first dielectric layers 3 is disposed on respective one of the intermediate panels 8f. The dielectric portion 14 is disposed in the gap "g" between two adjacent intermediate panels 8f and on the soft releasing film 92. The dielectric portion 14 is disposed between and connects the first dielectric layers 3. The first dielectric layers 3 and the dielectric portion 14 are formed concurrently and integrally as a monolithic structure. That is, there is no boundary or interface between the dielectric portion 14 and the first dielectric layers 3. The dielectric material may be an insulating material or a dielectric material, such as, for example, polypropylene (PP). It is noted that the dielectric material may include, or be formed from, a cured photoimageable dielectric (PID) material such as epoxy or polyimide (PI) including photoinitiators. Accordingly, the first dielectric layers 3 and the dielectric portion 14 may be made of an insulating material or a dielectric material, such as, for example, polypropylene (PP), or may include, or be formed from, a cured photoimageable dielectric (PID) material such as epoxy or polyimide (PI) including photoinitiators.

The first dielectric layer 3 includes a first surface 31 and a second surface 32 opposite to the first surface 31. As shown in FIG. 46, the first surface 31 is an upper surface, and the second surface 32 is a lower surface. The first dielectric layer 3 is disposed on the second dielectric layer 6 and covers the circuit layer 27. The lower surface (e.g., the second surface 32) of the first dielectric layer 3 contacts the upper surface (e.g., the first surface 61) of the second dielectric layer 6.

The dielectric portion 14 has an upper surface 141, a lower surface 142 and at least one lateral surface 143 extending between the upper surface 141 and the lower surface 142. The lower surface 142 contacts the upper surface 921 of the soft releasing film 92, thus is at a level lower than the lower surface (e.g., the second surface 32) of the first dielectric layer 37 and the upper surface (e.g., the first surface 61) of the second dielectric layer 6, while higher than the lower surface (e.g., the second surface 62) of the second dielectric layer 6. At least a portion of the lateral surface 143 is an imaginary surface or an imaginary plane. The lateral surface 143 may contact and be substantially coplanar with the lateral surface 63 of the second dielectric layer 6.

Figure 47:
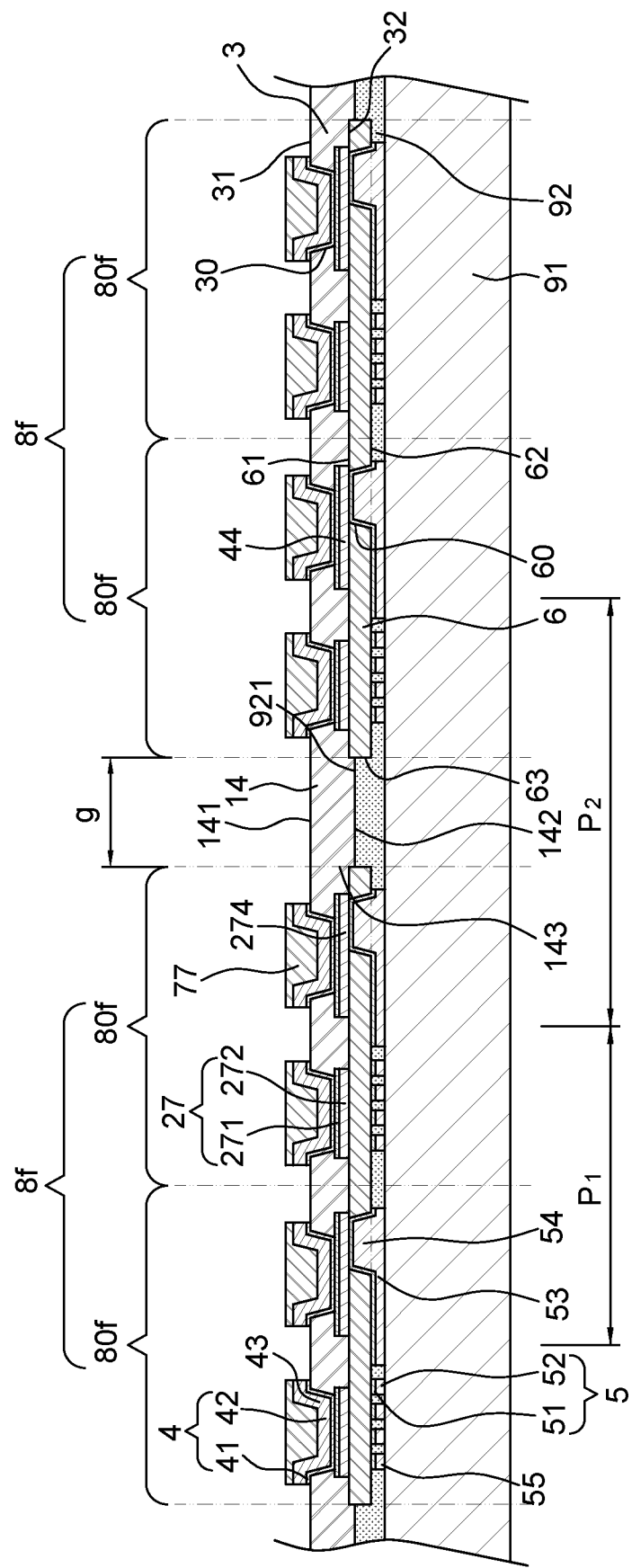
FIG. 47 illustrates one or more stages of an example of a manufacturing process according to some embodiments of the present disclosure.

Referring to FIG. 47, at least one through hole 30 is formed through each of the first dielectric layers 3 by, for example, lithography or drilling. The through hole 30 exposes a portion of the circuit layer 27, such as the conductive pad 274 of the circuit layer 27. Then, a plurality of redistribution layers 4 are formed on the first dielectric layers 3, and each of the redistribution layers 4 is electrically connected to respective one of the circuit structures 5 through respective one of the circuit layers 27 of the intermediate panels 8f The redistribution layer 4 is disposed on the first dielectric layer 3 and in the through hole 30. The redistribution layer 4 may include a seed layer 41 and a conductive layer 42. The seed layer 41 is disposed between the conductive layer 42 and the first dielectric layer 3. A material of the seed layer 41 may be, for example, titanium or copper. In some embodiments, the seed layer 41 may include a titanium layer and a copper layer. A material of the conductive layer 42 may be, for example, a conductive metal, such as copper, or another metal or combination of metals. However, in some embodiments, the seed layer 41 may be omitted. The redistribution layer 4 may include at least one conductive via 43, and may further include at least one trace (not shown). The conductive via 43 is disposed in the through hole 30, and contacts and electrically connects the circuit layer 27. A solder material 77 is formed or disposed on the conductive via 43 of the redistribution layer 4 for external connection. The solder material 77 may be made of tin, or another metal or combination of metals.

Then, the main carrier 91, including the soft releasing layer 92, is removed. A protection layer 25 is formed on the second dielectric layer 6 and covers the circuit structure 5. The protection layer 25 has a first surface 251 and a second surface 252 opposite to the first surface 251. The protection layer 25 exposes a portion of the circuit structure 5, such as the conductive pad 53 of the circuit structure 5 for external connection. The protection layer 25 may include, or be formed from, a cured photoimageable dielectric (PID) material such as epoxy or polyimide (PI) including photoinitiators, or a solder resist layer. At least one solder connectors 26 is then formed on the exposed portion of the circuit structure 5, such as the conductive pad 53 of the circuit structure 5. A material of the solder connector 26 may be a conductive metal, such as tin, or another metal or combination of metals. Accordingly, the substrate panel structure 1f as shown in FIG. 9 is formed. Each of the intermediate panels 8f corresponds to respective one of the sub-panels 2f.

Figure 48:
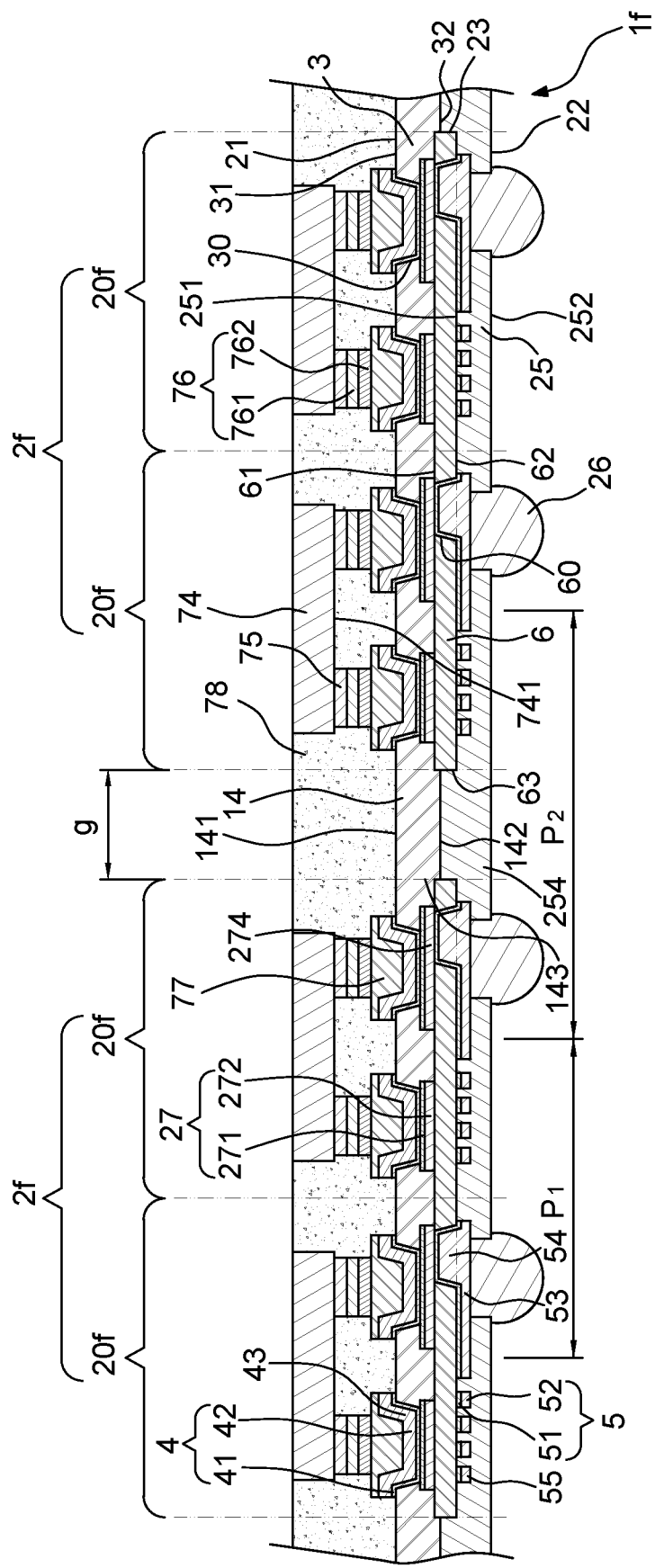
FIG. 48 illustrates one or more stages of an example of a manufacturing process according to some embodiments of the present disclosure.

Referring to FIG. 48, a plurality of semiconductor dice 74 are then connected or mounted to the redistribution layer 4 of each of the intermediate panels 8f (e.g., the sub-panels 2f in the substrate panel structure 1f). For example, at least one semiconductor die 74 is connected to each of the substrate units 20f. The semiconductor die 74 may include a bump 75 disposed on a lower surface 741 of the semiconductor die 74, and an UBM 76 disposed on the bump 75. The UBM 76 may include a first layer 761 and second layer 762 sequentially disposed on the bump 75. For example, a material of the first layer 761 may be nickel, and a material of the second layer 762 may be palladium, but not limited thereto. The UBM 76 of the semiconductor die 74 is connected through the solder material 77 to the redistribution layer 4 of the substrate unit 20f, such as the conductive via 43 of the redistribution layer 4. An encapsulant 78 is then formed on and covers each of the first dielectric layers 3 and the dielectric portion 14, and covers the semiconductor dice 74. For example, the encapsulant 78 is disposed on the first dielectric layer 3 of the substrate unit 20f, and covers and encapsulates the semiconductor die 74, the bump 75 and the UBM 76 of the semiconductor die 74, the solder material 77, and the redistribution layer 4 of the substrate unit 20f The encapsulant 78 may be an underfill or a molding compound. Then, each of the sub-panels 2f is singulated. That is, each of the intermediate panels 8f (e.g., including the circuit layer 27, the second dielectric layer 6 and the circuit structure 5), each of the first dielectric layers 3, each of the redistribution layers 4 and the encapsulant 78 are singulated, forming a plurality of package units, such as the package unit 7f shown in FIG. 15. For example, the edge of each sub-panel 2f may be cut along the lateral surface 23, such that the dielectric portion 14 and the portion 254 of the protection layer 25 are removed during the singulation process.

In an alternative manufacturing process, the main carrier 91 may be removed after the semiconductor dice 74 are connected to the circuit structures 5, and the encapsulant 78 are formed. Then, the protection layer 25 and the solder connector 26 may be formed after the encapsulant 78 is formed and the main carrier 91 is removed.

Figure 49:
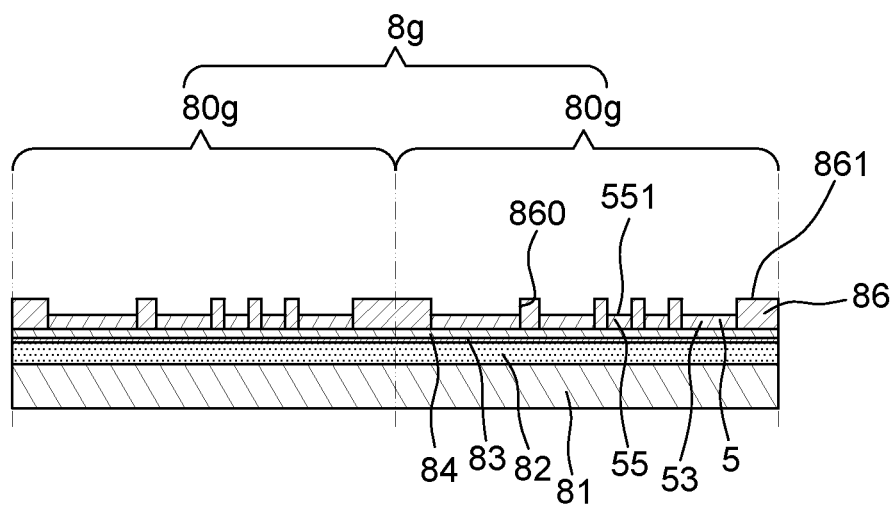
FIG. 49 illustrates one or more stages of an example of a manufacturing process according to some embodiments of the present disclosure.

FIGS. 49 to 54 illustrate a manufacturing process according to some embodiments of the present disclosure. In some embodiments, the manufacturing process is for manufacturing a substrate panel structure such as the substrate panel structure 1g shown in FIG. 10, and/or the package unit such as the package unit 7g shown in FIG. 16. The initial stages of the illustrated process are the same as, or similar to, the stage illustrated in FIG. 19. FIG. 49 depicts a stage subsequent to that depicted in FIG. 19.

Referring to FIG. 49, a patterned photoresist 86 is formed or disposed on the seed layer (e.g., the copper layer 84). The patterned photoresist 86 has an upper surface 861, and defines a plurality of openings 860. Then, a circuit structure 5 is formed in the openings 860 of the patterned photoresist 86 and on the seed layer (e.g., the copper layer 84). A material of the circuit structure 5 may be, for example, a conductive metal, such as copper, or another metal or combination of metals. The circuit structure 5 includes at least one conductive pad 53 and at least one trace 55. The conductive pad 53 and the trace 55 may be formed integrally and concurrently. The trace 55 has an upper surface 551, which is at a level lower than the upper surface 861 of the patterned photoresist 86. In some embodiments, an L/S of the circuit structure 5 may be equal to or less than 2 μm/2 μm. Accordingly, an intermediate panel 8g is formed. The intermediate panel 8g includes a plurality of panel units 80g connected with each other. Each of the panel units 80g corresponds to a package unit, such as the package unit 7g shown in FIG. 16.

Figure 50:
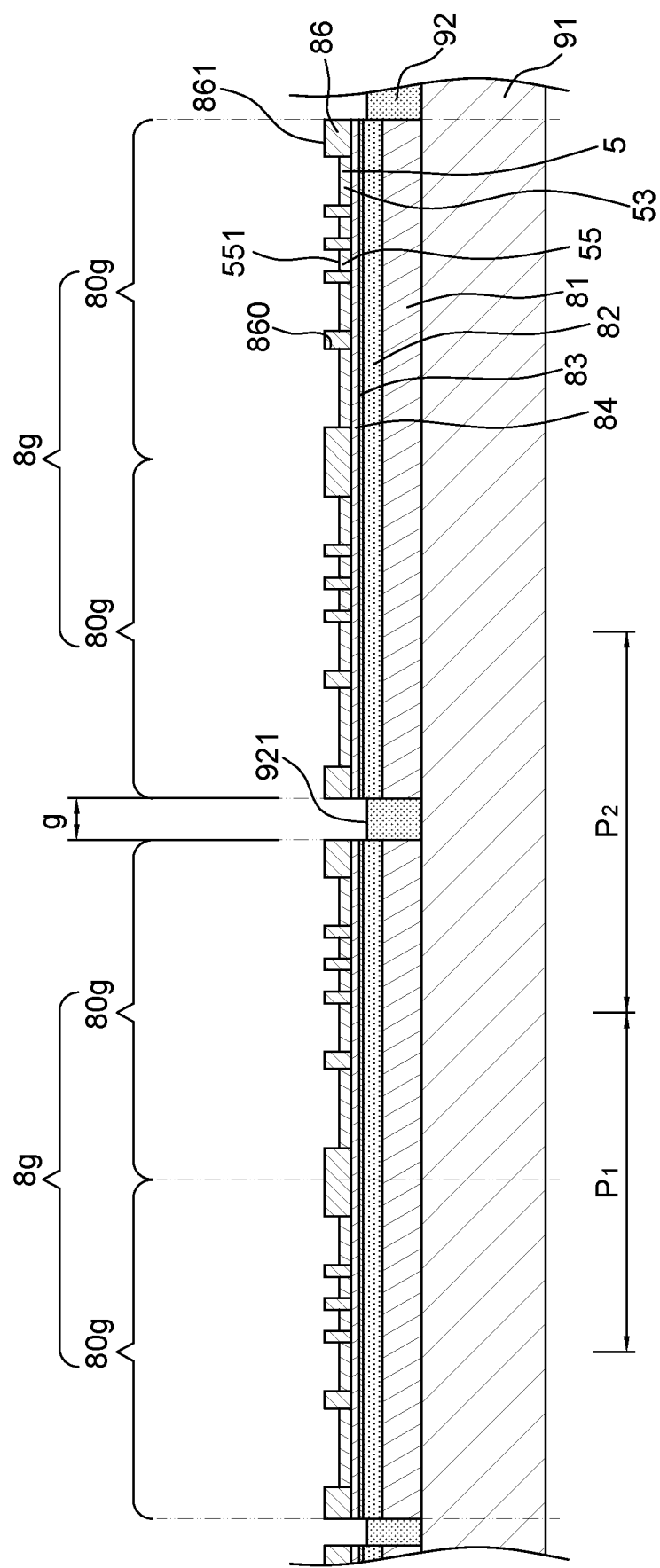
FIG. 50 illustrates one or more stages of an example of a manufacturing process according to some embodiments of the present disclosure.

Referring to FIG. 50, a main carrier 91 is provided. The main carrier 91 includes a soft releasing film 92 disposed thereon. The intermediate panels 8g are disposed on the main carrier 91 and are partially embedded in the soft releasing film 92. As shown in FIG. 50, the intermediate carriers 81 are located between the main carrier 91 and the circuit structures 5. An upper surface 921 of the soft releasing film 92 is at a level lower than the upper surface 86 of the patterned photoresist 86. The intermediate panels 8g are spaced from each other, and a gap "g" is defined between adjacent two of the intermediate panels 8g.

Figure 51:
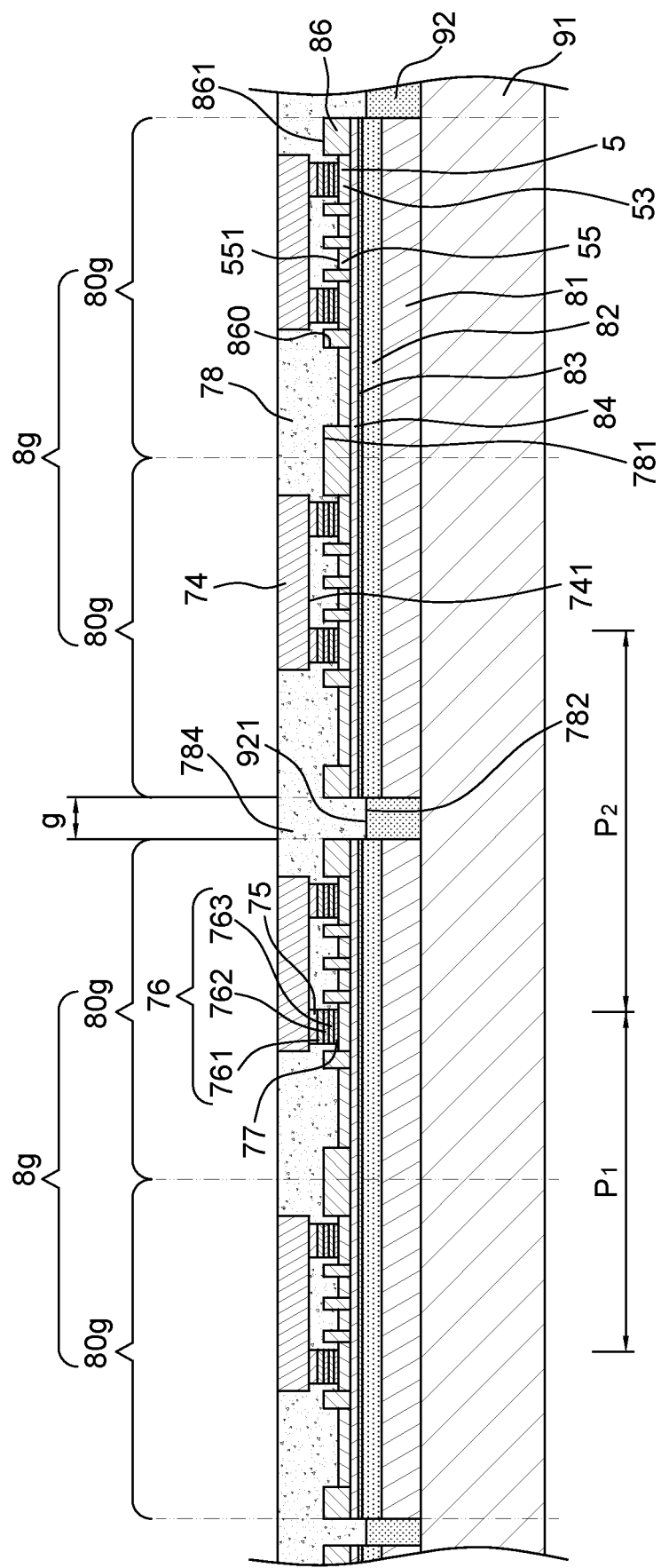
FIG. 51 illustrates one or more stages of an example of a manufacturing process according to some embodiments of the present disclosure.

Referring to FIG. 51, a plurality of semiconductor dice 74 are then connected or mounted to the circuit structure 5 of each of the intermediate panels 8g. For example, at least one semiconductor die 74 is connected to each panel unit 80g. The semiconductor die 74 may include a bump 75 disposed on a lower surface 741 of the semiconductor die 74, and an UBM 76 disposed on the bump 75. A material of the bump 75 may be copper. The UBM 76 may include a first layer 761, a second layer 762 and a third layer 763 sequentially disposed on the bump 75. For example, a material of the first layer 761 may be nickel, a material of the second layer 762 may be palladium, and a material of the third layer 763 may be gold, but not limited thereto. The UBM 76 of the semiconductor die 74 may be electrically connected to the conductive pad 53 of the circuit structure 5 through a solder material 77 disposed therebetween. The solder material 77 may be made of tin, or another metal or combination of metals. An encapsulant 78 is then formed on the patterned photoresist 85, and covers and encapsulates the semiconductor dice 74 on each of the intermediate panels 8*g*. A first lower surface 781 of the encapsulant is substantially coplanar with the upper surface 861 of the patterned photoresist 86. The encapsulant 78 may further include a portion 784 disposed in the gap "g" between the intermediate panels 8*g* and contacts the upper surface 921 of the soft releasing film 92. A second lower surface 782 of the portion 784 in the gap "g" is substantially coplanar with the upper surface 921 of the soft releasing film 92. The second lower surface 782 is at a level lower than the first lower surface 781. The encapsulant 78 may be a molding compound.

Figure 52:
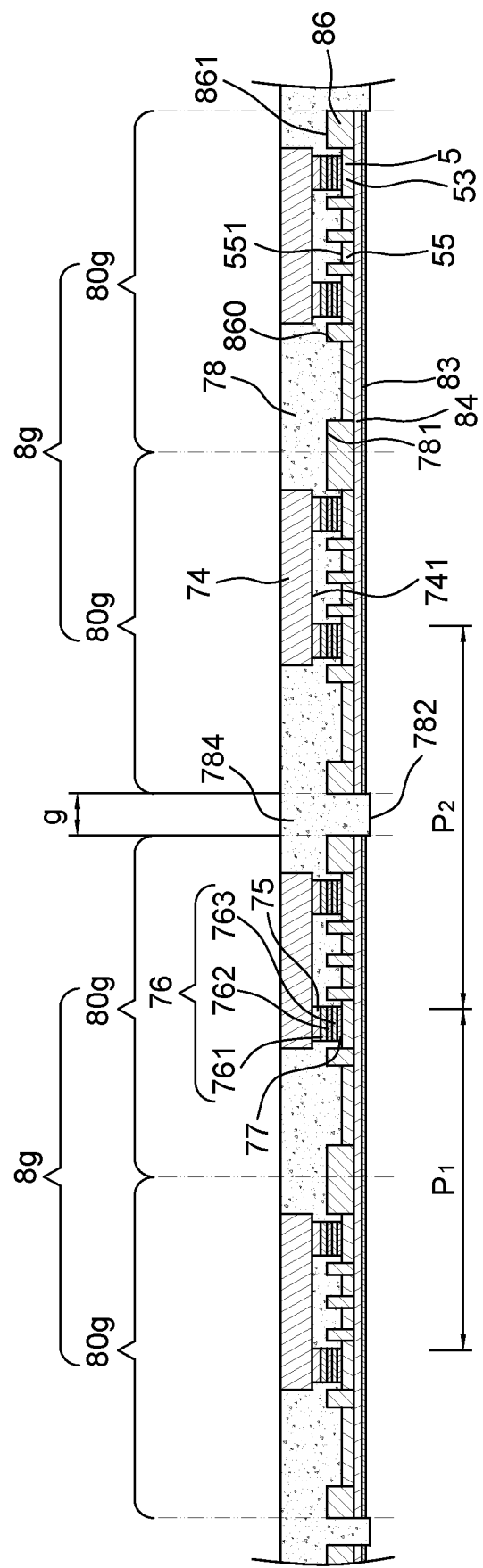
FIG. 52 illustrates one or more stages of an example of a manufacturing process according to some embodiments of the present disclosure.

Referring to FIG. 52, the main carrier 91, including the soft releasing layer 92, is removed. Then, the intermediate carriers 81, including the releasing films 82, are removed, such that the seed layer (e.g., the titanium layer 83) and the second lower surface 782 of the encapsulant 78 are exposed.

Figure 53:
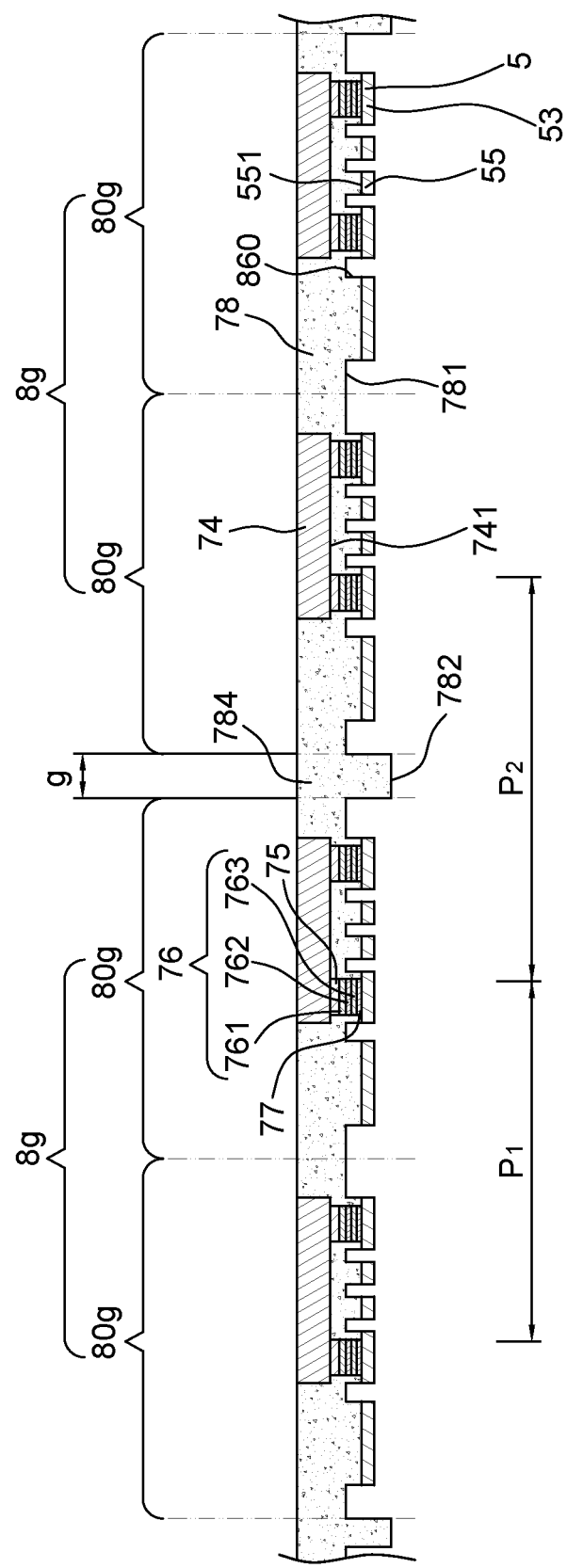
FIG. 53 illustrates one or more stages of an example of a manufacturing process according to some embodiments of the present disclosure.

Referring to FIG. 53, the seed layer (e.g., the titanium layer 83 and the copper layer 84) is removed by, for example, etching. Then, the patterned photoresist 86 is removed by, for example, stripping. The first lower surface 781 of the encapsulant 78 and the circuit structure 5 are thus exposed.

Figure 54:
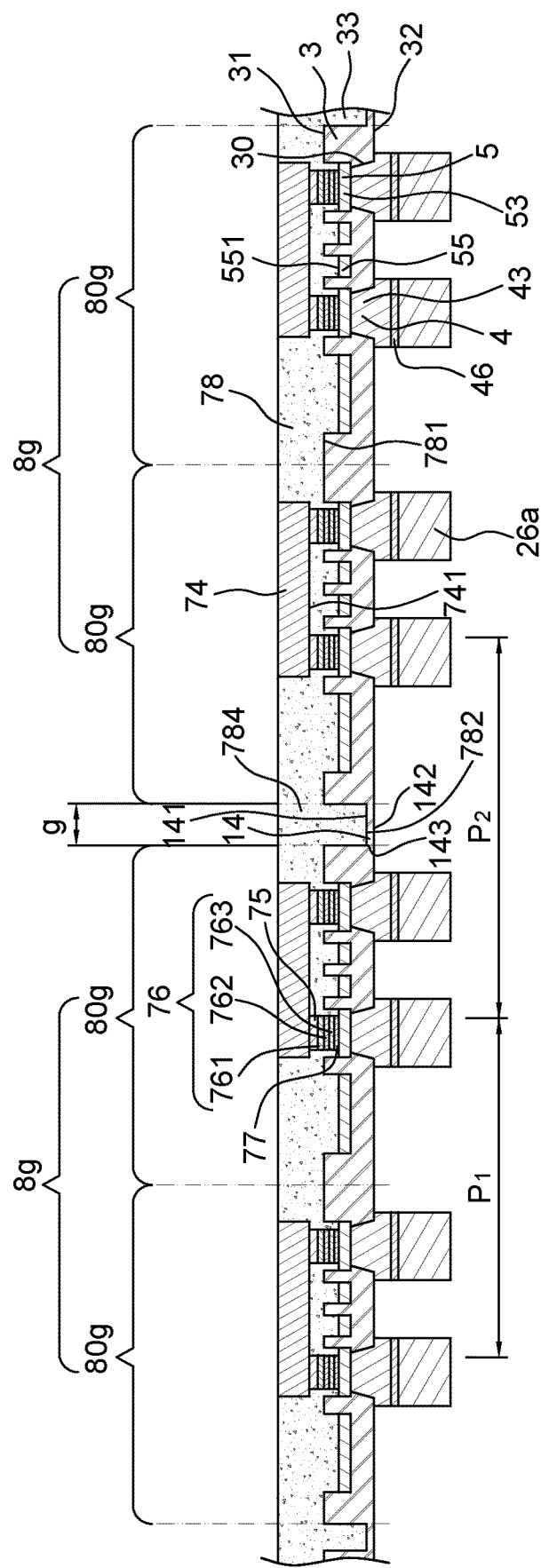
FIG. 54 illustrates one or more stages of an example of a manufacturing process according to some embodiments of the present disclosure.

Referring to FIG. 54, a dielectric material is provided on the encapsulant 78 and the intermediate panels 8*g* (e.g., the circuit structure 5) to form a plurality of first dielectric layer 3 and a dielectric portion 14. The dielectric material covers the intermediate panels 8*g* (e.g., the circuit structure 5). Each of the first dielectric layers 3 corresponds to respective one of the intermediate panels 8*g*. The dielectric portion 14 is disposed in the gap "g" between two adjacent intermediate panels 8 and on the portion 784 of the encapsulant 78 in the gap "g". The dielectric portion 14 is disposed between and connects the first dielectric layers 3. The first dielectric layers 3 and the dielectric portion 14 are formed concurrently and integrally as a monolithic structure. That is, there is no boundary or interface between the dielectric portion 14 and the first dielectric layers 3. The dielectric material may be an insulating material or a dielectric material, such as, for example, polypropylene (PP). It is noted that the dielectric material may include, or be formed from, a cured photoimageable dielectric (PID) material such as epoxy or polyimide (PI) including photoinitiators. Accordingly, the first dielectric layers 3 and the dielectric portion 14 may be made of an insulating material or a dielectric material, such as, for example, polypropylene (PP), or may include, or be formed from, a cured photoimageable dielectric (PID) material such as epoxy or polyimide (PI) including photoinitiators.

The first dielectric layer 3 includes a first surface 31, a second surface 32 opposite to the first surface 31, and a lateral surface 33 extending between the first surface 31 and the second surface 32. As shown in FIG. 54, the first surface 31 is an upper surface, and the second surface 32 is a lower surface. The upper surface (e.g., the first surface 31) of the first dielectric layer 3 contacts and is substantially coplanar with the first lower surface 781 of the encapsulant 78, thus is at a level higher than the upper surface 551 of the trace 55 of the circuit structure 5. The lateral surface 33 contacts the portion 784 of the encapsulant 78.

The dielectric portion 14 has an upper surface 141, a lower surface 142 and at least one lateral surface 143 extending between the upper surface 141 and the lower surface 142. At least a portion of the lateral surface 143 is an imaginary surface or an imaginary plane. The upper surface 141 of the dielectric portion 14 contacts and is substantially coplanar with the second lower surface 782 of the portion 784 of the encapsulant 78, thus is at a level lower than the upper surface (e.g., the first surface 31) of the first dielectric layer 3. The lower surface 142 of the dielectric portion 14 is substantially coplanar with the lower surface (e.g., the second surface 32) of the first dielectric layer 3.

Then, at least one through hole 30 is form through the first dielectric layer 3, such that a portion of the circuit structure 5, such as the conductive pad 53 of the circuit structure 5, is exposed in the through hole 30 and from the second surface 32 of the dielectric layer 3. A redistribution layer 4 is then formed electrically connected to the circuit structure 5. For example, the redistribution layer 4 includes at least one conductive via 43 disposed in the through hole 30 of the first dielectric layer 3 and embedded in the first dielectric layer 3. The conductive via 43 extends through the first dielectric layer 3 to contact and electrically connect the circuit structure 5, such as the conductive pad 53 of the circuit structure 5. In some embodiments, the redistribution layer 4 may further include at least one trace (not shown). A material of the redistribution layer 4 may be, for example, a conductive metal, such as copper, or another metal or combination of metals. In some embodiments, a line width/line space (L/S) of the redistribution layer 4 may be equal to or greater than 10 μm/10 μm.

Then, at least one solder material 26*a* is formed or disposed on and electrically connected to the conductive via 43 of the redistribution layer 4. The solder material 26 may be a conductive metal, such as tin, or another metal or combination of metals. An UBM 46 may be disposed between the conductive via 43 and the solder connector 26. A reflow process may then be conducted to form the solder material 26*a* into a solder connector 26, thus forming the substrate panel structure 1*g* shown in FIG. 10. Each of the intermediate panels 8*g* corresponds to respective one of the sub-panels 2*g*. Then, each of the sub-panels 2*g* is singulated. That is, each of the intermediate panels 8*g* (e.g., the circuit structure 5), each of the first dielectric layers 3, each of the redistribution layers 4 and the encapsulant 78 are singulated, forming a plurality of package units, such as the package unit 7*g* shown in FIG. 16. For example, the edge of each sub-panel 2*g* may be cut along the lateral surface 23, such that the dielectric portion 14 and the portion 784 of the encapsulant 78 in the gap "g" are removed during the singulation process.

Figure 55:
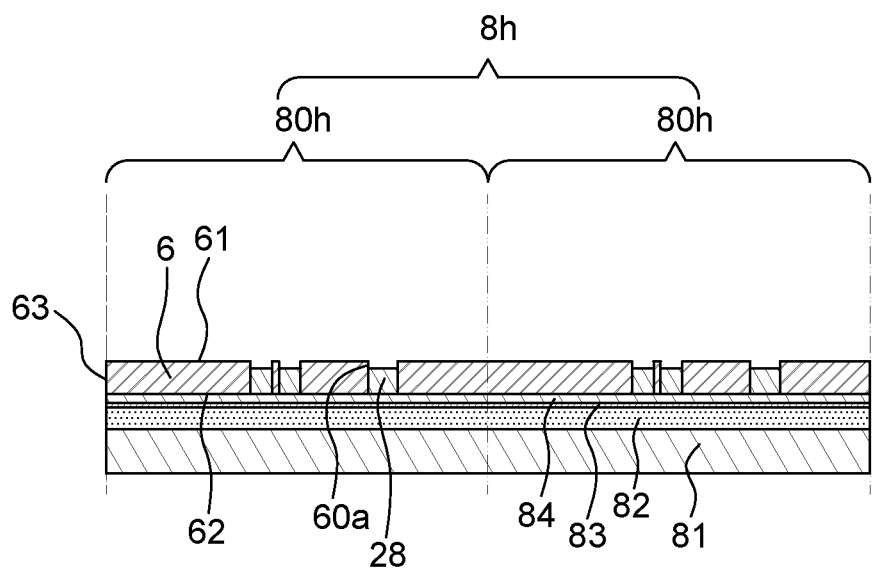
FIG. 55 illustrates one or more stages of an example of a manufacturing process according to some embodiments of the present disclosure.

FIGS. 55 to 60 illustrate a manufacturing process according to some embodiments of the present disclosure. In some embodiments, the manufacturing process is for manufacturing a substrate panel structure such as the substrate panel structure 1*h* shown in FIG. 11, and/or the package unit such as the package unit 7*h* shown in FIG. 17. The initial stages of the illustrated process are the same as, or similar to, the stage illustrated in FIG. 19. FIG. 55 depicts a stage subsequent to that depicted in FIG. 19.

Referring to FIG. 55, a second dielectric layer 6 is formed on the seed layer (e.g., the copper layer 84). The second dielectric layer 6 has a first surface 61, a second surface 62 opposite to the first surface 61, and a lateral surface 63 extending between the first surface 61 and the second surface 62. As shown in FIG. 55, the first surface 61 is an upper surface, and the second surface 62 is a lower surface. The second surface 62 contacts the seed layer (e.g., the copper layer 84). The second dielectric layer 6 may be made of an insulating material or a dielectric material, such as, for example, polypropylene (PP). It is noted that the second dielectric layer 6 may include, or be formed from, a cured photoimageable dielectric (PID) material such as epoxy or polyimide (PI) including photoinitiators. Then, a plurality of through holes 60a is formed extending through the second dielectric layer 6 and between the first surface 61 and the second surface 62. A plurality of conductive pillars 28 are then formed in the through holes 60a of the second dielectric layer 6 by, for example, plating. A material of the conductive pillars 28 may be, for example, a conductive metal, such as copper, or another metal or combination of metals. Accordingly, an intermediate panel 8h is formed. The intermediate panel 8h includes a plurality of panel units 80h connected with each other. Each of the panel units 80h corresponds to a package unit, such as the package unit 7h shown in FIG. 17.

Figure 56:
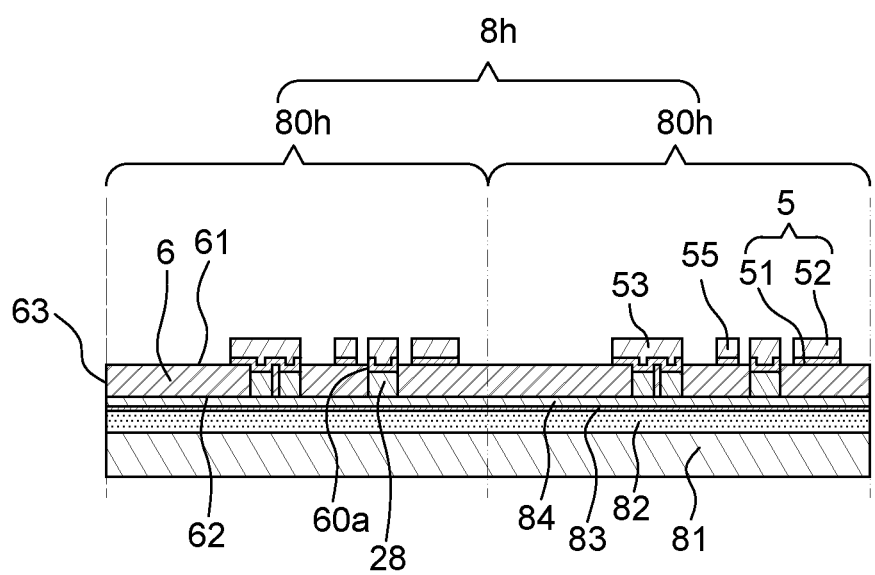
FIG. 56 illustrates one or more stages of an example of a manufacturing process according to some embodiments of the present disclosure.

Referring to FIG. 56, a circuit structure 5 is formed adjacent to the first surface 61 of the second dielectric layer 6 and electrically connected to the conductive pillars 28. For example, as shown in FIG. 56, the circuit structure 5 is disposed on the first surface 61 of the second dielectric layer 6, and portions of the circuit structure 5 may extend into the through holes 60a to contact the conductive pillars 28. The circuit structure 5 may include a seed layer 51 and a conductive layer 52. The seed layer 51 is disposed between the conductive layer 52 and the second dielectric layer 6, and between the conductive layer 52 and the conductive pillars 28. A material of the seed layer 51 may be, for example, titanium or copper. In some embodiments, the seed layer 51 may include a titanium layer and a copper layer. A material of the conductive layer 52 may be, for example, a conductive metal, such as copper, or another metal or combination of metals. The circuit structure 5 includes at least one conductive pad 53 and at least one trace 55. The conductive pad 53 and the trace 55 are formed integrally and concurrently. In some embodiments, an L/S of the circuit structure 5 may be equal to or less than 2 µm/2 µm. Forming the circuit layer 5 may include forming a pattern photoresist on the second dielectric layer 6, and forming the circuit layer 5 in the pattern photoresist and on the second dielectric layer 6. It is noted that the pattern photoresist may be removed in the stage shown in FIG. 56, or may alternatively be removed after the intermediate panel 8h is disposed on a main carrier, such as the stage shown in FIG. 57.

Figure 57:
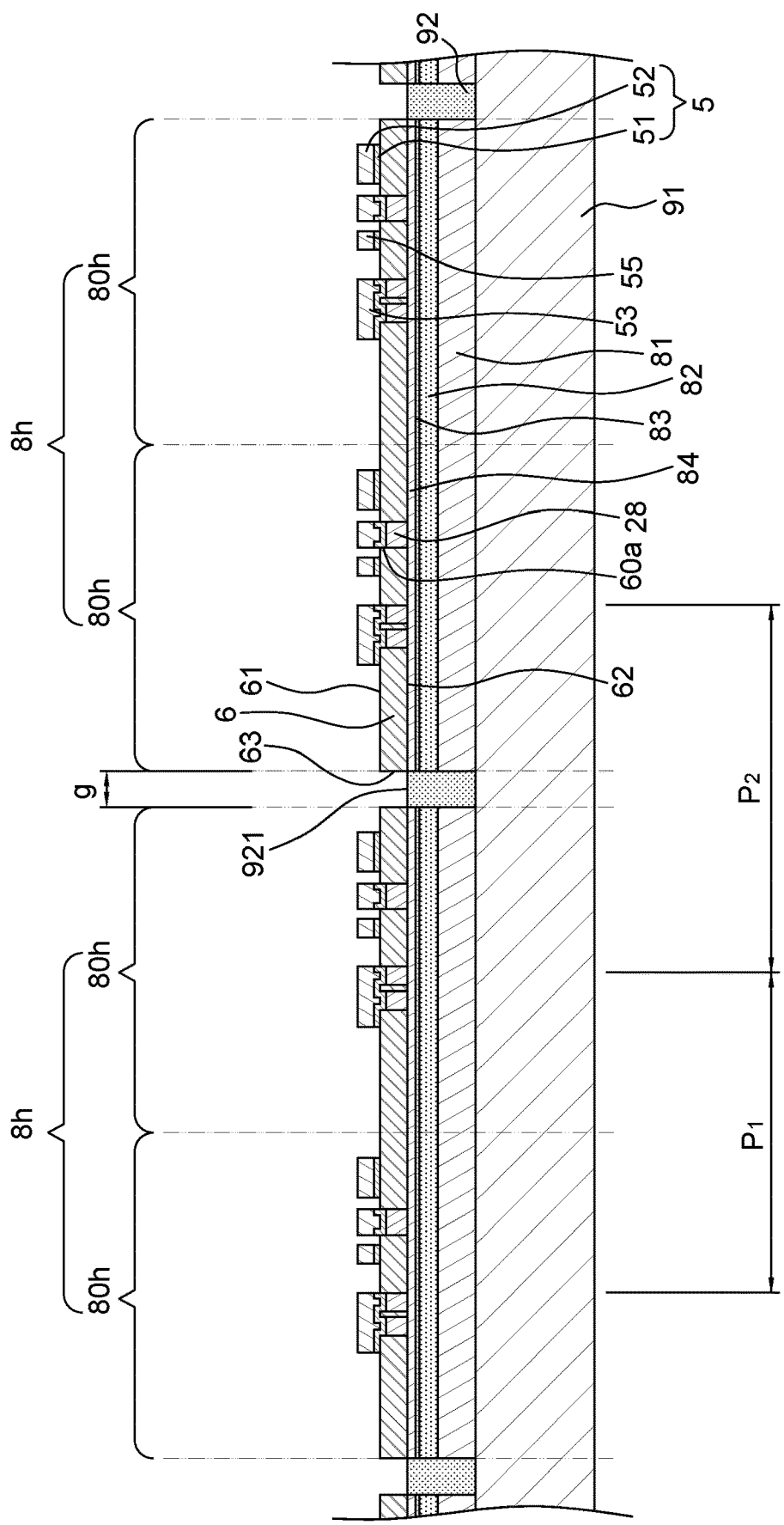
FIG. 57 illustrates one or more stages of an example of a manufacturing process according to some embodiments of the present disclosure.

Referring to FIG. 57, a main carrier 91 is provided. The main carrier 91 includes a soft releasing film 92 disposed thereon. The intermediate panels 8h are disposed on the main carrier 91 and are partially embedded in the soft releasing film 92. The intermediate carriers 81 are located between the main carrier 91 and the circuit structures 5. An upper surface 921 of the soft releasing film 92 is substantially coplanar with the lower surface (e.g., the second surface 62) of the second dielectric layer 6. The intermediate panels 8h are spaced from each other, and a gap "g" is defined between adjacent two of the intermediate panels 8h.

Figure 58:
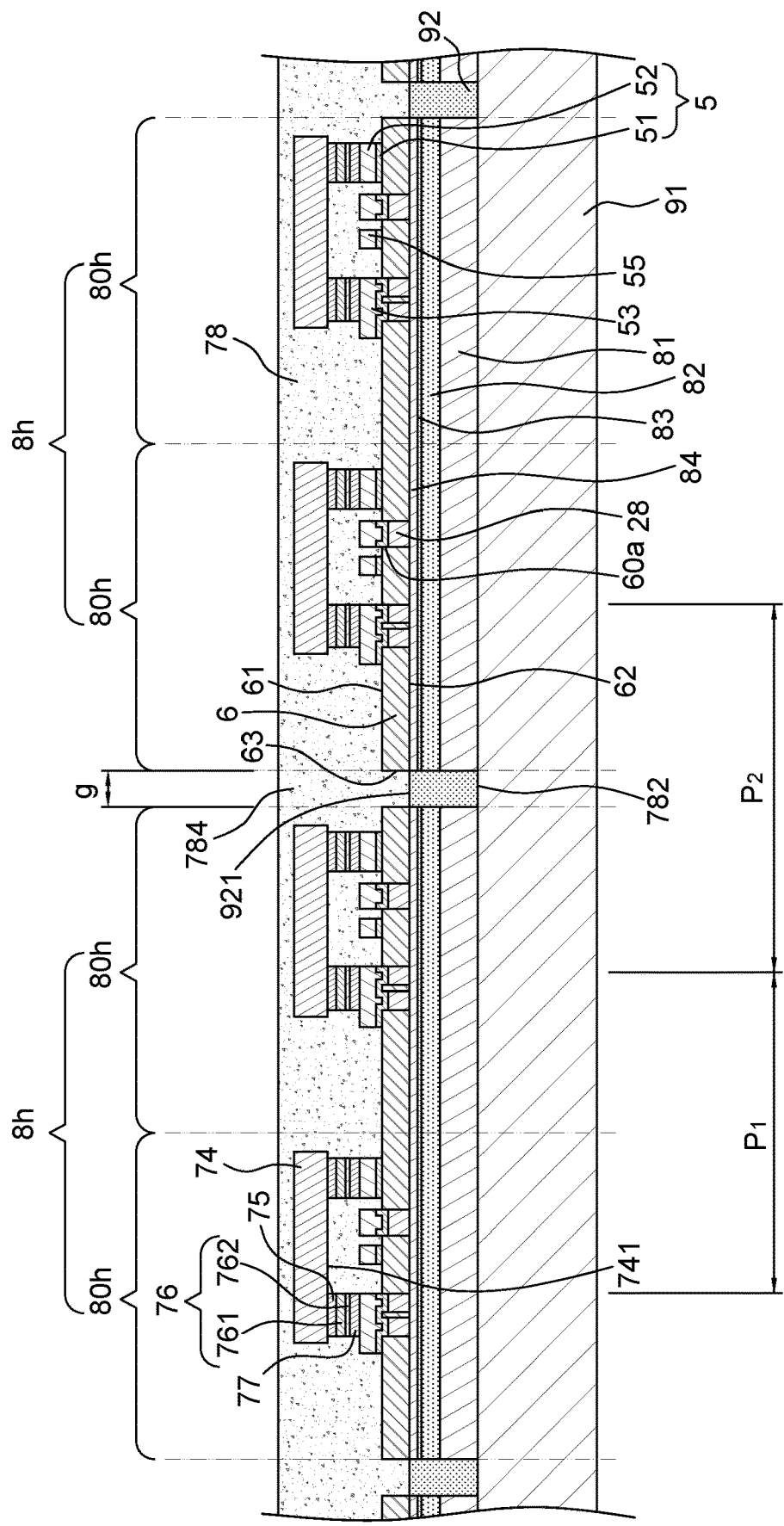
FIG. 58 illustrates one or more stages of an example of a manufacturing process according to some embodiments of the present disclosure.

Referring to FIG. 58, a plurality of semiconductor dice 74 are then connected or mounted to the circuit structure 5 of each of the intermediate panels 8h. For example, at least one semiconductor die 74 is connected to each panel unit 80h. The semiconductor die 74 may include a bump 75 disposed on a lower surface 741 of the semiconductor die 74, and an UBM 76 disposed on the bump 75. A material of the bump 75 may be copper. The UBM 76 may include a first layer 761 and second layer 762 sequentially disposed on the bump 75. For example, a material of the first layer 761 may be nickel, and a material of the second layer 762 may be palladium, but not limited thereto. The UBM 76 of the semiconductor die 74 may be electrically connected to the conductive pad 53 of the circuit structure 5 through a solder material 77 disposed therebetween. The solder material 77 may be made of tin, or another metal or combination of metals.

An encapsulant 78 is then formed on the second dielectric layer 6, and covers and encapsulates the semiconductor dice 74 on each of the intermediate panels 8h. The encapsulant 78 includes a portion 784 disposed in the gap "g" between two adjacent sub-panels 2h and on the soft releasing film 92. A lower surface 782 of the portion 784 of the encapsulant 78 contacts and is substantially coplanar with the upper surface 921 of the soft releasing film 92, thus is also substantially coplanar with the lower surface (e.g., the second surface 62) of the second dielectric layer 6. The encapsulant 78 may contact and cover the lateral surface 63 of the second dielectric layer 6. The encapsulant 78 may be a molding compound.

Figure 59:
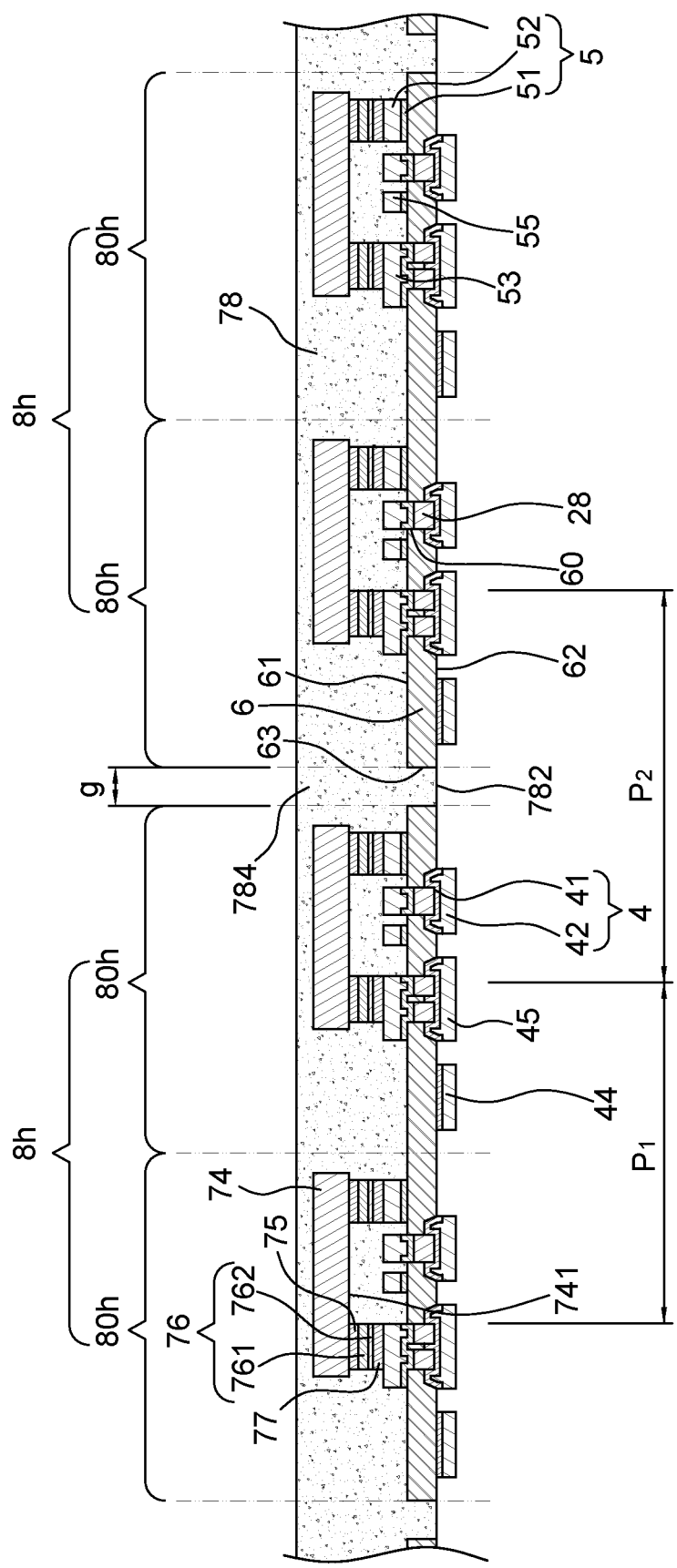
FIG. 59 illustrates one or more stages of an example of a manufacturing process according to some embodiments of the present disclosure.

Referring to FIG. 59, the main carrier 91, including the soft releasing layer 92, is removed, such that the surface 782 of the portion 784 of the encapsulant 78 is exposed. Then, the intermediate carriers 81, including the releasing films 82, are removed, such that the seed layer (e.g., the titanium layer 83) is exposed. Then, the seed layer (e.g., the titanium layer 83 and the copper layer 84) are removed by, for example, etching. A laser drilling process may be conducted to enlarge a portion of the through hole 60a, forming the shape of the through hole 60 as shown in FIG. 59. A redistribution layer 4 is then formed adjacent to the second surface 62 of the second dielectric layer 6. For example, as shown in FIG. 59, the redistribution layer 4 is disposed on the second surface 62 of the second dielectric layer 6, and portions of the redistribution layer 4 may extend into the through holes 60 to contact the conductive pillars 28. The redistribution layer 4 is electrically connected to the circuit structure 5 through the conductive pillars 28. The redistribution layer 4 may include a seed layer 41 and a conductive layer 42. The seed layer 41 is disposed between the conductive layer 42 and the second dielectric layer 6, and between the conductive layer 42 and the conductive pillars 28. A material of the seed layer 41 may be, for example, titanium or copper. In some embodiments, the seed layer 41 may include a titanium layer and a copper layer. A material of the conductive layer 42 may be, for example, a conductive metal, such as copper, or another metal or combination of metals. The redistribution layer 4 may include at least one conductive pad 44 and at least one trace 45. In some embodiments, a line width/line space (L/S) of the redistribution layer 4 may be equal to or greater than 10 µm/10 µm.

Figure 60:
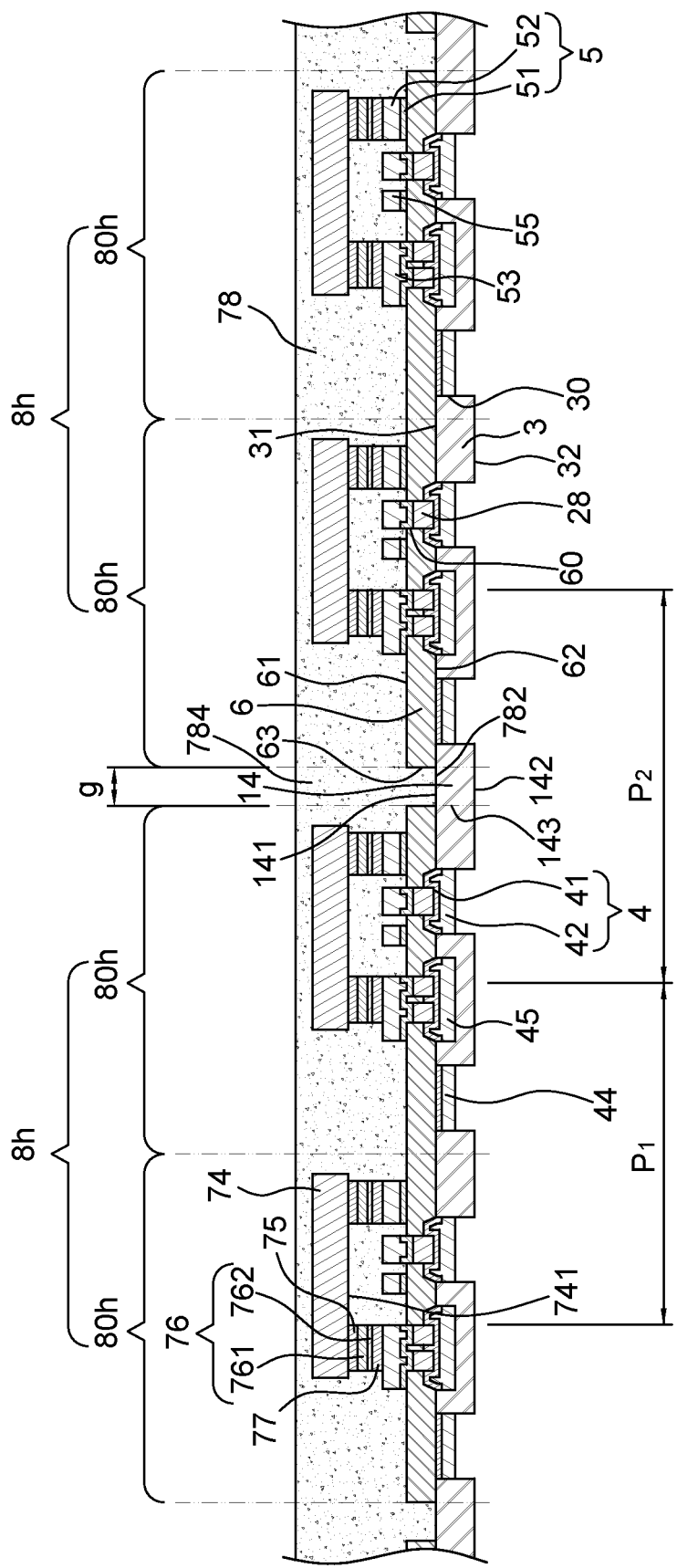
FIG. 60 illustrates one or more stages of an example of a manufacturing process according to some embodiments of the present disclosure.

Referring to FIG. 60, a dielectric material is provided on the encapsulant 78 and the intermediate panels 8h (e.g., the second dielectric layers 6) to form a plurality of first dielectric layer 3 and a dielectric portion 14. The dielectric material covers the redistribution layer 4. Each of the first dielectric layers 3 is disposed on respective one of the intermediate panels 8h. The dielectric portion 14 is disposed in the gap "g" between two adjacent intermediate panels 8h and on the portion 784 of the encapsulant 4. The dielectric portion 14 is disposed between and connects the first dielectric layers 3. The first dielectric layers 3 and the dielectric portion 14 are formed concurrently and integrally as a monolithic structure. That is, there is no boundary or interface between the dielectric portion 14 and the first dielectric layers 3. The dielectric material may be an insulating material or a dielectric material, such as, for example, polypropylene (PP). It is noted that the dielectric material may include, or be formed from, a cured photoimageable dielectric (PID) material such as epoxy or polyimide (PI) including photoinitiators. Accordingly, the first dielectric layers 3 and the dielectric portion 14 may be made of an insulating material or a dielectric material, such as, for example, polypropylene (PP), or may include, or be formed from, a cured photoimageable dielectric (PID) material such as epoxy or polyimide (PI) including photoinitiators.

The first dielectric layer 3 includes a first surface 31 and a second surface 32 opposite to the first surface 31. As shown in FIG. 60, the first surface 31 is an upper surface, and the second surface 32 is a lower surface. The upper surface (e.g., the first surface 31) of the first dielectric layer 3 contacts the lower surface (e.g., the second surface 62) of the second dielectric layer 6.

The dielectric portion 14 has an upper surface 141, a lower surface 142 and at least one lateral surface 143 extending between the upper surface 141 and the lower surface 142. The upper surface 141 contacts the surface 782 of the portion 784 of the encapsulant 78, thus is substantially coplanar with the lower surface (e.g., the second surface 62) of the second dielectric layer 6 and/or the upper surface (e.g., the first surface 31) of the dielectric layer 3. At least a portion of the lateral surface 143 is an imaginary surface or an imaginary plane. The lateral surface 143 may be substantially coplanar with the lateral surface 63 of the second dielectric layer 6.

Then, at least one through hole 30 is formed extending through the first dielectric layer 3 to expose at least a portion of the redistribution layer 4, such as the conductive pad 44 of the redistribution layer 4. At least one solder connector 26 is formed in the through hole 30 of the first dielectric layer 3, and is on and electrically connected to the exposed portion of the redistribution layer 4, such as the conductive pad 44. A material of the solder connector 26 may be a conductive metal, such as tin, or another metal or combination of metals. A barrier layer 47 and a wetting layer 48 may be disposed between the conductive pad 44 and the solder connector 26. A material of the barrier layer 47 may be nickel, and a material of the wetting layer may be gold. Accordingly, the substrate panel 1*h* shown in FIG. 11 is formed. Each of the intermediate panels 8*h* corresponds to respective one of the sub-panels 2*h*.

Then, each of the sub-panels 2*h* is singulated. That is, each of the intermediate panels 8*h* (e.g., including the second dielectric layer 6 and the circuit structure 5), each of the first dielectric layers 3, each of the redistribution layers 4 and the encapsulant 78 are singulated, forming a plurality of package units, such as the package unit 7*h* shown in FIG. 17. For example, the edge of each sub-panel 2*h* may be cut along the lateral surface 23, such that the dielectric portion 14 and the portion 784 of the encapsulant 78 are removed during the singulation process.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A manufacturing process, comprising:
 (a1) providing a plurality of intermediate carriers;
 (a2) forming a circuit structure on each of the intermediate carriers to form a plurality of intermediate panels, wherein each of the intermediate panels includes a plurality of panel units, and the intermediate panels are separate and spaced from each other;
 (a3) disposing the intermediate panels on a main carrier, wherein the intermediate carriers are located between the main carrier and the circuit structures of the intermediate panels;

(b) providing a dielectric material on the main carrier to form a plurality of first dielectric layers and a dielectric portion, wherein each of the first dielectric layers is disposed on a respective one of the intermediate panels, and the dielectric portion is disposed between and connects the first dielectric layers;

(c) forming a plurality of redistribution layers on the first dielectric layers, wherein each of the redistribution layers electrically connects to a respective one of the circuit structures of the intermediate panels; and (d) removing the main carrier and the intermediate carriers.

2. The manufacturing process of claim 1, wherein an L/S of the circuit structure of each of the intermediate panels is equal to or less than 2 μm/2 μm, and an L/S of each of the redistribution layers is equal to or greater than 10 μm/10 μm.

3. The manufacturing process of claim 1, wherein providing in (a1) further comprises:
(a11) forming a second dielectric layer on each of the intermediate carriers; and
wherein in forming in (a2), the circuit structure is formed on the second dielectric layer.

4. A manufacturing process comprising:
(a1) providing a plurality of intermediate carriers;
(a2) forming a circuit structure on each of the intermediate carriers to form a plurality of intermediate panels, wherein each of the intermediate panels includes a plurality of panel units, and the intermediate panels are separate and spaced from each other;
(a3) disposing the intermediate panels on a main carrier, wherein the circuit structures of the intermediate panels are located between the main carrier and the intermediate carriers;
(a4) removing the intermediate carriers;
(b) providing a dielectric material on the main carrier to form a plurality of first dielectric layers and a dielectric portion, wherein each of the first dielectric layers is disposed on a respective one of the intermediate panels, and the dielectric portion is disposed between and connects the first dielectric layers;
(c) forming a plurality of redistribution layers on the first dielectric layers, wherein each of the redistribution layers electrically connects to a respective one of the circuit structures of the intermediate panels; and
(d) removing the main carrier.

5. The manufacturing process of claim 1, wherein after forming in (c), the manufacturing process further comprises:
(c1) connecting a plurality of semiconductor dice to the circuit structure of each of the intermediate panels.

6. The manufacturing process of claim 5, wherein after connecting in (c1), the manufacturing process further comprises:
(d) singulating each of the intermediate panels, each of the first dielectric layers and each of the redistribution layers into a plurality of package units, wherein each of the package units includes at least one of the semiconductor dice.

7. The manufacturing process of claim 1, wherein after providing in (a), the manufacturing process further comprises:
(a1) connecting a plurality of semiconductor dice to the circuit structure of each of the intermediate panels;
(a2) forming an encapsulant to cover the semiconductor dice on each of the intermediate panels;
wherein in providing in (b), the dielectric material is provided on the encapsulant and the intermediate panels.

8. A manufacturing process comprising:
(a1) providing a plurality of intermediate carriers;
(a2) forming or disposing a metal layer on each of the intermediate carriers;
(a3) forming a second dielectric layer on the metal layer;
(a4) forming a circuit structure on the second dielectric layer and connected to the metal layer on each of the intermediate carriers to form a plurality of the intermediate panels, wherein each of the intermediate panels includes a plurality of panel units, and the intermediate panels are separate and spaced from each other;
(a5) disposing the intermediate panels on a main carrier, wherein the circuit structures of the intermediate panels are located between the main carrier and the intermediate carriers;
(a6) removing the intermediate carriers;
(a7) patterning each of the metal layers to form a circuit layer;
(b) providing a dielectric material on the main carrier to form a plurality of first dielectric layers and a dielectric portion, wherein each of the first dielectric layers is disposed on a respective one of the intermediate panels, and the dielectric portion is disposed between and connects the first dielectric layers;
(c) forming a plurality of redistribution layers on the first dielectric layers, wherein each of the redistribution layers electrically connects to a respective one of the circuit structures of the intermediate panels, wherein each of the redistribution layers is electrically connected to the respective one of the circuit structures through respective one of the circuit layers; and
(d) removing the main carrier.

9. The manufacturing process of claim 8, wherein after forming in (c), the manufacturing process further comprises:
(c1) connecting a plurality of semiconductor dice to each of the redistribution layers.

10. The manufacturing process of claim 1, wherein a gap between two adjacent ones of the intermediate panels has a non-consistent width.

11. The manufacturing process of claim 1, wherein the intermediate panels are arranged in an "m*n" manner, and "m" and "n" are integers equal to or greater than two.

12. The manufacturing process of claim 3, wherein in forming in (a11), each of the second dielectric layers defines at least one through hole; and in forming in (a2), each of the circuit structures includes at least one pillar or conductive via disposed in the through hole of the corresponding one of the second dielectric layers.

13. The manufacturing process of claim 7, wherein after forming in (c), the manufacturing process further comprises:
(d) singulating each of the circuit structures, each of the intermediate panels, the first dielectric layer, each of the redistribution layers and the encapsulant into a plurality of package units, wherein each of the package units includes at least one of the semiconductor dice.

14. The manufacturing process of claim 1, wherein after forming in (c), the manufacturing process further comprises:
(d) forming a protection layer on the first dielectric layer to cover the redistribution layers, wherein a portion of each of the redistribution layers is exposed from the protection layer for external connection.

15. The manufacturing process of claim 14, wherein after forming in (d), the manufacturing process further comprises:
(e) forming a solder connecter on the exposed portion of each of the redistribution layers.

16. The manufacturing process of claim 9, wherein after connecting in (c1), the manufacturing process further comprises:
- (d) singulating each of the circuit structures, each of the intermediate panels, the first dielectric layer and each of the redistribution layers into a plurality of package units, wherein each of the package units includes at least one of the semiconductor dice.

17. The manufacturing process of claim 8, wherein after forming in (c), the manufacturing process further comprises:
- (d) forming a protection layer on the first dielectric layers to cover the circuit structures and the second dielectric layer, wherein a portion of each of the circuit structures is exposed from the protection layer for external connection.

18. The manufacturing process of claim 17, wherein after forming in (d), the manufacturing process further comprises:
- (e) forming a solder connecter on the exposed portion of each of the circuit structures.

\* \* \* \* \*